US012230529B2

(12) United States Patent
Nabeya et al.

(10) Patent No.: US 12,230,529 B2
(45) Date of Patent: *Feb. 18, 2025

(54) SUBSTRATE HOLDING APPARATUS, SUBSTRATE SUCTION DETERMINATION METHOD, SUBSTRATE POLISHING APPARATUS, SUBSTRATE POLISHING METHOD, METHOD OF REMOVING LIQUID FROM UPPER SURFACE OF WAFER TO BE POLISHED, ELASTIC FILM FOR PRESSING WAFER AGAINST POLISHING PAD, SUBSTRATE RELEASE METHOD, AND CONSTANT AMOUNT GAS SUPPLY APPARATUS

(71) Applicant: EBARA CORPORATION, Tokyo (JP)

(72) Inventors: Osamu Nabeya, Tokyo (JP); Satoru Yamaki, Tokyo (JP); Makoto Fukushima, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 790 days.

This patent is subject to a terminal disclaimer.

(21) Appl. No.: 17/213,748

(22) Filed: Mar. 26, 2021

(65) Prior Publication Data
US 2021/0217647 A1 Jul. 15, 2021

Related U.S. Application Data

(62) Division of application No. 16/532,843, filed on Aug. 6, 2019, now Pat. No. 10,991,613.

(30) Foreign Application Priority Data

Aug. 6, 2018 (JP) .................... 2018-147661
Feb. 26, 2019 (JP) .................... 2019-032512
Jun. 13, 2019 (JP) .................... 2019-110491

(51) Int. Cl.
H01L 21/683 (2006.01)
B24B 37/005 (2012.01)
(Continued)

(52) U.S. Cl.
CPC ........ H01L 21/6838 (2013.01); B24B 37/005 (2013.01); B24B 37/042 (2013.01);
(Continued)

(58) Field of Classification Search
CPC ....... B24B 37/00; B24B 37/005; B24B 37/04; B24B 37/042; B24B 37/10; B24B 37/11;
(Continued)

(56) References Cited

U.S. PATENT DOCUMENTS 5,788,560 A  8/1998 Hashimoto et al.
5,791,973 A  8/1998 Nishio
(Continued)

FOREIGN PATENT DOCUMENTS

CN  1138745 A  12/1996
CN  101444897 A  6/2009
(Continued)

OTHER PUBLICATIONS

WO2013065237—Machine Translation (Year: 2013).*

Primary Examiner — Brian D Keller
Assistant Examiner — Alberto Saenz
(74) Attorney, Agent, or Firm — BakerHostetler

(57) ABSTRACT

A substrate holding apparatus is provided, which includes a top ring main body to which an elastic film having a surface that can suck a substrate can be attached, a first line communicating with a first area of the plurality of areas, a second line communicating with a second area different from the first area of the plurality of areas, a pressure adjuster that can pressurize the first area by feeding fluid into the first area through the first line and can generate negative (Continued)

pressure in the second area through the second line, and a determiner that performs determination of whether or not the substrate is sucked to the elastic film based on a volume of the fluid fed into the first area or a measurement value corresponding to pressure in the first area.

4 Claims, 59 Drawing Sheets

(51) Int. Cl.
  *B24B 37/04*   (2012.01)
  *B24B 37/30*   (2012.01)
  *H01L 21/02*   (2006.01)
  *H01L 21/306*   (2006.01)
  *H01L 21/67*   (2006.01)

(52) U.S. Cl.
  CPC .......... *B24B 37/30* (2013.01); *H01L 21/0201* (2013.01); *H01L 21/67063* (2013.01); *H01L 21/67219* (2013.01); *H01L 21/30625* (2013.01)

(58) Field of Classification Search
  CPC ......... B24B 37/12; B24B 37/27; B24B 37/30; B24B 37/32; H01L 21/6838; H01L 21/0201; H01L 21/67063; H01L 21/67219; H01L 21/30625
  USPC ....... 451/1, 5, 285, 286, 287, 288, 289, 290, 451/388
  See application file for complete search history.

(56) References Cited

U.S. PATENT DOCUMENTS

| | | | |
|---|---|---|---|
| 5,868,866 A | 2/1999 | Maekawa et al. | |
| 6,328,629 B1 | 12/2001 | Togawa et al. | |
| 11,548,113 B2 * | 1/2023 | Fukushima | B24B 37/20 |
| 2001/0000775 A1 | 5/2001 | Zuniga et al. | |
| 2005/0221725 A1 | 10/2005 | Nakamura et al. | |
| 2007/0065145 A1 | 3/2007 | Kitamura | |
| 2009/0142996 A1 | 6/2009 | Yasuda et al. | |
| 2009/0191791 A1 | 7/2009 | Fukushima et al. | |
| 2014/0004779 A1 | 1/2014 | Namiki et al. | |
| 2014/0037412 A1 | 2/2014 | Asai | |
| 2014/0190633 A1 | 7/2014 | Maeda et al. | |
| 2015/0017890 A1 | 1/2015 | Masumura | |
| 2015/0187628 A1 | 7/2015 | Sheu | |
| 2015/0273657 A1 | 10/2015 | Fukushima et al. | |
| 2016/0114456 A1 | 4/2016 | Shinozaki | |
| 2016/0176011 A1 * | 6/2016 | Fukushima | B24B 37/042 451/288 |
| 2017/0050289 A1 | 2/2017 | Shinozaki et al. | |
| 2017/0266778 A1 | 9/2017 | Kamata | |
| 2017/0266779 A1 | 9/2017 | Isono et al. | |
| 2019/0118292 A1 | 4/2019 | Nomaru et al. | |
| 2020/0043773 A1 | 2/2020 | Nabeya et al. | |

FOREIGN PATENT DOCUMENTS

| | | | |
|---|---|---|---|
| CN | 104942704 A | 9/2015 | |
| CN | 106466806 A | 3/2017 | |
| CN | 107186617 A | 9/2017 | |
| CN | 107199503 A | 9/2017 | |
| CN | 207120115 U | 3/2018 | |
| JP | 3019843 B1 | 3/2000 | |
| JP | 2003-011056 A | 1/2003 | |
| JP | 3705670 B2 | 10/2005 | |
| JP | 2005-313312 A | 11/2005 | |
| JP | 2007-507079 A | 3/2007 | |
| JP | 3963083 B2 | 8/2007 | |
| JP | 2007-242655 A | 9/2007 | |
| JP | 2009-033197 A | 2/2009 | |
| JP | 4897312 B2 | 3/2012 | |
| JP | 2013-111679 A | 6/2013 | |
| JP | 2016-055412 A | 4/2016 | |
| JP | 2017-205853 A | 11/2017 | |
| KR | 2016-0110866 A | 9/2016 | |
| TW | 200941570 A | 10/2009 | |
| WO | WO-2013065237 A1 * | 5/2013 | .......... B25J 15/0095 |

* cited by examiner

300

SUBSTRATE HOLDING APPARATUS, SUBSTRATE SUCTION DETERMINATION METHOD, SUBSTRATE POLISHING APPARATUS, SUBSTRATE POLISHING METHOD, METHOD OF REMOVING LIQUID FROM UPPER SURFACE OF WAFER TO BE POLISHED, ELASTIC FILM FOR PRESSING WAFER AGAINST POLISHING PAD, SUBSTRATE RELEASE METHOD, AND CONSTANT AMOUNT GAS SUPPLY APPARATUS

CROSS REFERENCE TO RELATED APPLICATIONS

This application is a Divisional application of U.S. Non-Provisional application Ser. No. 16/532,843, filed Aug. 5, 2019 which claims the benefit of Japanese Priority Patent Application JP 2018-147661 filed on Aug. 6, 2018, JP 2019-032512 filed on Feb. 26, 2019, and JP 2019-110491 filed on Jun. 13, 2019, the entire contents of which are incorporated herein by reference.

FIELD

The present invention relates to a substrate holding apparatus, a substrate suction determination method, a substrate polishing apparatus, a substrate polishing method, a method of removing liquid from an upper surface of a wafer to be polished, an elastic film for pressing a wafer against a polishing pad, a substrate release method, and a constant amount gas supply apparatus.

BACKGROUND

In a substrate polishing apparatus (for example, Patent Literature 1), a substrate is transferred from a substrate transport apparatus to a top ring (substrate holding apparatus), and the substrate is polished in a state in which the top ring holds the substrate. The top ring has a structure where a membrane is provided below a top ring main body (base plate) and a lower surface of the membrane sucks the substrate.

More superior substrate holding apparatus, substrate suction determination method, substrate polishing apparatus, substrate polishing method, method of removing liquid from an upper surface of a wafer to be polished, elastic film for pressing a wafer against a polishing pad, substrate release method, and constant amount gas supply apparatus are provided.

SUMMARY

Provided is a substrate holding apparatus including: a top ring main body to which an elastic film having a surface that can suck a substrate can be attached, wherein when the elastic film is attached to the top ring main body, a plurality of areas are formed between the elastic film and the top ring main body; a first line communicating with a first area among the plurality of areas; a second line communicating with a second area different from the first area among the plurality of areas; a pressure adjuster capable of pressurizing the first area by feeding fluid into the first area through the first line, and capable of generating negative pressure in the second area through the second line; and a determiner configured to perform determination of whether the substrate is sucked to the elastic film based on a measurement value corresponding to a volume of the fluid fed into the first area or corresponding to pressure in the first area, wherein when the determination is performed, exhaust from the first area is not performed.

Provided is a method of polishing a wafer by using a polishing head including a center side pressure chamber and an outer side pressure chamber formed of an elastic film, the method including: causing a central portion of the elastic film to come into contact with a central portion of an upper surface of the wafer; and then removing liquid from the upper surface of the wafer by causing an outer circumferential portion of the elastic film to come into contact with an outer circumferential portion of the upper surface of the wafer; and pressing a lower surface of the wafer against a polishing surface by the elastic film to polish the lower surface of the wafer.

Provided is a substrate polishing apparatus including; a top ring main body; an elastic film including a first surface facing the top ring main body and a second surface that is a surface opposite to the first surface and can suck and hold a substrate; a pressure adjustment apparatus that can pressurize and depressurize a space between the top ring main body and the first surface of the elastic film through a first valve provided on a first line communicating with the space; and a constant amount gas supply apparatus that can supply a certain amount of gas to the space through a second valve provided on the first line.

DETAILED DESCRIPTION OF NON-LIMITING EXAMPLE EMBODIMENTS

First to Fourth Embodiments

Figure 1:
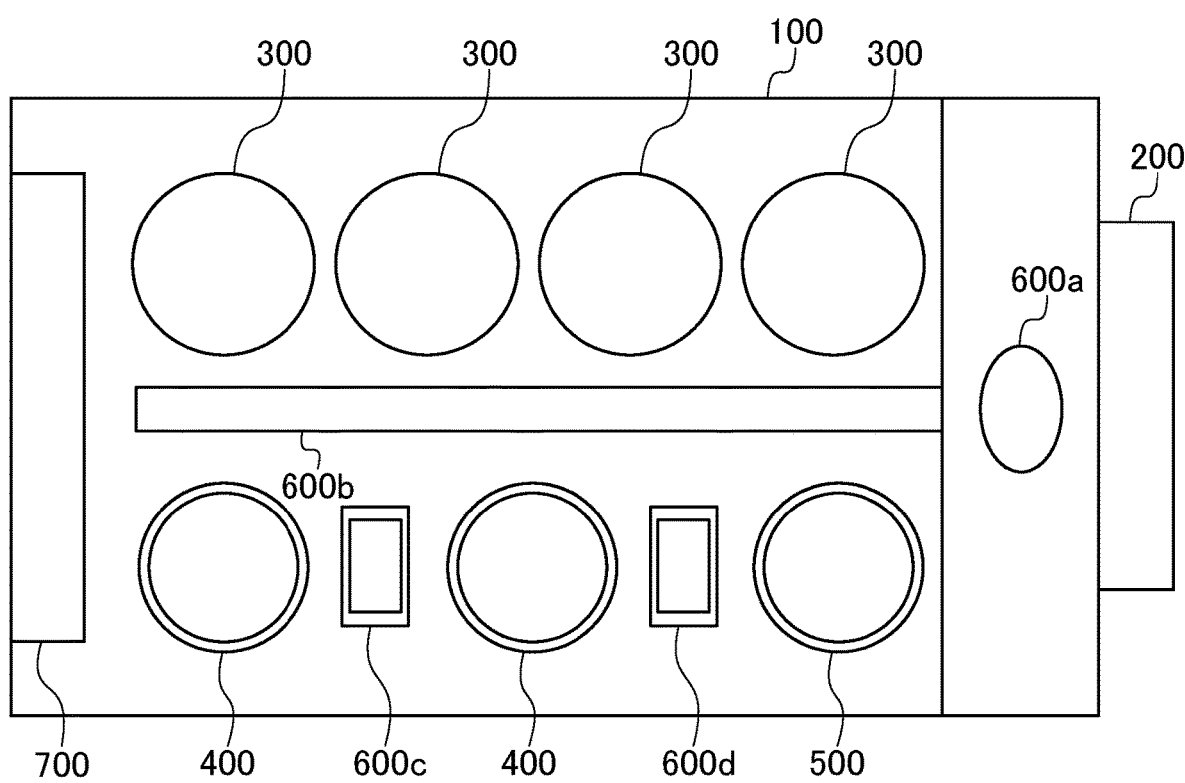
FIG. 1 is a schematic top view of a substrate processing apparatus including a substrate polishing apparatuses.

Patent Literature 1 discloses a substrate suction determination method that determines whether or not a substrate is sucked by a membrane. In this method, an upward protruded portion is provided to the membrane. When the substrate is not sucked, there is a gap between a lower surface of a top ring main body and the protruded portion of the membrane, and when the substrate is sucked, the substrate presses the membrane upward and thereby the protruded portion of the membrane comes into contact with the lower surface of the top ring and the gap disappears. The substrate suction determination method uses the above phenomenon.

However, the surface of the membrane and/or the substrate itself may be wet. When the membrane and/or the substrate are wet, even when the substrate is sucked, a force by which the substrate presses the membrane is dispersed and the protruded portion of the membrane may not sufficiently come into contact with the lower surface of the top ring main body. Then, there is a risk of erroneous determination that the substrate is not sucked even when the substrate is sucked.

Therefore, it can be considered that the gap between the protruded portion of the membrane and the top ring is narrowed in advance. However, by doing so, there is a problem that when the substrate is polished while the membrane sucks the substrate, only a polishing rate of a portion of the substrate corresponding to the protruded portion rises and it is difficult to perform uniform polishing.

The first to the fourth embodiments are made in view of the above problems and objects of the first to the fourth embodiments are to provide a substrate holding apparatus that can more accurately determine that a substrate is sucked and a substrate polishing apparatus including the substrate holding apparatus and to provide a substrate suction determination method that can more accurately determine that a substrate is sucked and a substrate polishing method utilizing the substrate suction determination method.

According to the first to the fourth embodiments, the following aspects are provided.

Provided is a substrate holding apparatus including: a top ring main body to which an elastic film including a surface that can suck a substrate can be attached, wherein when the elastic film is attached to the top ring main body, a plurality of areas are formed between the elastic film and the top ring main body; a first line communicating with a first area among the plurality of areas; a second line communicating with a second area different from the first area among the plurality of areas; a pressure adjuster capable of pressurizing the first area by feeding fluid into the first area through the first line, and capable of generating negative pressure in the second area through the second line; and a determiner configured to perform determination of whether the substrate is sucked to the elastic film based on a measurement value corresponding to a volume of the fluid fed into the first area or corresponding to pressure in the first area, wherein when the determination is performed, exhaust from the first area is not performed.

The determiner may perform the determination by using a fact that when the substrate is sucked to the elastic film, the volume of the fluid fed into the first area is smaller or the pressure in the first area is higher as compared with those when the substrate is not sucked to the elastic film.

The pressure adjuster may include a pressurizing mechanism configured to feed fluid into the first area through the first line, and the determiner may include a position sensor configured to detect a part of the pressurizing mechanism that moves when feeding fluid into the first area as the measurement value corresponding to the volume of the fluid fed into the first area.

The determiner may include a pressure gauge configured to measure pressure in the first area.

The pressure adjuster may include a pressurizing mechanism configured to feed fluid into the first area through the first line, and the determiner may include: a position sensor configured to detect a part of the pressurizing mechanism that moves when feeding fluid into the first area as the measurement value corresponding to the volume of the fluid fed into the first area, and a pressure gauge configured to measure pressure in the first area.

The determiner may determine that the substrate is not sucked to the elastic film based on a detection result of the position sensor, and the substrate is sucked to the elastic film based on a measurement result of the pressure gauge.

The pressurizing mechanism may include a cylinder and a weight main body coupled to a piston of the cylinder, and fluid is fed into the first area when the weight main body is moved downward by gravity.

The piston may be capable of moving up and down in a state where the piston is in contact with an inner surface of the cylinder, the piston may divide inside of the cylinder into a lower space and an upper space, and the cylinder may be provided with a first opening provided to the lower space and connected to the first line, a second opening provided to the lower space, a third opening provided to the upper space, wherein a piston rod that couples the weight main body and the piston penetrates through the third opening, and a fourth opening provided to the upper space.

When the determination is performed, the second opening may be closed and the fourth opening is opened, and after the determination is performed, the second opening may be opened and the weight is raised by sucking the upper space from the fourth opening.

The first line may be connected to the first opening of the cylinder and a polishing pressure controller configured to pressurize the first area when polishing the substrate sucked to the elastic film, and a switch that switches whether to cause the first area, through the first line, to communicate with the first opening of the pressurizing mechanism or communicate with the polishing pressure controller is provided.

Provided is a substrate polishing apparatus including; the above substrate holding apparatus; and a polishing table configured to polish the substrate held by the substrate holding apparatus.

Provided is a substrate suction determination method of a substrate holding apparatus, the method including: generating negative pressure in a second area formed between a top ring main body and an elastic film in a substrate holding apparatus and pressurizing a first area by feeding fluid into the first area different from the second area, which is formed between the top ring main body and the elastic film; and performing determination of whether the substrate is sucked to the elastic film based on a measurement value corresponding to a volume of the fluid fed into the first area or corresponding to pressure in the first area, wherein when the determination is performed, exhaust from the first area is not performed.

Provided is a substrate polishing method including; causing a substrate holding apparatus to suck a substrate held by a transport mechanism; performing determination of whether the substrate is sucked to an elastic film of the substrate holding apparatus by the above substrate suction determination method; and polishing the substrate when it is determined that the substrate is sucked.

Hereinafter, the embodiments will be specifically described with reference to the drawings.

First Embodiment

FIG. 1 is a schematic top view of a substrate processing apparatus including a substrate polishing apparatuses. The substrate processing apparatus processes various substrates in a manufacturing process or the like of a semiconductor wafer with a diameter of 300 mm or 450 mm, a flat panel, an image sensor of complementary metal oxide semiconductor (CMOS) or charge coupled device (CCD), and a magnetic film in a magnetoresistive random access memory (MRAM).

The substrate processing apparatus includes a substantially rectangular housing 100, a load port 200 on which a substrate cassette that stores many substrates is mounted, one or a plurality of (four in an aspect shown in FIG. 1) substrate polishing apparatuses 300, one or a plurality of (two in the aspect shown in FIG. 1) substrate cleaning apparatuses 400, a substrate drying apparatus 500, transport mechanisms 600a to 600d, and a controller 700.

The load port 200 is arranged adjacent to the housing 100. The load port 200 can be mounted with an open cassette, a standard mechanical interface (SMIF) pod, or a front opening unified pod (FOUP). The SMIF pod and the FOUP are airtight containers, each of which can maintain an environment independent from external space by storing a substrate cassette inside thereof and covering the inside by a partition wall.

The housing 100 stores the substrate polishing apparatuses 300 that polish a substrate, the substrate cleaning apparatuses 400 that clean a substrate that has been polished, and the substrate drying apparatus 500 that dries a substrate that has been cleaned. The substrate polishing apparatuses 300 are arranged along the longitudinal direction of the substrate processing apparatus. The substrate cleaning apparatuses 400 and the substrate drying apparatus 500 are also arranged along the longitudinal direction of the substrate processing apparatus.

The transport mechanism 600a is arranged in a region surrounded by the load port 200, the substrate polishing apparatus 300 located on the side of the load port 200, and the substrate drying apparatus 500. The transport mechanism 600b is arranged in parallel with the substrate polishing apparatuses 300 and in parallel with the substrate cleaning apparatuses 400 and the substrate drying apparatus 500.

The transport mechanism 600a receives a substrate before being polished from the load port 200 and transfers the substrate to the transport mechanism 600b. Further, the transport mechanism 600a receives the substrate after being dried from the substrate drying apparatus 500.

The transport mechanism 600b is, for example, a linear transporter, and transfers a substrate before being polished that is received from the transport mechanism 600a to the substrate polishing apparatuses 300. As described later, a top ring (not shown in the drawings) of the substrate polishing apparatuses 300 receives the substrate from the transport mechanism 600b by vacuum suction. The substrate polishing apparatus 300 releases the substrate after being polished to the transport mechanism 600b and the substrate is transferred to the substrate cleaning apparatus 400.

Further, the transport mechanism 600c that transfers the substrate between the substrate cleaning apparatuses 400 is arranged between the two substrate cleaning apparatuses 400. The transport mechanism 600d that transfers the substrate between the substrate cleaning apparatus 400 and the substrate drying apparatus 500 is arranged between the substrate cleaning apparatus 400 and the substrate drying apparatus 500.

The controller 700 controls an operation of each device of the substrate processing apparatus. The controller 700 may be arranged inside the housing 100, may be arranged outside the housing 100, or may be provided in each of the substrate polishing apparatuses 300, the substrate cleaning apparatuses 400, and the substrate drying apparatus 500.

Figure 2:
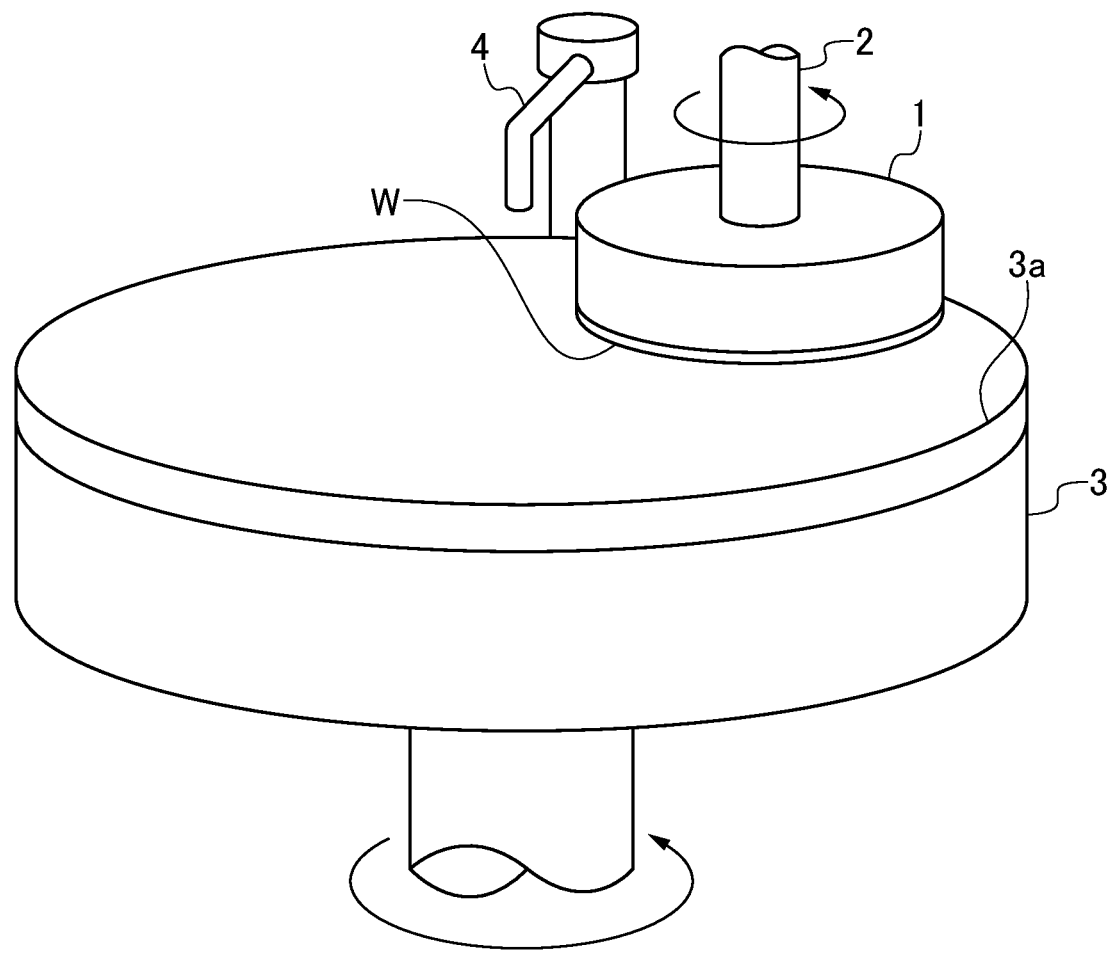
FIG. 2 is a schematic perspective view of a substrate polishing apparatus.
Figure 3:
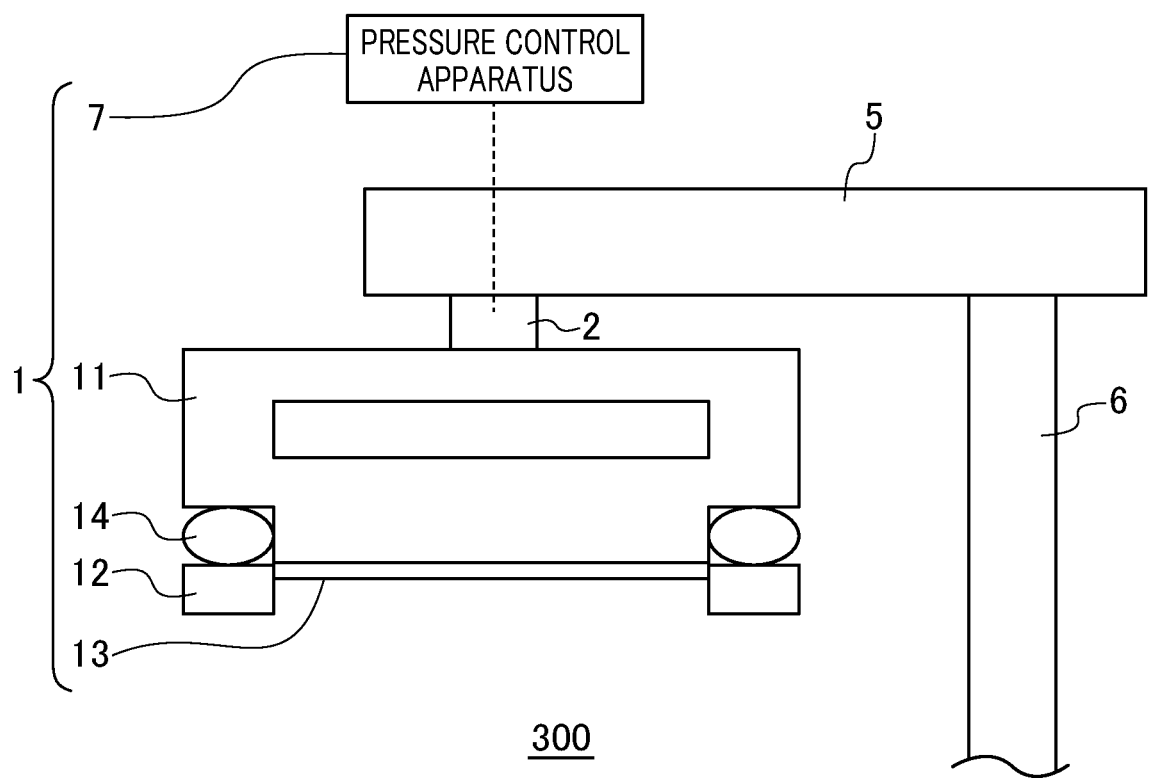
FIG. 3 is a schematic cross-sectional view of the substrate polishing apparatus.

FIGS. 2 and 3 are schematic perspective view and a schematic cross-sectional view, respectively, of the substrate polishing apparatus 300. The substrate polishing apparatus 300 has a top ring 1, a top ring shaft 2 whose lower portion is coupled with the top ring 1, a polishing table 3 having a polishing pad 3a, a nozzle 4 that supplies a polishing liquid onto the polishing table 3, a top ring head 5, and a support shaft 6.

The top ring 1 holds a substrate W. As shown in FIG. 3, the top ring 1 is composed of a top ring main body 11 (also referred to as a carrier or a base plate), an annular retainer ring 12, a flexible membrane 13 (elastic film) that can be attached below the top ring main body 11 and inside the retainer ring 12, an air bag 14 provided between the top ring main body 11 and the retainer ring 12, a pressure control apparatus 7, and the like.

The retainer ring 12 is provided to an outer circumferential portion of the top ring main body 11. A circumferential edge of the held substrate W is surrounded by the retainer ring 12, so that substrate W does not jump out from the top ring 1 during polishing. The retainer ring 12 may be composed of one member or may be composed of two rings including an inner ring and an outer ring provided outside the inner ring. In the latter case, the outer ring may be fixed to the top ring main body 11 and the air bag 14 may be provided between the inner ring and the top ring main body 11.

The membrane 13 is provided facing the top ring main body 11. A plurality of concentric areas are formed between an upper surface of the membrane 13 and the top ring main body 11. A lower surface of the membrane 13 can hold an upper surface of the substrate W by generating negative pressure in one or a plurality of the areas.

The air bag 14 is provided between the top ring main body 11 and the retainer ring 12. The retainer ring 12 can relatively move with respect to the top ring main body 11 in a vertical direction by the air bag 14.

The pressure control apparatus 7 individually adjusts pressure of each area formed between the top ring main body 11 and the membrane 13 by supplying fluid between the top ring main body 11 and the membrane 13, evacuating air from between the top ring main body 11 and the membrane 13, and opening each area between the top ring main body 11 and the membrane 13 to the atmosphere. Further, the pressure control apparatus 7 determines whether or not the substrate W is sucked to the membrane 13. The configuration of the pressure control apparatus 7 will be described later in detail.

In FIG. 2, a lower end of the top ring shaft 2 is coupled to a center of an upper surface of the top ring 1. When a lifting mechanism (not shown in the drawings) lifts and lowers the top ring shaft 2, a lower surface of the substrate W held by the top ring 1 comes into and out of contact with the polishing pad 3*a*. When a motor (not shown in the drawings) rotates the top ring shaft 2, the top ring 1 rotates, and the substrate W held by the top ring 1 also rotates.

The polishing pad 3*a* is provided on an upper surface of the polishing table 3. A lower surface of the polishing table 3 is connected to a rotating shaft, so that the polishing table 3 can rotate. When the polishing liquid is supplied from the nozzle 4 and the substrate W and the polishing table 3 rotate in a state where the lower surface of the substrate W is in contact with the polishing pad 3*a*, the substrate W is polished.

The top ring shaft 2 is coupled to one end of the top ring head 5 in FIG. 3 and the support shaft 6 is coupled to the other end. When a motor not shown in the drawings rotates the support shaft 6, the top ring head 5 swings, so that the top ring 1 moves between a position over the polishing pad 3*a* and a substrate transfer position (not shown in the drawings).

Subsequently, an operation of transferring the substrate from the transport mechanism 600*b* in FIG. 1 to the top ring 1 in FIGS. 2 and 3 will be described.

Figure 4A:
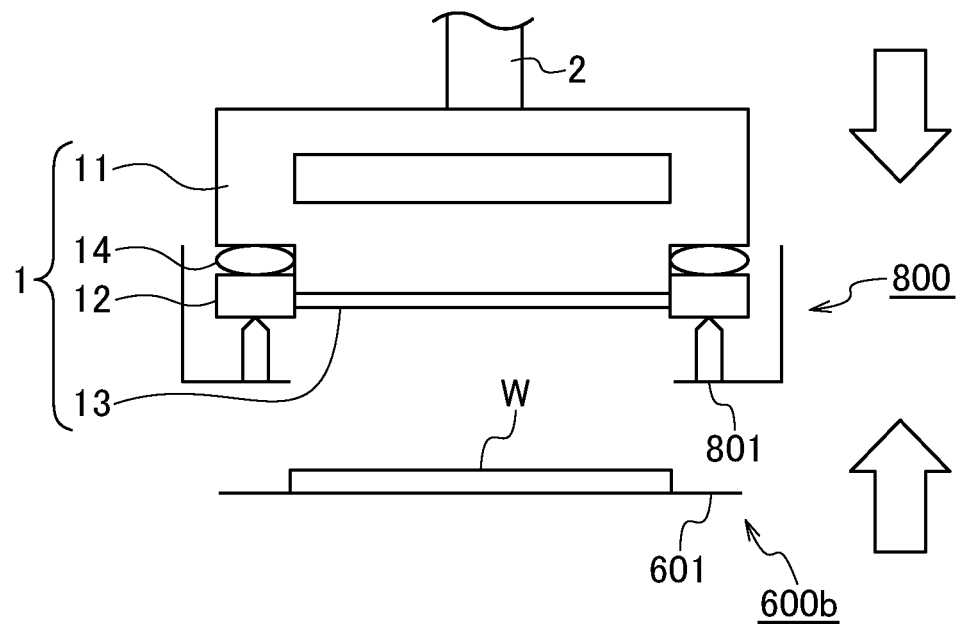
FIG. 4A is a diagram for explaining in detail transfer of a substrate from a transport mechanism to a top ring.
Figure 4B:
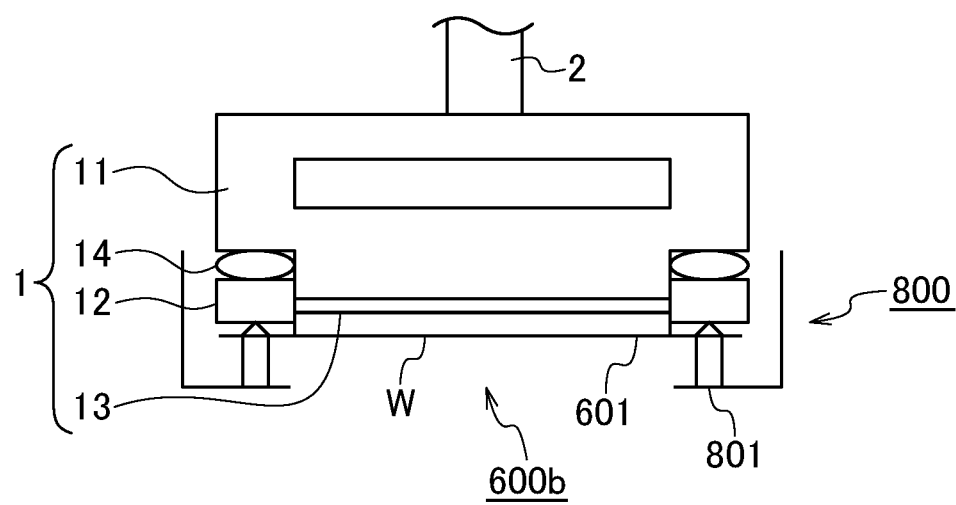
FIG. 4B is a diagram for explaining in detail the transfer of the substrate from the transport mechanism to the top ring.
Figure 4C:
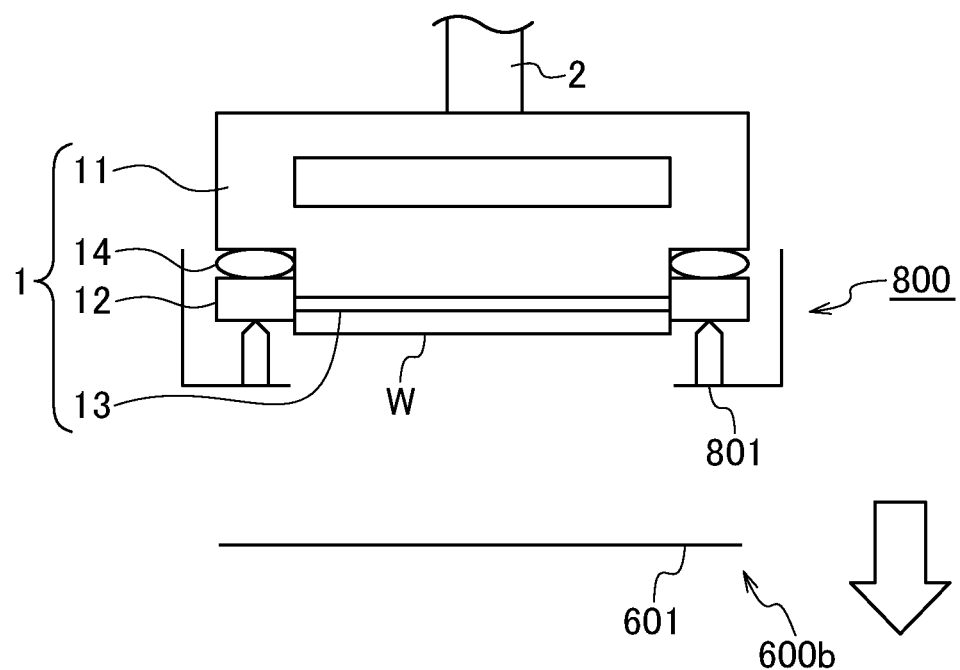
FIG. 4C is a diagram for explaining in detail the transfer of the substrate from the transport mechanism to the top ring.
Figure 5:
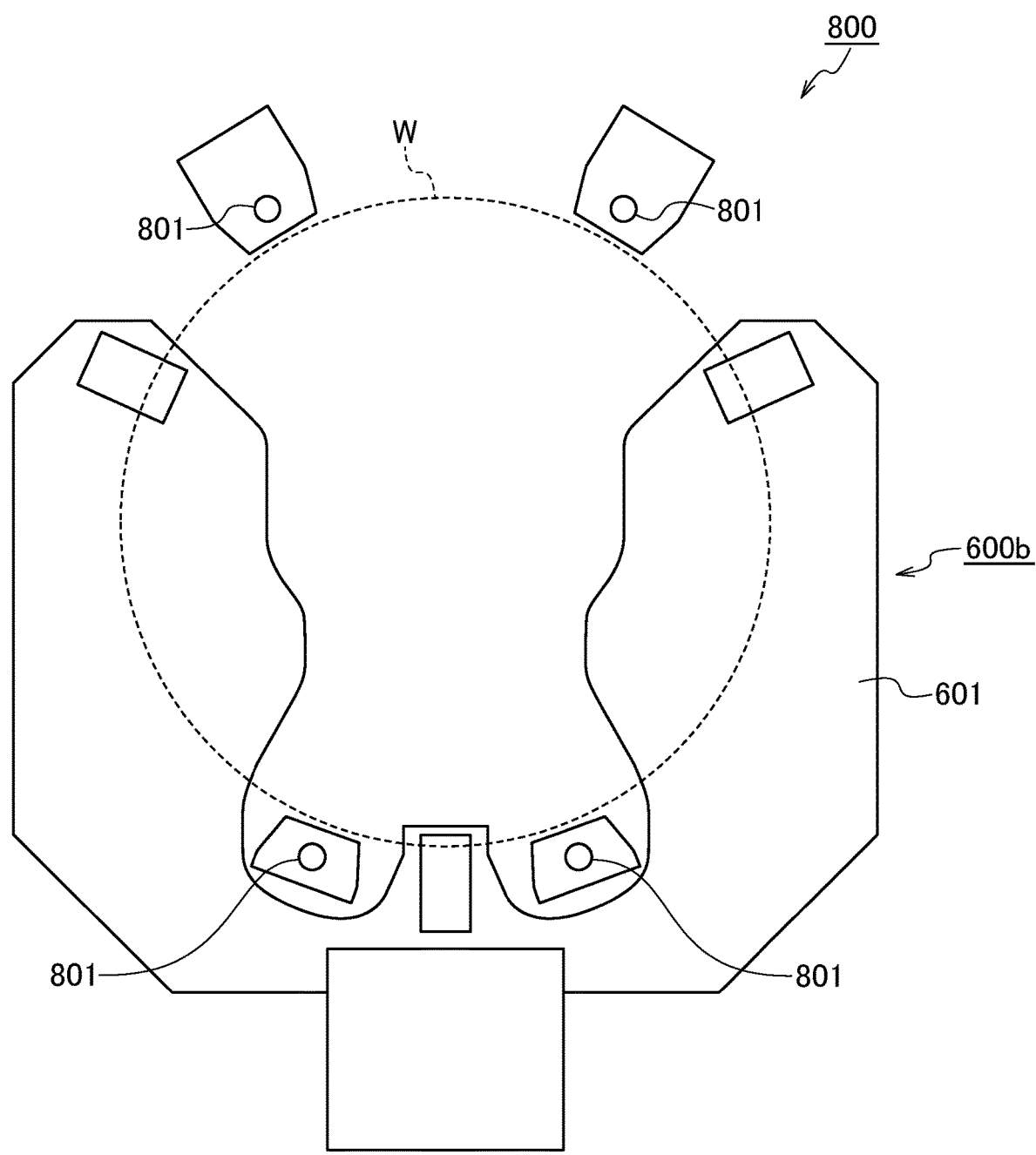
FIG. 5 is a diagram for explaining in detail the transfer of the substrate from the transport mechanism to the top ring.

FIGS. 4A to 4C and FIG. 5 are diagrams for explaining in detail the transfer of the substrate from the transport mechanism 600*b* to the top ring 1. FIGS. 4A to 4C are diagrams where the transport mechanism 600*b* and the top ring 1 are viewed from the side. FIG. 5 is a diagram where they are viewed from above.

As shown in FIG. 4A, the substrate W is mounted on a hand 601 of the transport mechanism 600*b*. A retainer ring station 800 is used to transfer the substrate W. The retainer ring station 800 has pushing-up pins 801 that push up the retainer ring 12 of the top ring 1. The retainer ring station 800 may have a release nozzle. However, the release nozzle is not shown in the drawings.

As shown in FIG. 5, the hand 601 supports parts of an outer circumference of the lower surface of the substrate W. The pushing-up pins 801 and the hand 601 are arranged so as not to be in contact with each other.

In a state shown in FIG. 4A, the top ring 1 lowers and the transport mechanism 600*b* rises. When the top ring 1 lowers, the pushing-up pins 801 push up the retainer ring 12 and the substrate W approaches the membrane 13. When the transport mechanism 600*b* rises further, the upper surface of the substrate W comes into contact with the lower surface of the membrane 13 (FIG. 4B).

In this state, by generating negative pressure in an area formed between the membrane 13 and the top ring main body 11, the substrate W is sucked to the lower surface of the membrane 13 of the top ring 1. However, in some cases, the substrate W is not sucked to the lower surface of the membrane 13 or the substrate W is once sucked to the lower surface of the membrane 13 and thereafter falls. Therefore, in the present embodiment, a determination (substrate suction determination) whether or not the substrate W is sucked to the membrane 13 is performed as described later.

Thereafter, the transport mechanism 600*b* lowers (FIG. 4C).

Subsequently, the top ring 1 will be described.

Figure 6:
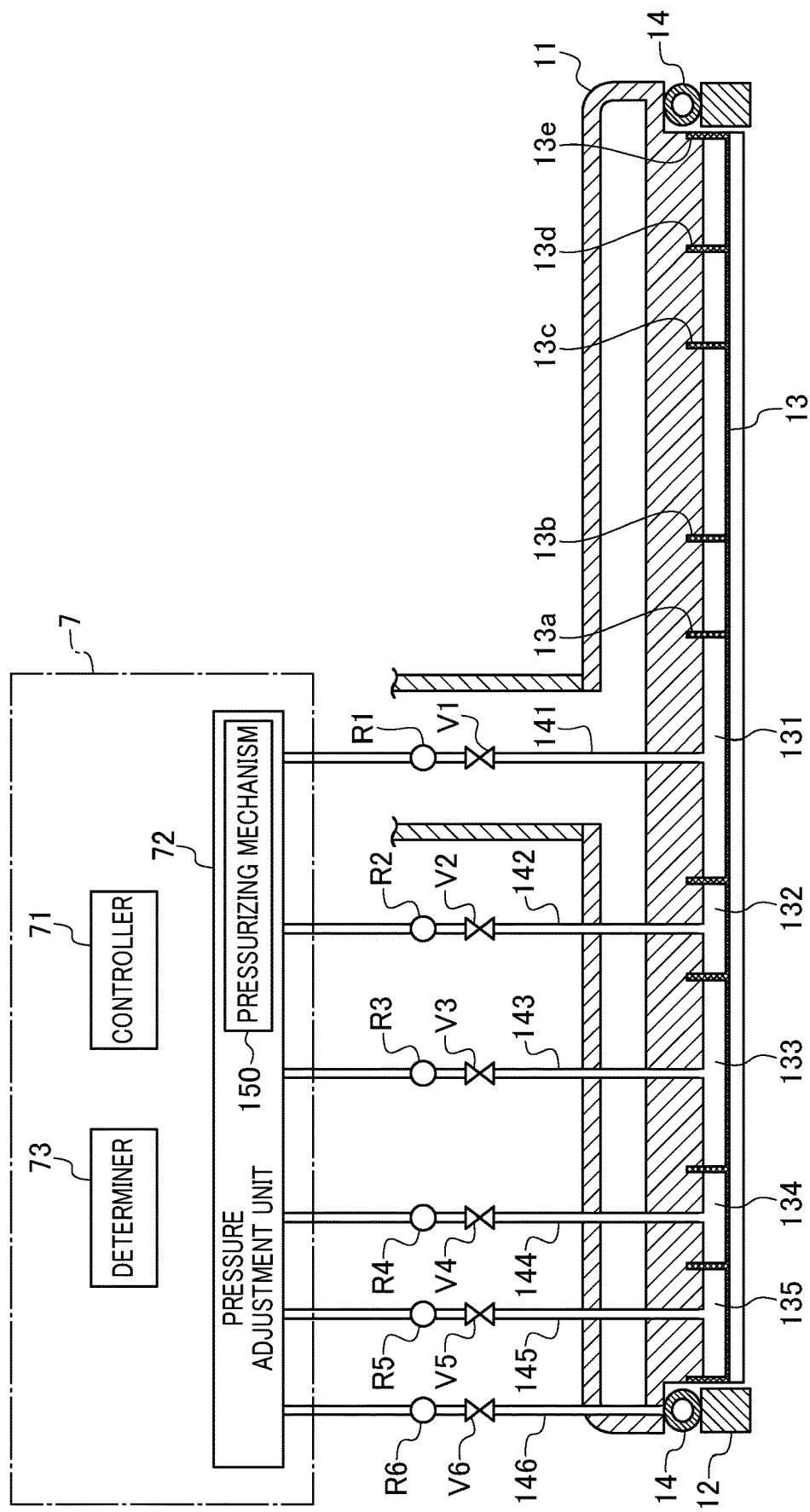
FIG. 6 is a diagram schematically showing a structure of the top ring and a pressure control apparatus.

FIG. 6 is a diagram schematically showing a structure of the top ring 1 and the pressure control apparatus 7. On the membrane 13, circumferential walls 13*a* to 13*e* extending upward toward the top ring main body 11 are formed. By the circumferential walls 13*a* to 13*e*, concentric areas 131 to 135 separated by the circumferential walls 13*a* to 13*e* are formed between the upper surface of the membrane 13 and a lower surface of the top ring main body 11. It is desirable that no hole is formed in the lower surface of the membrane 13.

Flow paths 141 to 145 which penetrate the top ring main body 11 and whose one ends communicate with the areas 131 to 135, respectively, are formed. The air bag 14 formed of an elastic film is provided directly on the retainer ring 12, and a flow path 146 whose one end communicates with the air bag 14 is formed in the same manner. The other ends of the flow paths 141 to 146 are connected to the pressure control apparatus 7. A pressure sensor and/or a flow rate sensor may be provided on the flow paths 141 to 146.

The pressure control apparatus 7 has valves V1 to V6 provided to the flow paths 141 to 146, respectively, pressure regulators R1 to R6, a controller 71, a pressure adjustment unit 72, and a determiner 73 that performs substrate suction determination.

The controller 71 controls the valves V1 to V6, the pressure regulators R1 to R6, and the pressure adjustment unit 72.

The pressure adjustment unit 72 is connected to one ends of the flow paths 141 to 146 and individually adjusts pressures of the areas 131 to 135 and the air bag 14 according to the control of the controller 71. Specifically, the pressure adjustment unit 72 pressurizes the areas 131 to 135 and the air bag 14 by supplying fluid such as air through the flow paths 141 to 146, depressurizes the areas 131 to 135 and the air bag 14 by evacuating air, and opens the areas 131 to 135 and the air bag 14 to the atmosphere.

In FIG. 6, for example, to pressurize the area 135, the controller 71 opens the valve V5 and controls the pressure adjustment unit 72 so that air is supplied to the area 135. This is simply represented as "(the controller 71) pressurizes the area 135" or the like.

In the present embodiment, the substrate suction determination is performed by using the area 131. Therefore, the pressure adjustment unit 72 has a pressurizing mechanism 150 that can pressurize the area 131 by feeding a fluid (gas or liquid) to the area 131.

Hereinafter, pressure determination will be described in detail.

Figure 7:
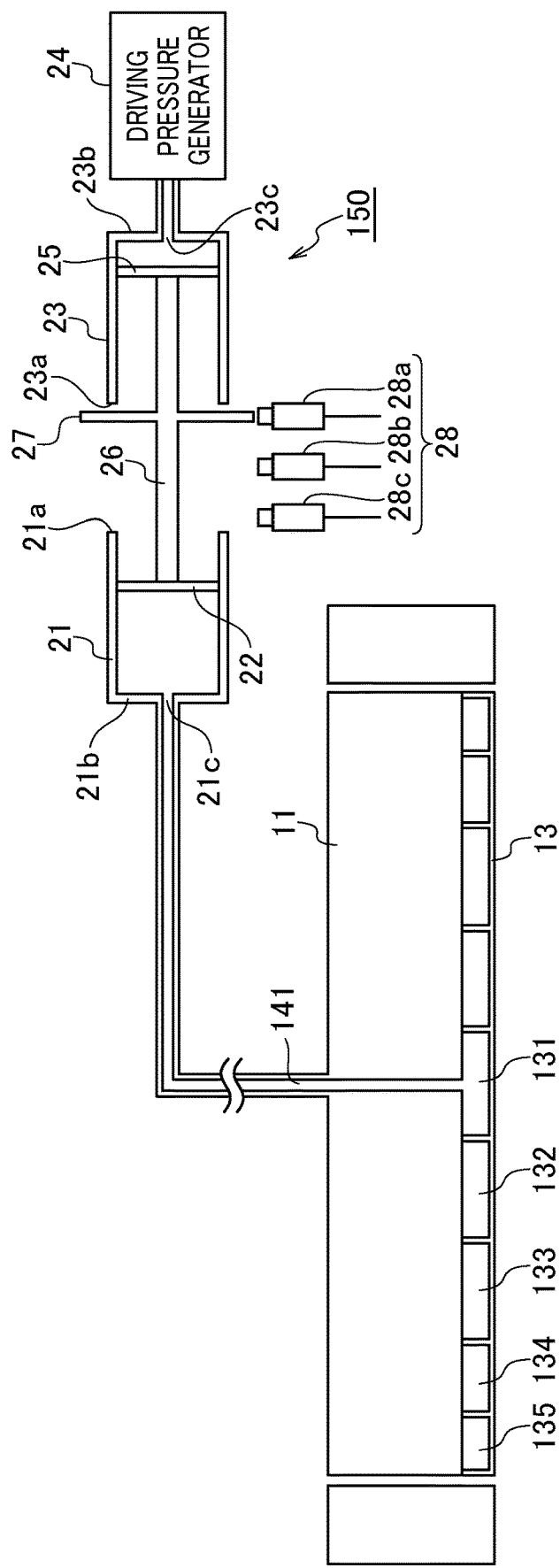
FIG. 7 is a diagram for explaining pressure determination according to a first embodiment.

FIG. 7 is a diagram for explaining the pressure determination according to the first embodiment. In the drawings described below, the entire structure is simplified. The pressurizing mechanism 150 in the present embodiment performs pressurization by a cylinder driving method and has a pressurizing side cylinder 21, a pressurizing piston 22, a driving side cylinder 23, a driving pressure generator 24, a driving piston 25, a coupling member 26, and a plate 27. The determiner 73 has a position sensor 28.

The pressurizing side cylinder 21 has a cylindrical shape whose tip 21a opens and which extends in a horizontal direction, and a flow path 141 is connected to an opening 21c formed at a closed surface 21b (bottom surface) of the pressurizing side cylinder 21. The pressurizing piston 22 has a disk shape and is slidably in contact with an inner surface of the pressurizing side cylinder 21. The pressurizing piston 22 is provided with a fluid seal (not shown in the drawings), so that fluid does not move between inside and outside of the pressurizing side cylinder 21.

The driving side cylinder 23 is arranged opposite to and away from the pressurizing side cylinder 21. The driving side cylinder 23 also has a cylindrical shape whose tip 23a opens and which extends in the horizontal direction, and the driving pressure generator 24 is connected to an opening 23c formed at a closed surface 23b (bottom surface) of the driving side cylinder 23. The driving piston 25 has a disk shape and is slidably in contact with an inner surface of the driving side cylinder 23. The driving piston 25 is provided with a fluid seal (not shown in the drawings), so that fluid does not move between inside and outside of the driving side cylinder 23.

A central portion of the pressurizing piston 22 and a central portion of the driving piston 25 are coupled by the coupling member 26, and the pressurizing piston 22 and the driving piston 25 are integrated together.

The plate 27 is an annular member fitted and fixed to the coupling member 26. A diameter of the plate 27 is greater than inner diameters of the pressurizing side cylinder 21 and the driving side cylinder 23.

By the structure described above, the integrated pressurizing piston 22 and the driving piston 25 can move in a range where the plate 27 moves between the tip 23a of the driving side cylinder 23 and the tip 21a of the pressurizing side cylinder 21. In a standby state before the substrate suction determination is performed, the plate 27 is located at a position near the tip 23a of the driving side cylinder 23 (for example, a position where one surface of the plate 27 comes into contact with the tip 23a of the driving side cylinder 23) and this position is defined as an origin.

The position sensor 28 includes an origin detection sensor 28a, a substrate presence detection sensor 28b, and a substrate absence detection sensor 28c. The origin detection sensor 28a is arranged near the tip 23a of the driving side cylinder 23. The substrate presence detection sensor 28b is arranged near a center between the tip 23a of the driving side cylinder 23 and the tip 21a of the pressurizing side cylinder 21. The substrate absence detection sensor 28c is arranged near the tip 21a of the pressurizing side cylinder 21. In this way, the substrate absence detection sensor 28c, the substrate presence detection sensor 28b, and the origin detection sensor 28a are arranged in this order from the side near the area 131. The position sensor 28 only needs to detect the position of the plate 27, so that the position sensor 28 may be replaced with an arbitrary sensor that can directly detect the position of the plate 27.

Each position sensor 28 detects the plate 27. More specifically, the origin detection sensor 28a detects that the plate 27 is located at the position of the origin. The substrate presence detection sensor 28b detects that the plate 27 is located at a predetermined position (details will be described later) when the substrate W is sucked by the membrane 13. The substrate absence detection sensor 28c detects that the plate 27 is located at a predetermined position when the substrate W is not sucked by the membrane 13, in other words, a position set close to the tip 21a of the pressurizing side cylinder 21.

When sucking the substrate W (FIG. 4B), the controller 71 generates negative pressure in one or more areas other than the area 131 (the areas 132 to 135 in the present embodiment). Thereby, the substrate W is sucked to the lower surface of the membrane 13 (see FIG. 8A). However, in some cases, the substrate is failed to be sucked (see FIG. 8B). Therefore, whether or not the substrate suction succeeds is determined as described below.

The driving pressure generator 24 applies pressure P1 to the driving piston 25. Thereby, the driving piston 25, the pressurizing piston 22, and the plate 27 are pushed in and moved in a direction approaching the area 131. As a result, air in the pressurizing side cylinder 21 is fed into the area 131, so that the area 131 is pressurized. At this time, air is not discharged from the area 131.

Figure 8A:
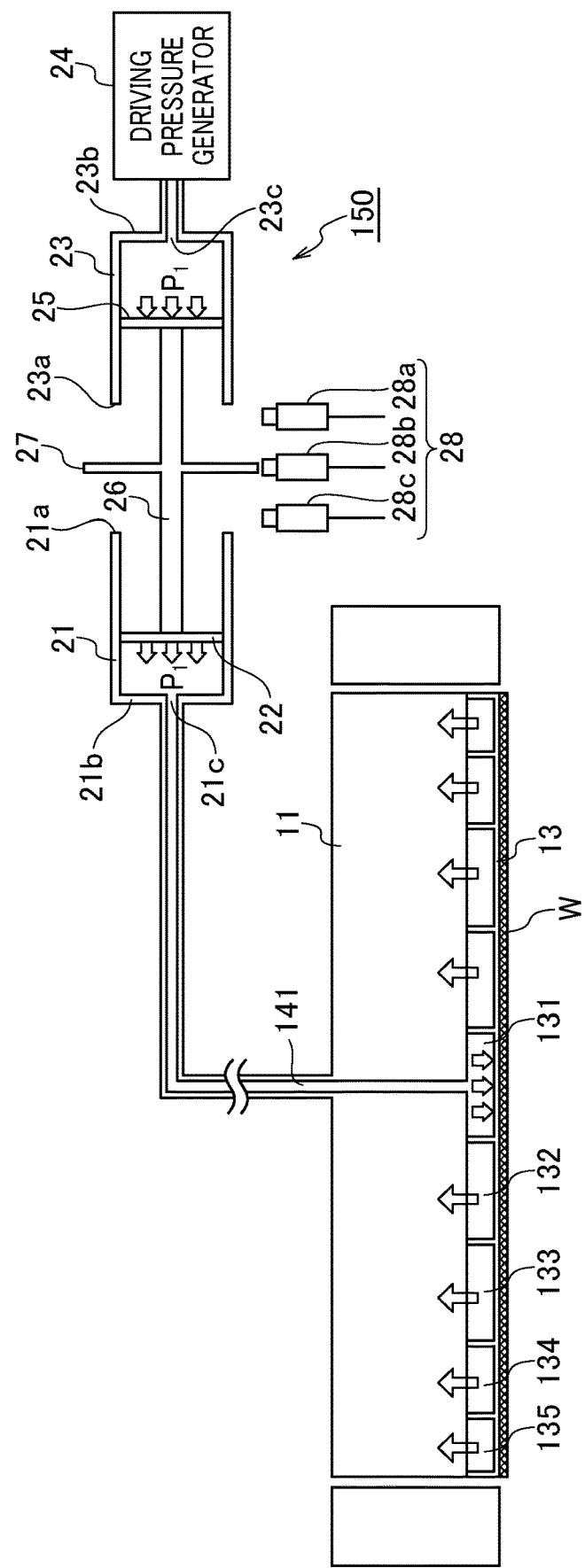
FIG. 8A is a diagram showing a case where substrate suction succeeds.

FIG. 8A is a diagram showing a case where the substrate suction succeeds. When the substrate W is sucked, even if the area 131 is pressurized, the pressure is negative in the areas 132 to 135, so that the substrate W does not fall off from the membrane 13 (in other words, the pressure P1 is set to a level where the sucked substrate W does not fall off). Thus, even when the area 131 is pressurized, the membrane 13 does not swell, and the volume expansion of the area 131 is small.

Therefore, as the pressurizing piston 22 moves toward the area 131, the pressure in the area 131 (to be exact, the pressure in a space composed of the area 131, the flow path 141, the pressurizing side cylinder 21, and the pressurizing piston 22, the same shall apply hereinafter) increases. When the pressure in the area 131 reaches P1, the pressure in the area 131 is balanced with the pressure from the driving pressure generator 24, and the movement of the pressurizing piston 22 (that is, the plate 27) stops.

At this time, the pressurizing piston 22 does not reach the closed surface 21b of the pressurizing side cylinder 21, the plate 27 does not reach the tip 21a of the pressurizing side cylinder 21, and the plate 27 stops at a position between a tip 25a of the driving piston 25 and the tip 21a of the pressurizing side cylinder 21. When the substrate presence detection sensor 28b detects that the plate 27 is located at this position, the determiner 73 determines that the substrate W is sucked.

It is preferable to know in advance a position to which the plate 27 moves when the substrate W is sucked and arrange the substrate presence detection sensor 28b so that the substrate presence detection sensor 28b can detect the plate 27 located at the position.

Figure 8B:
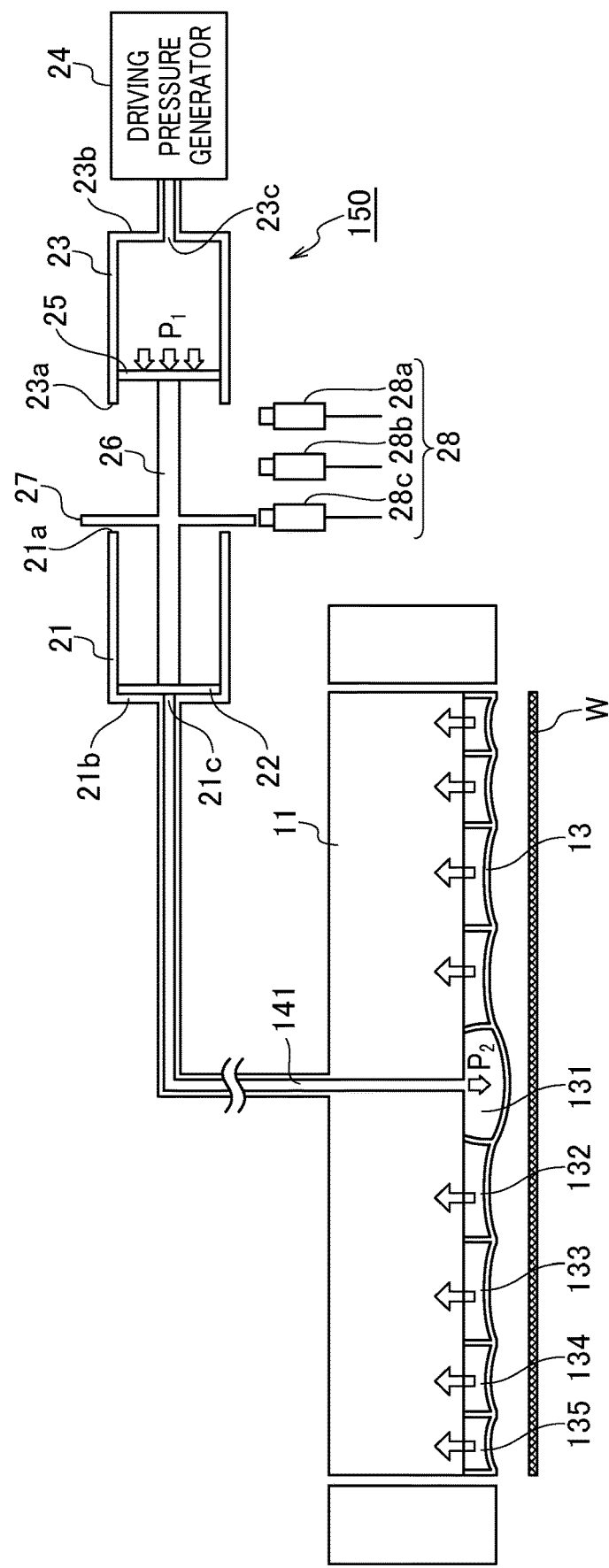
FIG. 8B is a diagram showing a case where substrate suction fails.

FIG. 8B is a diagram showing a case where the substrate suction fails. When the substrate W is not sucked, if the area 131 is pressurized, the membrane 13 swells and the volume of the area 131 increases. At this time, pressure P2 is generated by repulsive force of the membrane 13. However, the pressure P2 is smaller than the pressure P1 from the driving pressure generator 24. Therefore, the plate 27 moves until the pressurizing piston 22 reaches the closed surface 21b of the pressurizing side cylinder 21 (or until the plate 27 reaches the tip 21a of the pressurizing side cylinder 21). When the substrate absence detection sensor 28c detects that the plate 27 is located at this position, the determiner 73 determines that the substrate W is not sucked.

In this way, when the substrate W is sucked (FIG. 8A), the volume of pressurized fluid fed into the area 131 becomes relatively small, and when the substrate W is not sucked (FIG. 8B), the volume of the pressurized fluid fed into the area 131 becomes relatively large. It is possible to determine whether or not the substrate W is sucked by detecting the position of the plate 27 as a value corresponding to the volume.

The plate 27 moves to the position of the substrate absence detection sensor 28c from the origin through the position of the substrate presence detection sensor 28b. Therefore, even when the substrate W is not sucked, the substrate presence detection sensor 28b temporarily detects the plate 27. That is, regardless of whether or not the substrate W is sucked, the substrate presence detection sensor 28b at least temporarily detects the plate 27. Thus, it is desirable that the determiner 73 determines that the substrate W is sucked when the substrate presence detection sensor 28b detects the plate 27 not temporarily, but for a predetermined time.

Alternatively, the determiner 73 may perform the determination based on plate 27 detection results of the substrate presence detection sensor 28b and the substrate absence detection sensor 28c after a predetermined time (a time estimated for the plate 27 to move from the origin to the position of the substrate absence detection sensor 28c when the substrate W is not sucked) or more elapses after the driving pressure generator 24 applies the pressure P1.

Figure 9:
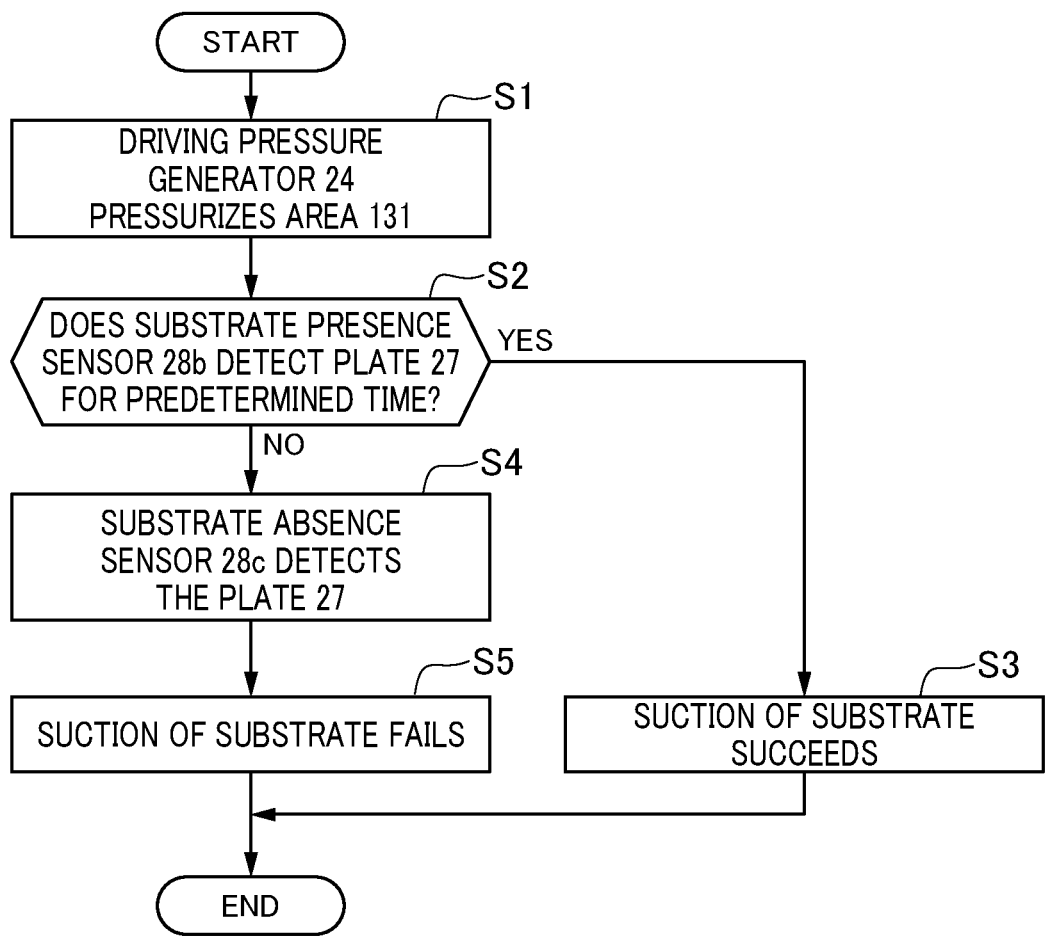
FIG. 9 is a flowchart showing an example of a procedure of substrate suction determination in the first embodiment.

FIG. 9 is a flowchart showing an example of a procedure of the substrate suction determination in the first embodiment. At first, the plate 27 is located at the origin, and this is confirmed by the origin detection sensor 28a.

First, the driving pressure generator 24 applies the pressure P1, so that the pressurizing piston 22 pressurizes the area 131 (step S1).

When the substrate presence detection sensor 28b detects the plate 27 for a predetermined time (YES in step S2), the determiner 73 determines that the suction of the substrate W succeeds (step S3). On the other hand, when the substrate presence detection sensor 28b temporarily detects the plate 27 (NO in step S2), and thereafter the substrate absence detection sensor 28c detects the plate 27 (step S4), the determiner 73 determines that the suction of the substrate W fails (step S5).

In this way, in the first embodiment, it is possible to accurately determine whether or not the substrate is sucked by using difference of the volume of the pressurized fluid fed into the area 131, that is, difference of the amount of movement of the plate 27, depending on whether or not the substrate W is sucked.

Although an example has been shown in which the origin detection sensor 28a, the substrate presence detection sensor 28b, and the substrate absence detection sensor 28c are used as the position sensor 28, the position of the plate 27 may be detected at all times by using a linear gauge sensor. The position sensor 28 need not necessarily detect the plate 27, but may detect a part of the pressurizing mechanism 150 that moves when pressurizing the area 131.

While the substrate suction determination described above can be performed at an arbitrary timing, the substrate suction determination is particularly effective for determination before polishing. This is because the substrate W may be sucked while top ring cleaning liquid or the like is attached to the substrate W before polishing and there is a high possibility that the substrate suction fails as compared with after polishing.

Second Embodiment

A second embodiment described below is different from the first embodiment in a configuration of the pressurizing mechanism 150.

Figure 10:
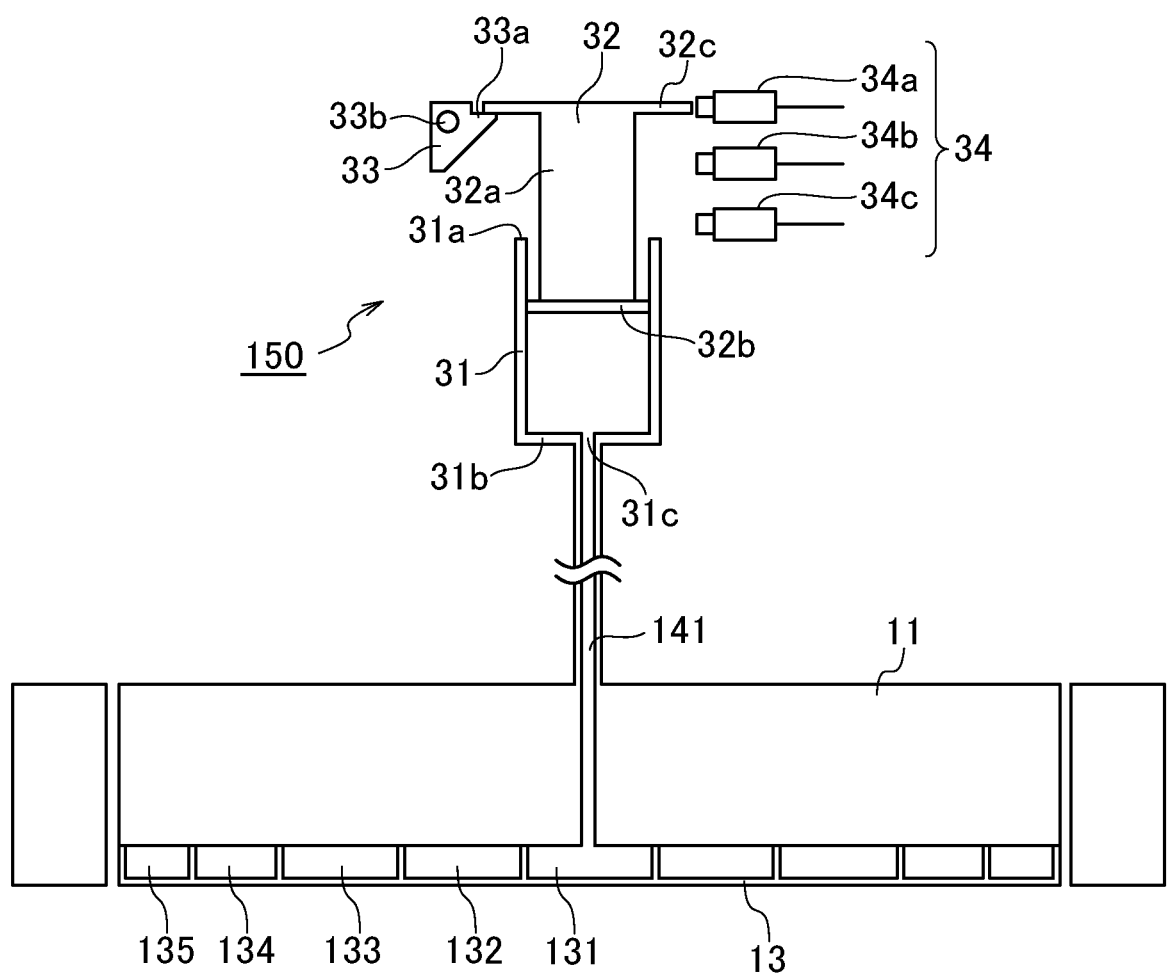
FIG. 10 is a diagram for explaining pressure determination according to a second embodiment.

FIG. 10 is a diagram for explaining the pressure determination according to the second embodiment. The pressurizing mechanism 150 in the present embodiment performs pressurization by a weight driving method and has a cylinder 31, a weight 32, and a stopper 33. The determiner 73 has a position sensor 34.

The cylinder 31 has a cylindrical shape whose tip 31a opens and which extends in a vertical direction, and a flow path 141 is connected to an opening 31c formed at a closed surface 31b (bottom surface).

The weight 32 is composed of a weight main body 32a, a piston 32b, and an upper surface plate 32c. The piston 32b is directly coupled and integrated with the weight main body 32a and also functions as a piston of the cylinder 31. The weight main body 32a has a columnar shape, and the diameter of the weight main body 32a is smaller than the inner diameter of the cylinder 31. Therefore, the weight main body 32a can move up and down in the cylinder 31. The piston 32b has a disk shape whose diameter is greater than that of the weight main body 32a and is slidably in contact with an inner surface of the cylinder 31. The piston 32b is provided with a fluid seal (not shown in the drawings), so that fluid does not move between inside and outside of the cylinder 31. The upper surface plate 32c has a disk shape whose diameter is greater than the diameter of the weight main body 32a and the inner diameter of the cylinder 31.

The stopper 33 is arranged above the cylinder 31 and an upper surface of a shoulder portion 33a of the stopper 33 supports the lower surface of the upper surface plate 32c of the weight 32, so that the stopper 33 prevents the weight 32 from falling. When the stopper 33 is released (that is, when the shoulder portion 33a is tilted around a shaft 33b of the stopper 33), the weight 32 falls. The release of the stopper 33 may be performed by the controller 71 or may be performed manually.

It can be considered that the weight main body 32a and the stopper 33 are substitutes of the driving pressure generator 24 in the first embodiment, and the piston 32b is a substitute of the pressurizing piston 22 in the first embodiment.

The position sensor 34 includes an origin detection sensor 34a, a substrate presence detection sensor 34b, and a substrate absence detection sensor 34c. The origin detection sensor 34a is arranged slightly above the shoulder portion 33a of the stopper 33. The substrate presence detection sensor 34b is arranged between the stopper 33 and the tip 31a of the cylinder 31. The substrate absence detection sensor 34c is arranged slightly above the tip 31a of the cylinder 31. In the same manner as in the first embodiment, the substrate absence detection sensor 34c, the substrate presence detection sensor 34b, and the origin detection sensor 34a are arranged in this order from the side near the area 131.

Each position sensor 34 detects the upper surface plate 32c of the weight 32. More specifically, the origin detection sensor 34a detects that the upper surface plate 32c is located at a position where the weight 32 is supported by the stopper 33 (this position is defined as an origin). The substrate presence detection sensor 34b detects that the upper surface plate 32c is located at a predetermined position (details will be described later) when the substrate W is sucked by the membrane 13. The substrate absence detection sensor 34c detects that the upper surface plate 32c is located at a position when the substrate W is not sucked by the membrane 13, in other words, a predetermined position set close to the tip 31a of the cylinder 31.

In the present embodiment, whether or not the substrate suction succeeds is determined as described below.

For the determination, the stopper 33 is released. Thereby, the weight 32 falls by the force of gravity, and the piston 32b is pushed in and moves in a direction approaching the area 131. As a result, air in the cylinder 31 is fed into the area 131, so that the area 131 is pressurized. At this time, air is not discharged from the area 131.

Figure 11A:
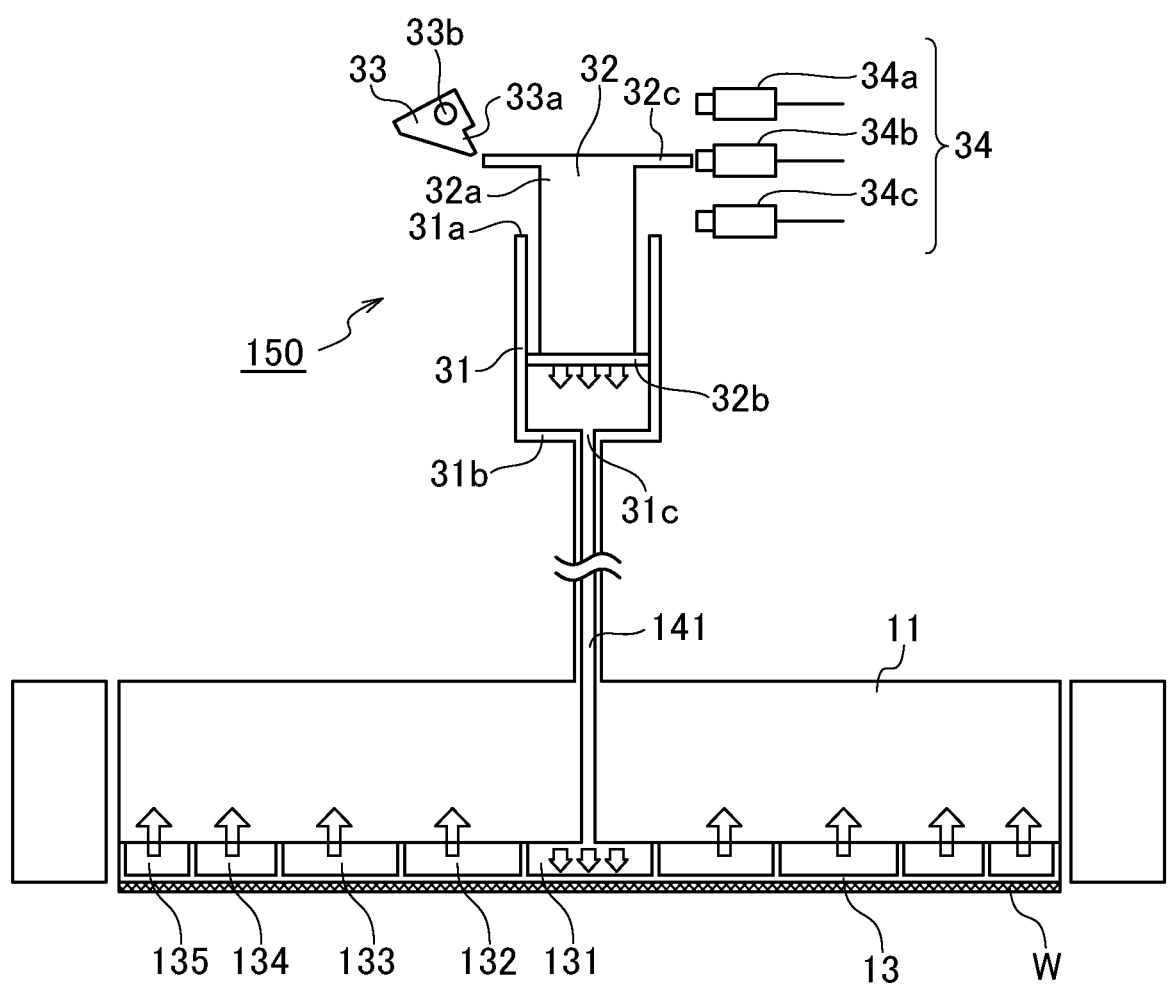
FIG. 11A is a diagram showing a case where substrate suction succeeds.

FIG. 11A is a diagram showing a case where the substrate suction succeeds. When the substrate W is sucked, even if the area 131 is pressurized, the pressure is negative in the areas 132 to 135, so that the substrate W does not fall off from the membrane 13 (in other words, the weight of the weight 32 is set to a level where the sucked substrate W does not fall off). Thus, even when the area 131 is pressurized, the membrane 13 does not swell, and the volume expansion of the area 131 is small.

Therefore, as the piston 32b moves (downward) toward the area 131, the pressure in the area 131 (to be exact, the pressure in a space composed of the area 131, the flow path 141, the cylinder 31, and the piston 32b, the same shall apply hereinafter) increases. Then, the pressure in the area 131 is balanced with the pressure from the weight 32, and the movement of the piston 32b stops. Of course, the upper surface plate 32c also stops.

At this time, the piston 32b does not reach the closed surface 31b of the cylinder 31, the upper surface plate 32c does not reach the tip 31a of the cylinder 31, and the upper surface plate 32c stops at a position between the origin and the tip 31a of the cylinder 31. When the substrate presence detection sensor 34b detects that the upper surface plate 32c is located at this position, the determiner 73 determines that the substrate W is sucked.

It is preferable to know in advance a position to which the upper surface plate 32c moves when the substrate W is sucked and arrange the substrate presence detection sensor 34b so that the substrate presence detection sensor 34b can detect the upper surface plate 32c located at the position.

Figure 11B:
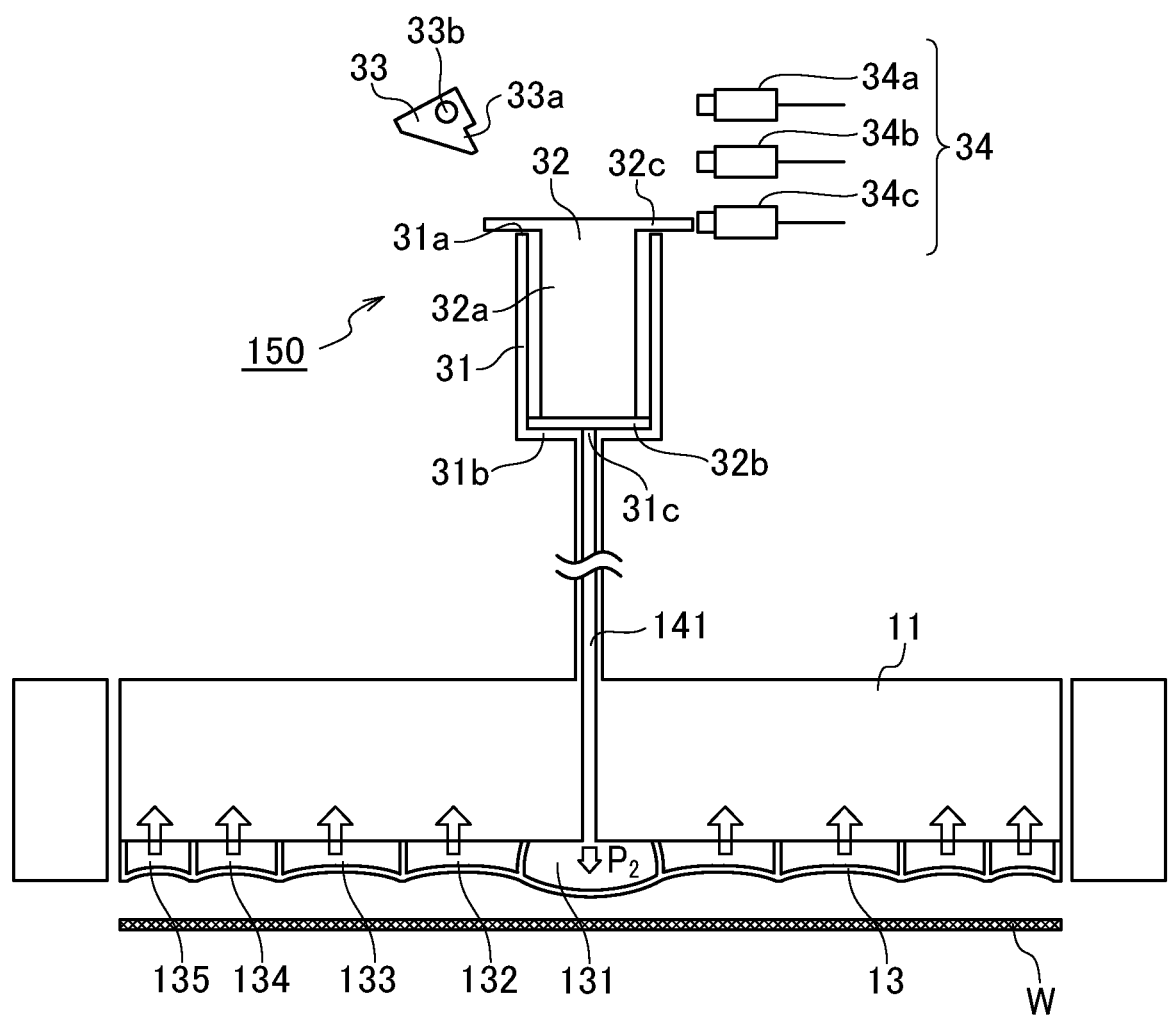
FIG. 11B is a diagram showing a case where substrate suction fails.

FIG. 11B is a diagram showing a case where the substrate suction fails. When the substrate W is not sucked, if the area 131 is pressurized, the membrane 13 swells and the volume of the area 131 increases. At this time, pressure P2 is generated by repulsive force of the membrane 13. However, the pressure P2 is smaller than the pressure from the weight 32. Therefore, the weight 32 falls until the piston 32b reaches the closed surface 31b of the cylinder 31 or until the upper surface plate 32c reaches the tip 31a of the cylinder 31. When the substrate absence detection sensor 34c detects that the upper surface plate 32c is located at this position, the determiner 73 determines that the substrate W is not sucked.

In this way, when the substrate W is sucked (FIG. 11A), the volume of pressurized fluid fed into the area 131 becomes relatively small, and when the substrate W is not sucked (FIG. 11B), the volume of the pressurized fluid fed into the area 131 becomes relatively large. It is possible to determine whether or not the substrate W is sucked by detecting the position of the upper surface plate 32c as a value corresponding to the volume.

The upper surface plate 32c moves to the position of the substrate absence detection sensor 34c from the origin through the position of the substrate presence detection sensor 34b. Therefore, even when the substrate W is not sucked, the substrate presence detection sensor 34b temporarily detects the upper surface plate 32c. That is, regardless of whether or not the substrate W is sucked, the substrate presence detection sensor 34b at least temporarily detects the upper surface plate 32c. Thus, it is desirable that the determiner 73 determines that the substrate W is sucked when the substrate presence detection sensor 34b detects the upper surface plate 32c not temporarily, but for a predetermined time.

Alternatively, the determiner 73 may perform the determination based on detection results of the upper surface plate 32c by the substrate presence detection sensor 34b and the substrate absence detection sensor 34c after a predetermined time (a time estimated for the upper surface plate 32c to move from the origin to the position of the substrate absence detection sensor 34c when the substrate W is not sucked) or more elapses after the stopper 33 is released.

Figure 12:
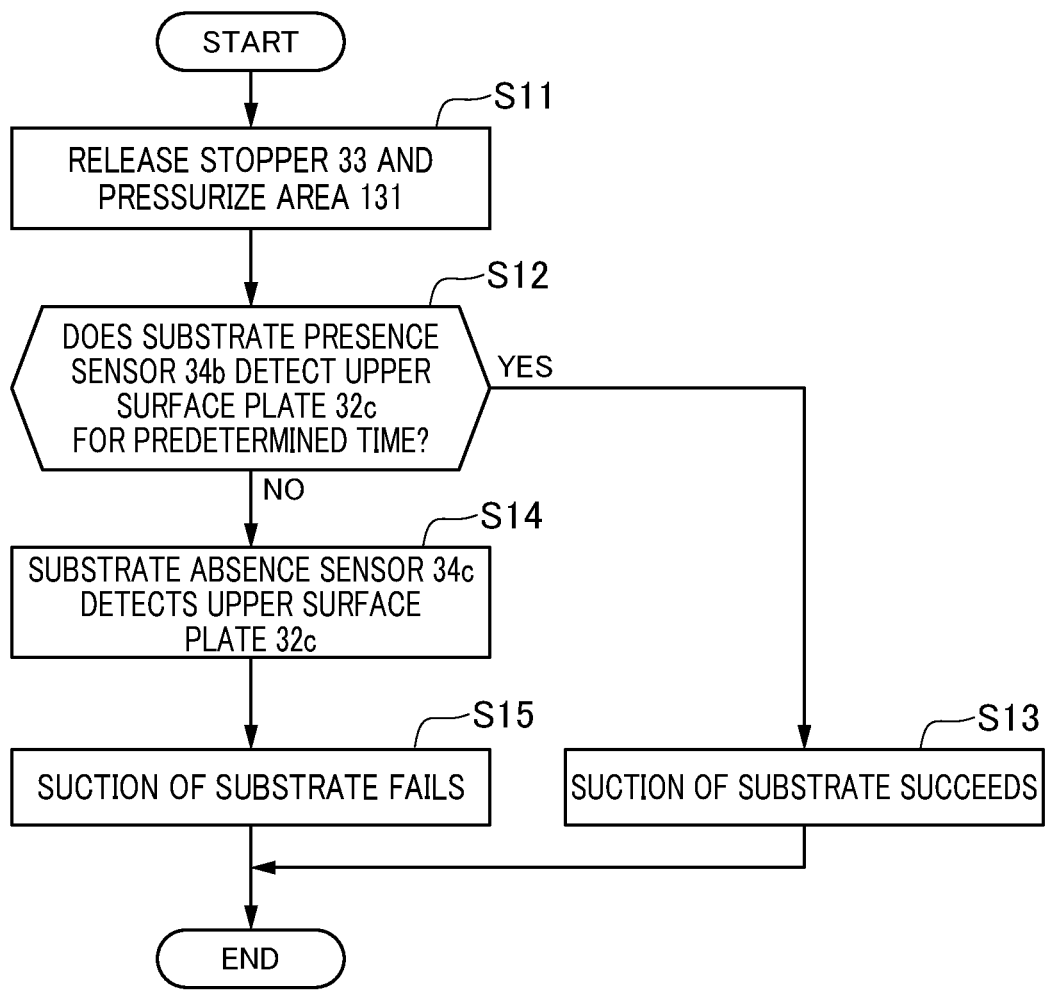
FIG. 12 is a flowchart showing an example of a procedure of substrate suction determination in the second embodiment.

FIG. 12 is a flowchart showing an example of a procedure of the substrate suction determination in the second embodiment. At first, the weight 32 is supported by the stopper 33, the upper surface plate 32c is located at the origin, and this is confirmed by the origin detection sensor 34a.

First, the stopper 33 is released, so that the weight 32 falls and pressurizes the area 131 (step S11).

When the substrate presence detection sensor 34b detects the upper surface plate 32c for a predetermined time (YES in step S12), the determiner 73 determines that the suction of the substrate W succeeds (step S13). On the other hand, when the substrate presence detection sensor 34b temporarily detects the upper surface plate 32c (NO in step S12), and thereafter the substrate absence detection sensor 34c detects the upper surface plate 32c (step S14), the determiner 73 determines that the suction of the substrate W fails (step S15).

In this way, in the second embodiment, it is possible to accurately determine whether or not the substrate is sucked by using difference of the volume of the pressurized fluid fed into the area 131, that is, difference of the amount of movement (the amount of fall) of the upper surface plate 32c, depending on whether or not the substrate W is sucked.

Although an example has been shown in which the origin detection sensor 34a, the substrate presence detection sensor 34b, and the substrate absence detection sensor 34c are used as the position sensor 34, the position of the upper surface plate 32c may be detected at all times by using a linear gauge sensor. As the position sensor 34, an optical sensor, an encoder, a junction sensor, or the like may be used. The position sensor 34 need not necessarily detect the upper surface plate 32c, but may detect a part of the pressurizing mechanism 150 that moves when pressurizing the area 131.

Figure 13:
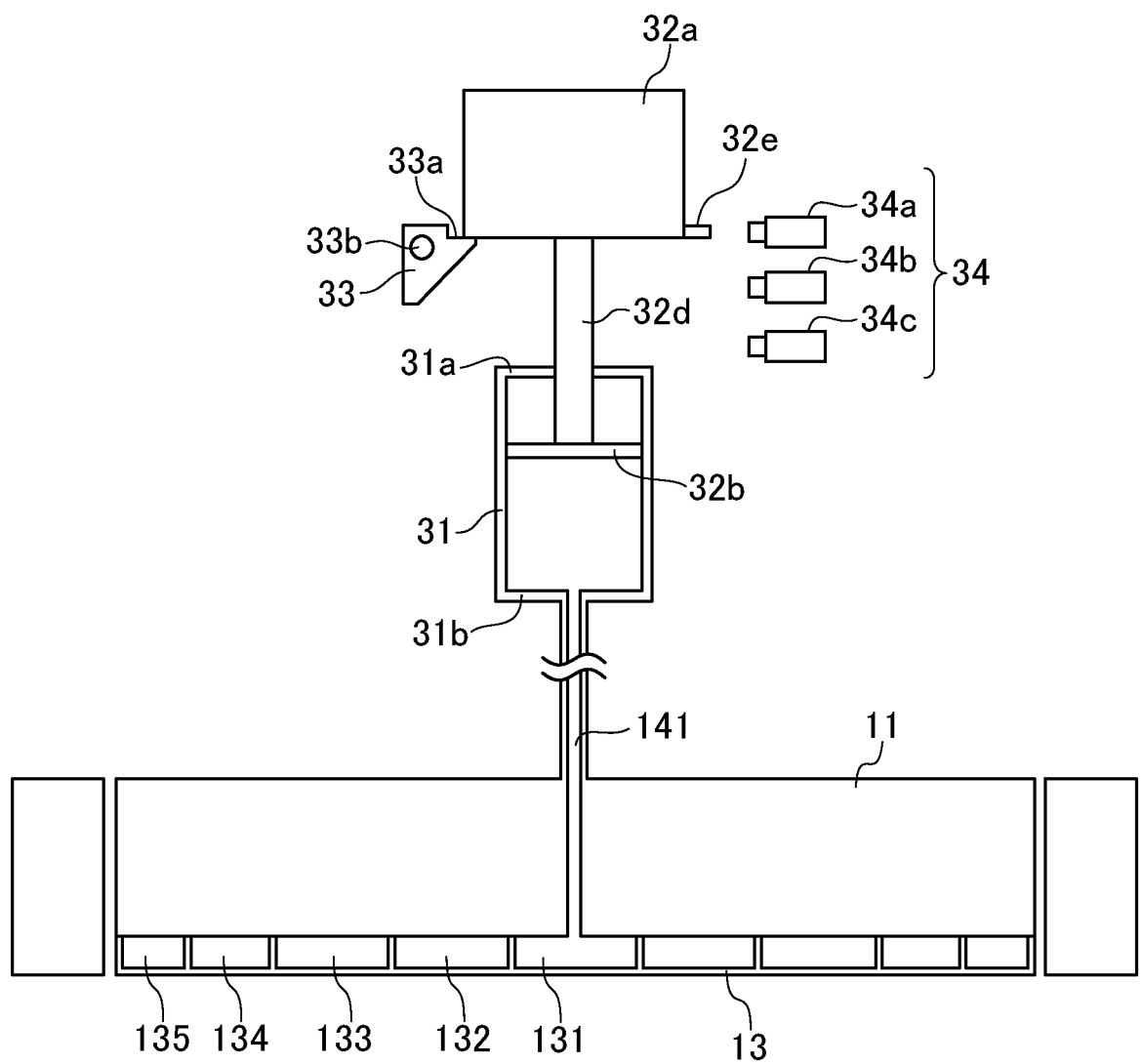
FIG. 13 is a diagram for explaining a modified example of FIG. 10.

FIG. 13 is a diagram for explaining a modified example of FIG. 10. In FIG. 10, the piston 32b and the weight main body 32a are integrated together. However, the piston 32b and the weight main body 32a may be different members as shown in FIG. 13. In this case, the piston 32b provided in the cylinder 31 is coupled with the weight main body 32a provided above the cylinder 31 by a piston rod 32d penetrating the upper surface of the cylinder 31. A protruded portion 32e is provided to a part (for example, a lower portion) of the weight main body 32a, and the protruded portion 32e is detected by the position sensor 34.

In each embodiment described below, a configuration where the piston and the weight main body are integrated together will be described. However, of course, the piston and the weight main body may be different members.

Third Embodiment

In a third embodiment described below, a pressure gauge that measures the pressure in the area 131 is used instead of the position sensors 28 and 34 described in the first and the second embodiments. Hereinafter, the third embodiment will be described by using the pressurizing mechanism 150 shown in the second embodiment as an example. However, the third embodiment can also be applied to the first embodiment.

Figure 14:
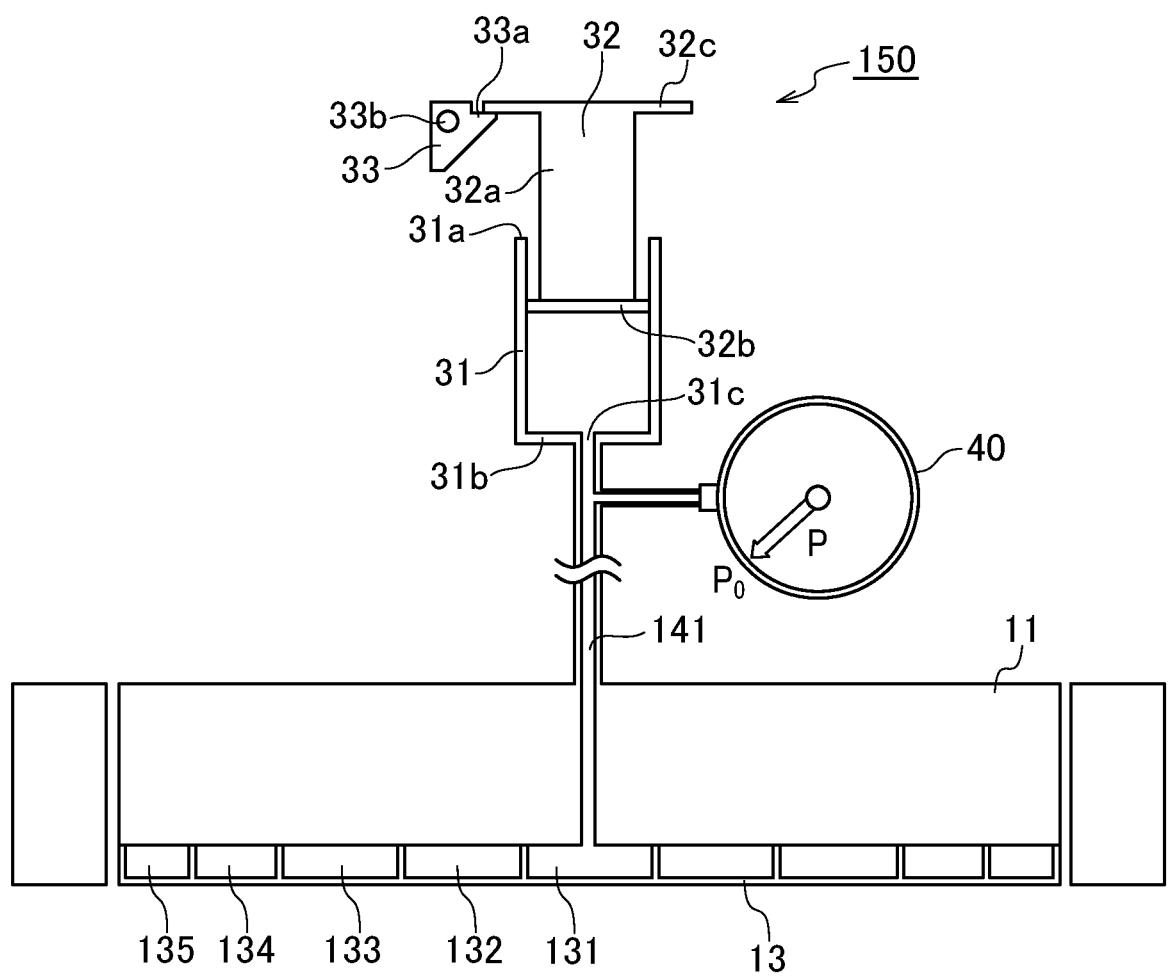
FIG. 14 is a diagram for explaining pressure determination according to a third embodiment.

FIG. 14 is a diagram for explaining the pressure determination according to the third embodiment. The determiner 73 in the present embodiment has a pressure gauge 40. The pressure gauge 40 only has to measure the pressure in the area 131 and is installed on, for example, the flow path 141. However, the pressure gauge 40 may be installed in another position. The pressure (initial pressure) in the area 131 when the weight 32 is supported by the stopper 33 is defined as P0.

Figure 15A:
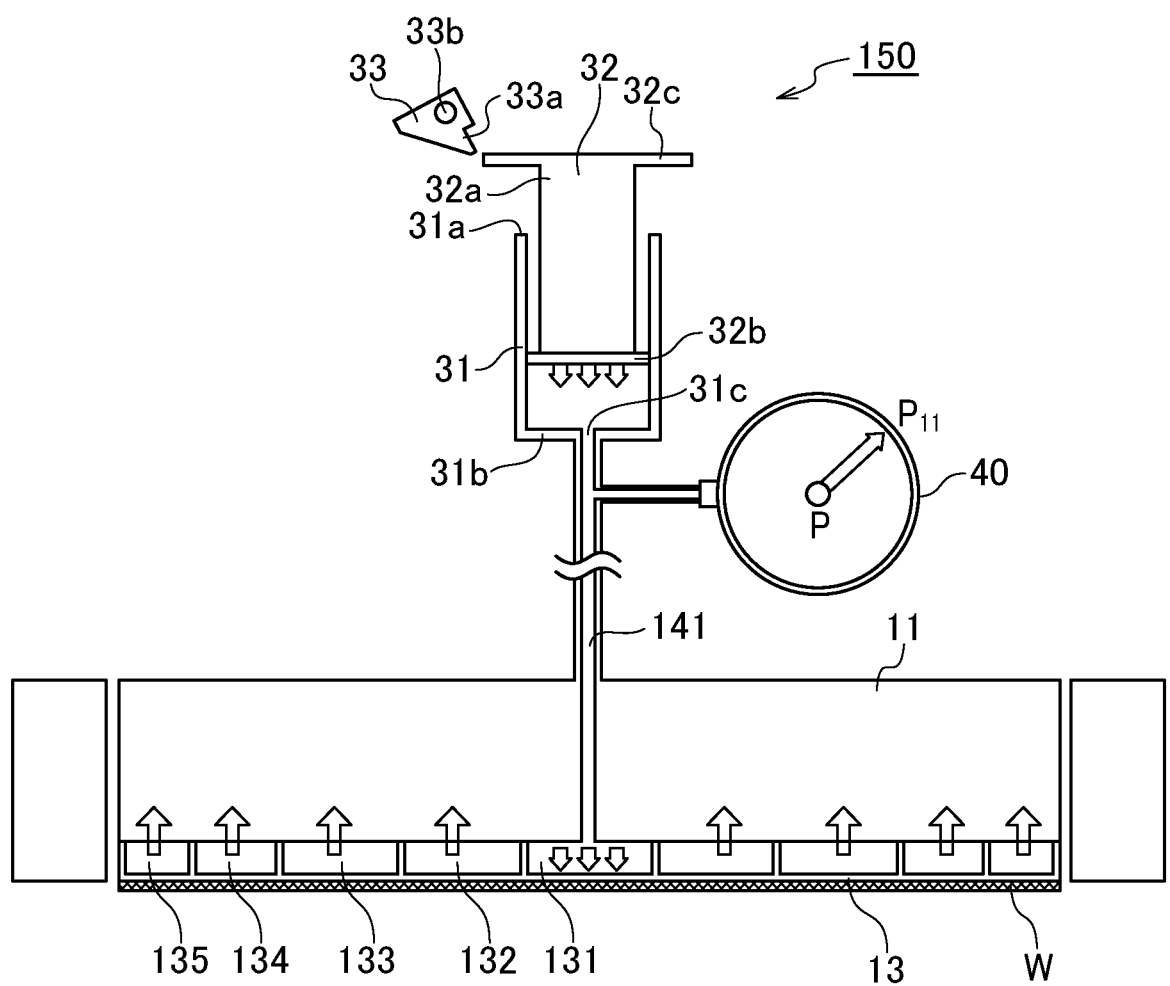
FIG. 15A is a diagram showing a case where substrate suction succeeds.

FIG. 15A is a diagram showing a case where the substrate suction succeeds. When the substrate W is sucked, the weight 32 falls and air is fed into the area 131. However, the membrane 13 does not swell, and the volume expansion of the area 131 is small. Therefore, the pressure in the area 131 is increased by the air fed into the area 131. The pressure at this time is defined as P11.

Figure 15B:
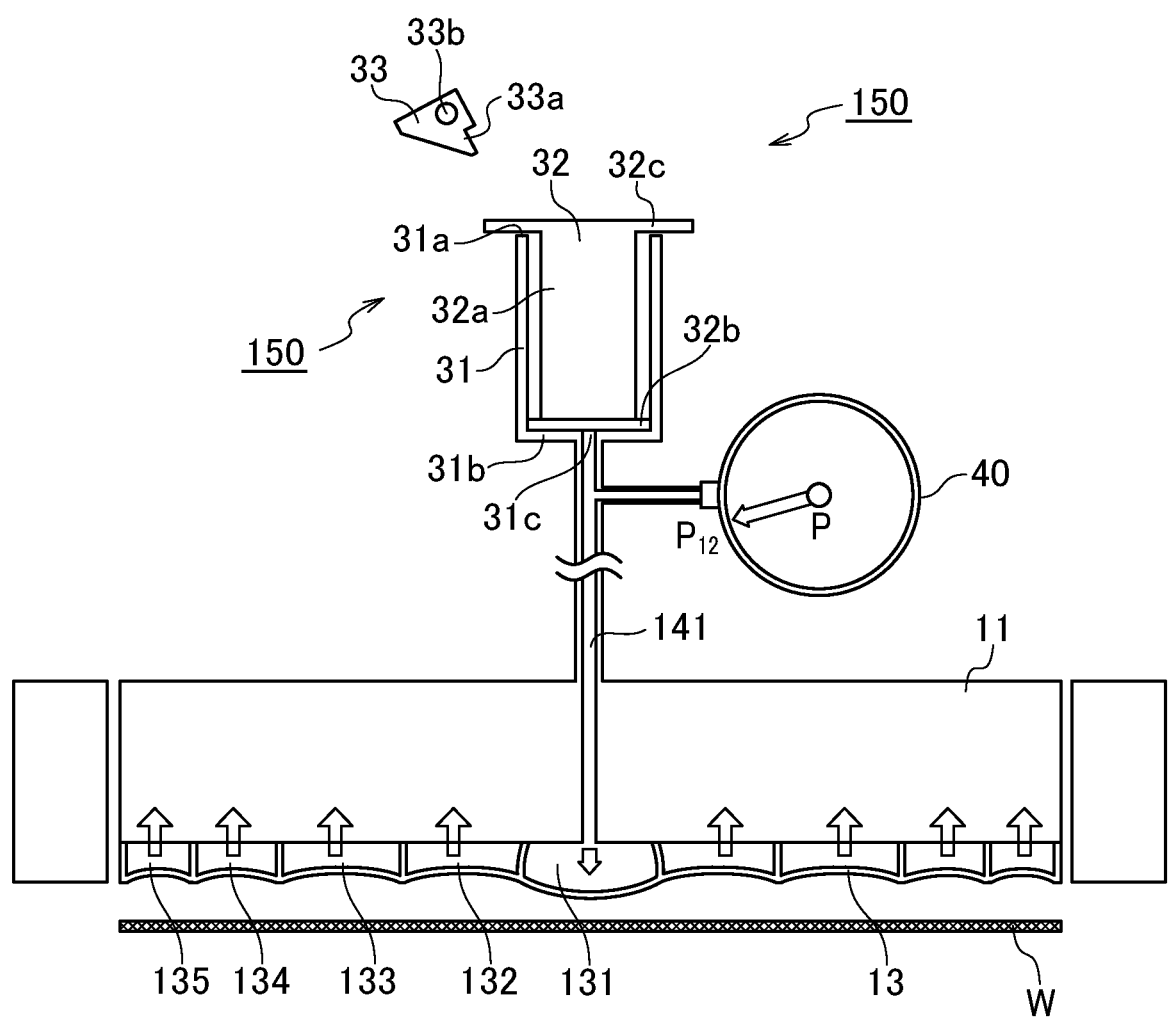
FIG. 15B is a diagram showing a case where substrate suction fails.

FIG. 15B is a diagram showing a case where the substrate suction fails. When the substrate W is not sucked, the weight 32 falls and air is fed into the area 131. Accordingly, the membrane 13 swells, and the volume of the area 131 increases. Therefore, the pressure in the area 131 only slightly increases. The pressure at this time is defined as P12. Here, a relationship of pressure P0<pressure P12<pressure P11 is established.

Therefore, when the pressure measured by the pressure gauge 40 reaches P11, the determiner 73 can determine that the substrate W is sucked. On the other hand, when the pressure measured by the pressure gauge 40 does not reach P11, the determiner 73 can determine that the substrate W is not sucked.

The pressure in the area 131 reaches from the pressure P0 to the pressure P11 through the pressure P12. Therefore, even when the substrate W is sucked, the pressure in the area 131 temporarily becomes P12. That is, regardless of whether or not the substrate W is sucked, the pressure in the area 131 at least temporarily becomes P12. Thus, it is desirable that the determiner 73 determines whether or not the substrate W is sucked based on whether or not the pressure in the area 131 reaches P11 after a predetermined time or more elapses instead of determining that the substrate W is not sucked when the pressure reaches P12.

Alternatively, the determiner 73 may determine that the substrate W is not sucked when the pressure in the area 131 does not become higher than P12 for a predetermined time instead of temporarily.

Figure 16:
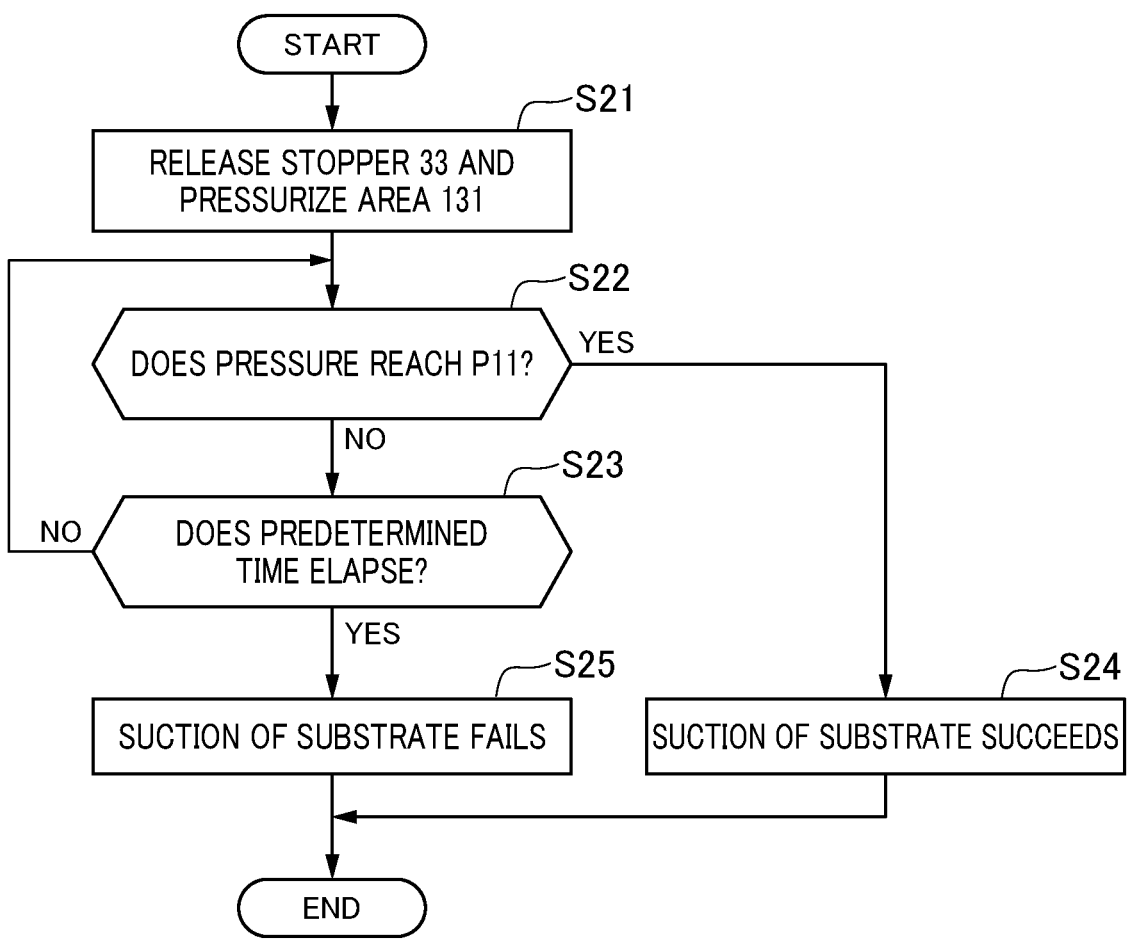
FIG. 16 is a flowchart showing an example of a procedure of substrate suction determination in the third embodiment.

FIG. 16 is a flowchart showing an example of a procedure of the substrate suction determination in the third embodiment. At first, the weight 32 is supported by the stopper 33, the upper surface plate 32c is located at the origin, and this is confirmed by the origin detection sensor 34a.

First, the stopper 33 is released, so that the weight 32 falls and pressurizes the area 131 (step S21). When the pressure in the area 131 reaches P11 before a predetermined time elapses (YES in step S22, NO in step S23), the determiner 73 determines that the suction of the substrate W succeeds (step S24). On the other hand, when the pressure in the area 131 does not reach P11 even after a predetermined time elapses (YES in step S23), the determiner 73 determines that the suction of the substrate W fails (step S25).

In this way, in the third embodiment, it is possible to accurately determine whether or not the substrate is sucked by using difference of the pressure in the area 131 depending on whether or not the substrate W is sucked.

Fourth Embodiment

Figure 17:
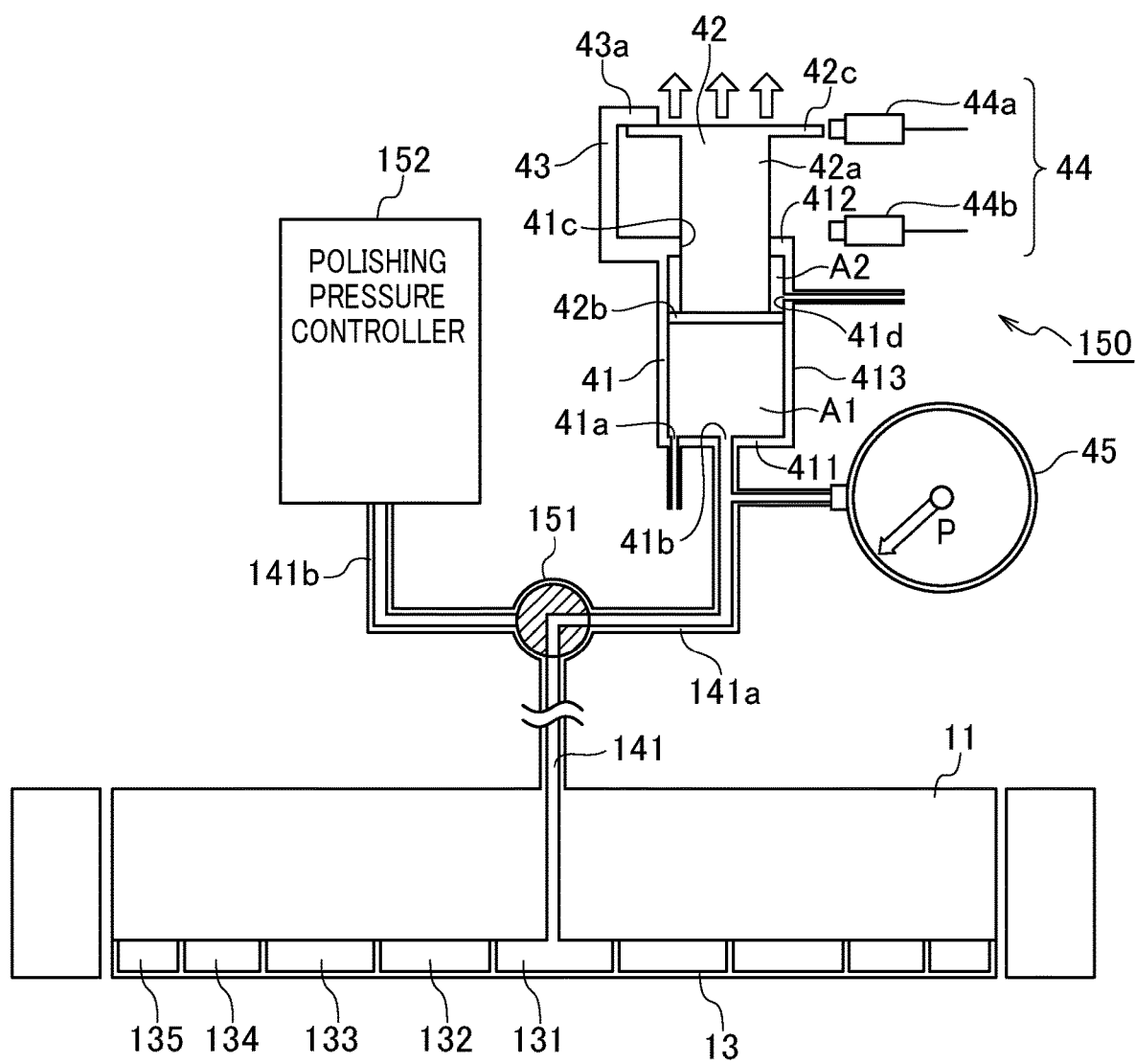
FIG. 17 is a diagram for explaining pressure determination according to a fourth embodiment.

FIG. 17 is a diagram for explaining the pressure determination according to the fourth embodiment. The pressurizing mechanism 150 has a cylinder 41, a weight 42, and a stopper 43.

The cylinder 41 has a cylindrical shape extending in a vertical direction. In the cylinder 41, openings 41a and 41b are formed at a lower surface 411, an opening 41c is formed at an upper surface 412, and an opening 41d is formed at a side surface 413. In other words, the openings 41a and 41b are located below a piston 42b, and the opening 41d is located above the piston 42b. The opening 41b is connected to the flow path 141 through a flow path 141a. The opening 41a can be opened and can be closed by using a plug (not shown in FIG. 17) or the like. The opening 41d can be opened and can be connected to a vacuum apparatus (not shown in the drawings). Switching such as opening and closing of the openings 41a and 41d may be performed by the controller 71 or may be performed manually.

The weight 42 is composed of a weight main body 42a, a piston 42b, and an upper surface plate 42c. The piston 42b is directly coupled and integrated with the weight main body 42a and also functions as a piston of the cylinder 41. The weight main body 42a has a columnar shape, and the diameter of the weight main body 42a is smaller than the inner diameter of the cylinder 41. The weight main body 42a penetrates the opening 41c of the cylinder 41 and is slidably in contact with an inner surface of the opening 41c. The piston 42b has a disk shape whose diameter is greater than that of the weight main body 42a and is slidably in contact with an inner surface of the cylinder 41. The upper surface plate 42c has a disk shape whose diameter is greater than the diameter of the weight main body 42a and the inner diameter of the opening 41c.

The stopper 43 has a shoulder portion 43a, and the shoulder portion 43a is located above the upper surface plate 42c of the weight 42. Therefore, when the upper surface of the upper surface plate 42c comes into contact with the lower surface of the shoulder portion 43a, the upper surface plate 42c does not move upward any more. The stopper 43 may be a member that is coupled with or integrated with the upper surface 412 of the cylinder 41 or may be a member different from the cylinder 41.

By such a configuration, the inside of the cylinder 41 is divided into a lower space A1 and an upper space A2 by the piston 42b of the weight 42. The lower space A1 may be provided with the openings 41a and 41b, and the upper space A2 may be provided with the openings 41c and 41d. The positions of the openings 41a to 41d are not limited to those shown in FIG. 17. The piston 42b is provided with a fluid seal (not shown in the drawings), so that fluid does not move between the lower space A1 and the upper space A2. Similarly, the opening 41c in the upper surface 412 of the cylinder 41 is also provided with a fluid seal (not shown in the drawings), so that fluid does not move between the upper space A2 and the outside of the cylinder 41.

The determiner 73 has a position sensor 44 and a pressure gauge 45.

The position sensor 44 includes an origin detection sensor 44a and a substrate absence detection sensor 44b. The origin detection sensor 44a is arranged slightly below the shoulder portion 43a of the stopper 43. The substrate absence detection sensor 44b is arranged slightly above the upper surface 412 of the cylinder 41. The substrate presence detection sensor need not be provided.

The origin detection sensor 44a detects that the upper surface plate 42c is located at a position where the upper surface plate 42c is in contact with the shoulder portion 43a (this position is defined as an origin). The substrate absence detection sensor 44b detects that the upper surface plate 42c is located at a position when the substrate W is not sucked by the membrane 13, in other words, a predetermined position set close to the upper surface 412 of the cylinder 41.

The pressure gauge 45 only has to measure the pressure in the area 131 and is installed on, for example, the flow path 141a. However, the pressure gauge 45 may be installed in another position.

The pressure control apparatus 7 of the present embodiment further has a switching unit 151 and a polishing pressure controller 152. The flow path 141 is connected to (the cylinder 41 of) the pressurizing mechanism 150 through the flow path 141a and connected to the polishing pressure controller 152 through a flow path 141b.

The switching unit 151 is a switching valve or a three-way valve and switches whether to cause the area 131 to communicate with the opening 41b of the cylinder 41 or with the polishing pressure controller 152 through the flow path 141. In other words, the switching unit 151 switches whether to cause the flow path 141 to communicate with the flow path 141a or the flow path 141b. The switching may be performed by the controller 71 or may be performed manually. The polishing pressure controller 152 applies a polishing pressure to the area 131 during polishing.

Figure 18:
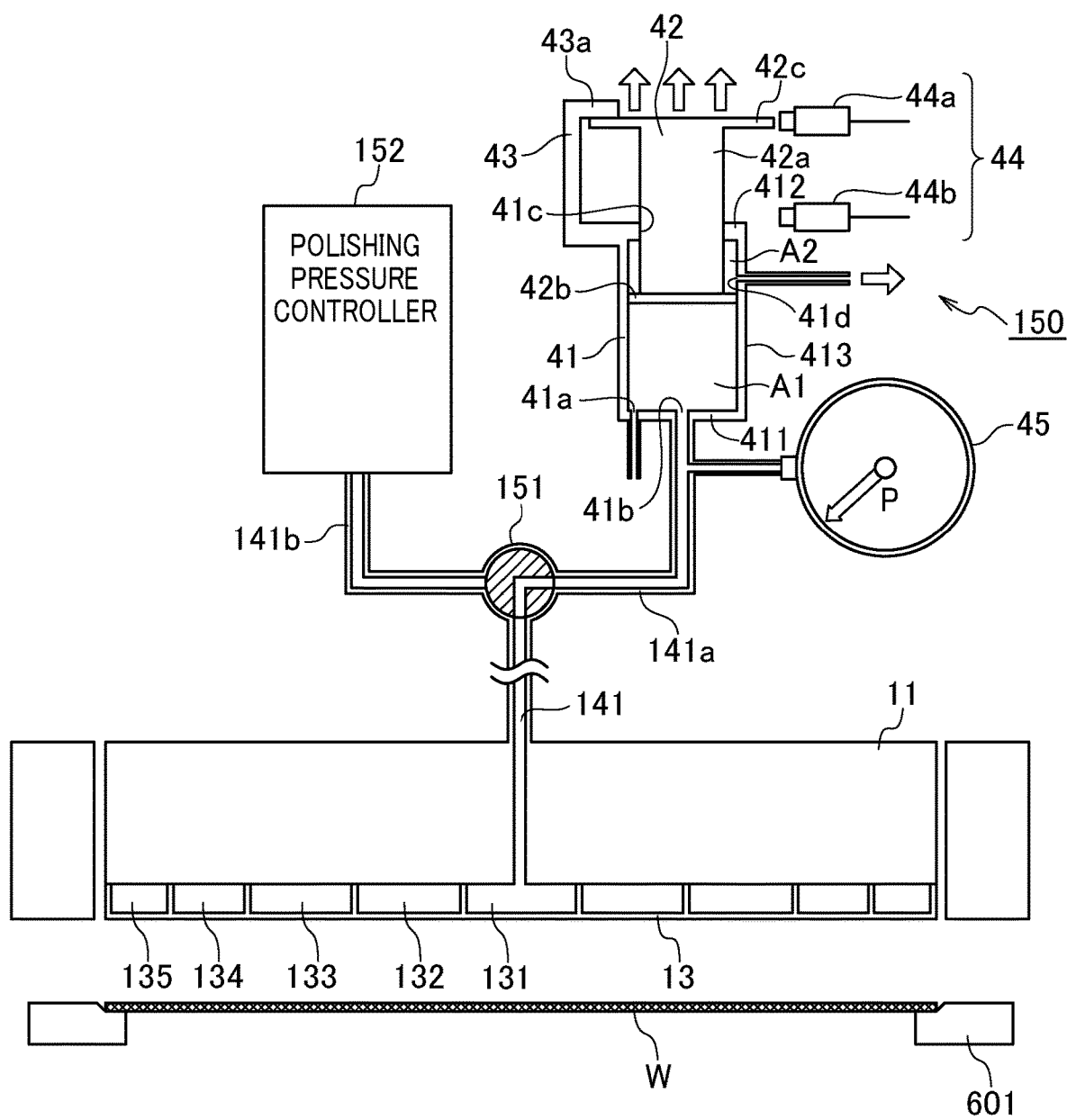
FIG. 18 is a diagram showing the pressure control apparatus during standby, that is, before substrate suction determination.

FIG. 18 is a diagram showing the pressure control apparatus 7 during standby, that is, before the substrate suction determination. The switching unit 151 causes the flow path 141 to communicate with the flow path 141a. The opening 41a is opened. Air is evacuated (sucked) from the upper space A2 through the opening 41d, and negative pressure is generated. Thereby, the weight 42 rises until the upper surface plate 42c comes into contact with the shoulder portion 43a. The pressure in the area 131 at this time is defined as P0. When generating negative pressure in the upper space A2, by opening the lower space A1, it is possible to prevent negative pressure from being applied to the membrane 13.

Instead of generating negative pressure in the upper space A2, by pressurizing the lower space A1, the weight 42 may be raised. However, the membrane 13 is also pressurized when a substrate suction determination operation is started, so that the suction determination may be affected. Therefore, it is desirable to generate negative pressure in the upper space A2.

In the present embodiment, whether or not the substrate suction succeeds is determined as described below. When performing the determination, the opening 41a is closed and the opening 41d is opened. Then, the weight 42 falls by the force of gravity, and the piston 42b is pushed in and moves in a direction approaching the area 131. As a result, air in the lower space A1 in the cylinder 41 is fed into the area 131, so that the area 131 is pressurized. At this time, air is not discharged from the area 131.

Figure 19A:
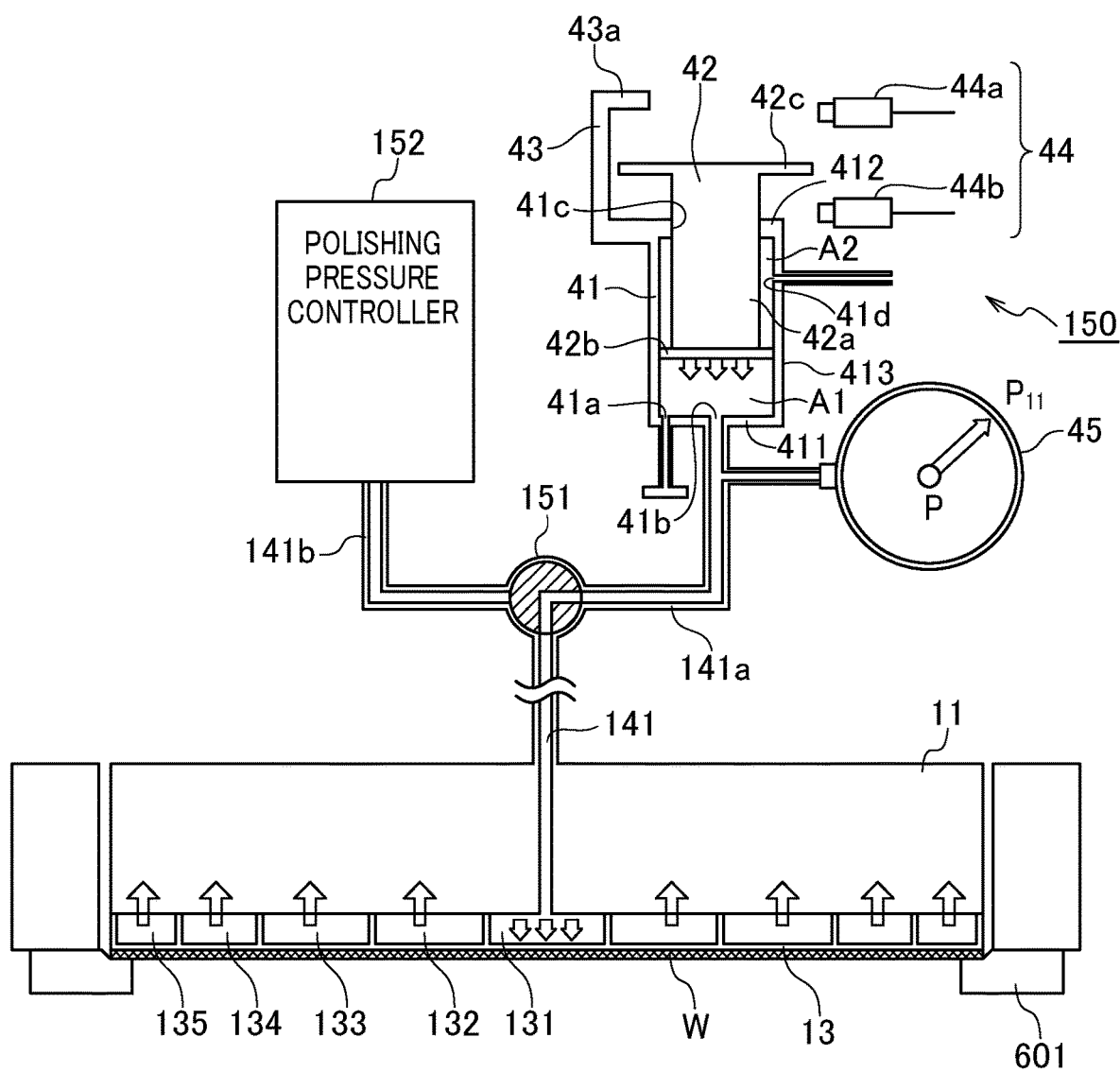
FIG. 19A is a diagram showing a case where substrate suction succeeds.

FIG. 19A is a diagram showing a case where the substrate suction succeeds. The weight 42 falls and air is fed into the area 131. However, the membrane 13 hardly swells. Therefore, the pressure in the area 131 increases. The pressure at this time is defined as P11. The pressure gauge 40 detects that the pressure in the area 131 reaches P11, so that the determiner 73 can determine that the substrate W is sucked. In this case, the position sensor 44 need not be used for the determination.

Figure 20:
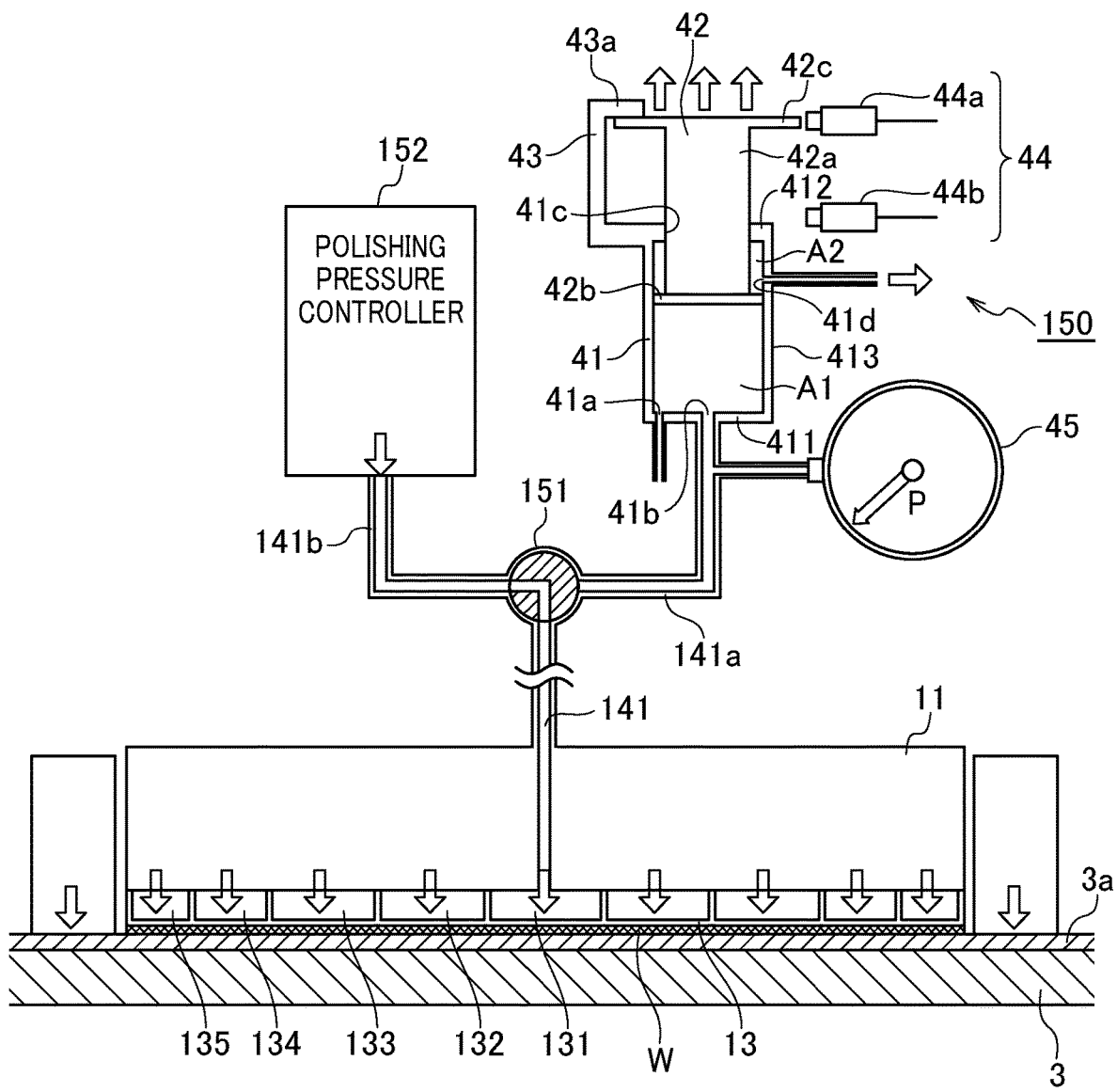
FIG. 20 is a diagram showing a state during polishing.

When the suction of the substrate W succeeds, as shown in FIG. 20, the switching unit 151 causes the flow path 141 to communicate with the flow path 141b, and the area 131 is pressurized for polishing by the polishing pressure controller 152. The areas 132 to 135 may also be pressurized by the controller 71. In this way, the lower surface of the substrate W is polished by the polishing pad 3a. At this time, the opening 41a is opened, and negative pressure is generated in the upper space A2 from the opening 41d, so that the weight 42 is brought into a standby state. In other words, the weight 42 is restored to the origin while polishing is being performed.

Figure 19B:
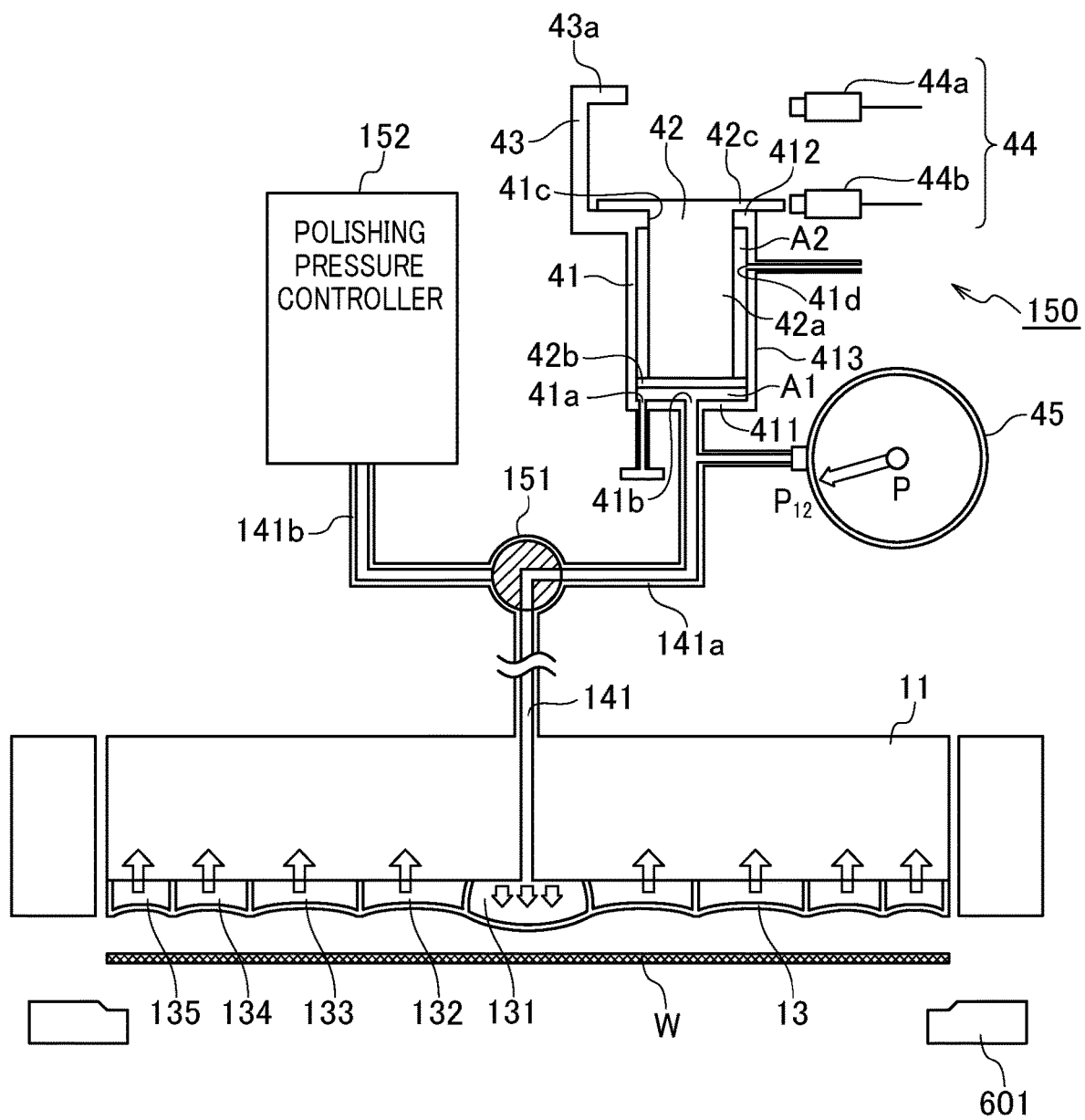
FIG. 19B is a diagram showing a case where substrate suction fails.

FIG. 19B is a diagram showing a case where the substrate suction fails. The weight 42 falls and air is fed into the area 131, and the membrane 13 swells accordingly and the volume of the area 131 increases. At this time, pressure is generated by repulsive force of the membrane 13. However, the pressure is smaller than pressure from the weight 42. Therefore, the weight 42 falls until the piston 42b reaches the lower surface 411 of the cylinder 41 or until the upper surface plate 42c reaches the upper surface 412 of the cylinder 41. When a substrate absence detection sensor 43b detects that the upper surface plate 42c is located at this position, the determiner 73 determines that the substrate W is not sucked. In this case, the pressure gauge 45 need not be used for the determination.

In this way, in the present embodiment, successful suction of the substrate W is determined by the pressure in the area 131, in other words, by a pressure measurement result of the pressure gauge 45. On the other hand, suction failure of the substrate W is determined by detection of the upper surface plate 42c by the substrate absence detection sensor 43b.

Figure 21:
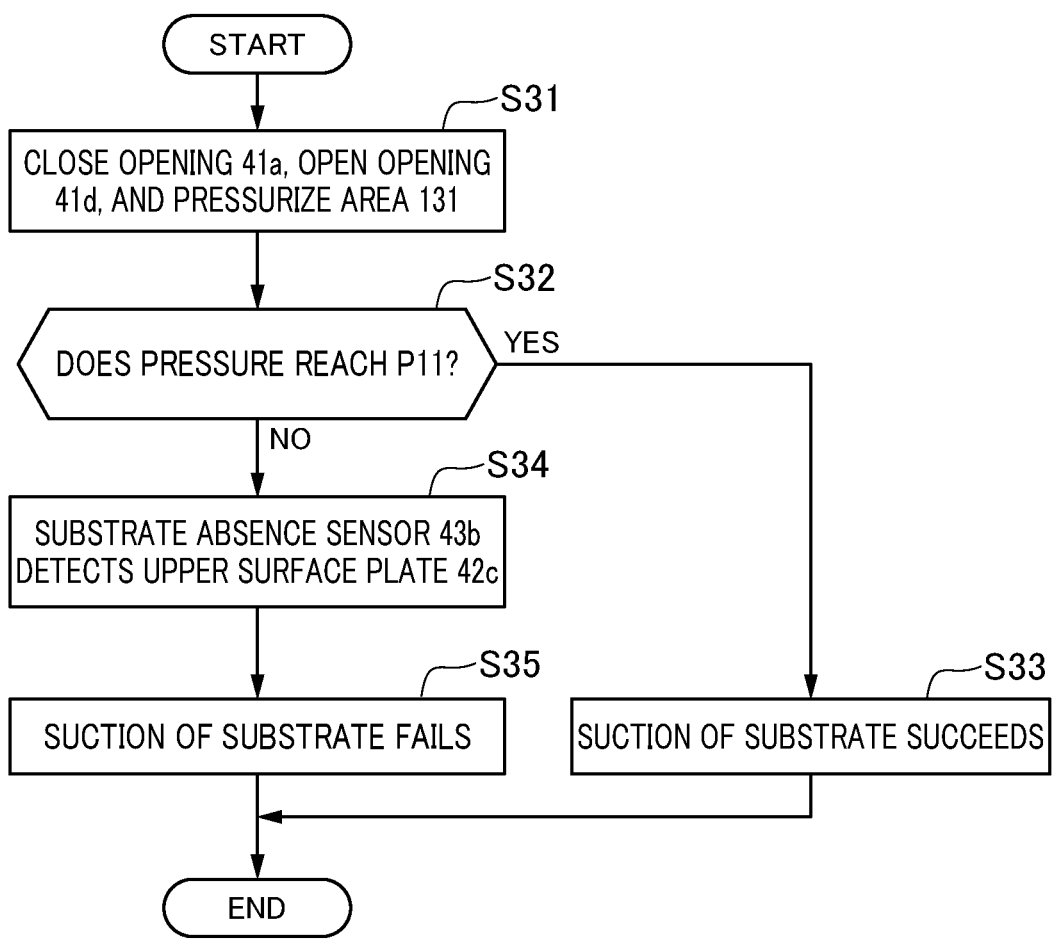
FIG. 21 is a flowchart showing an example of a procedure of substrate suction determination in the fourth embodiment.

FIG. 21 is a flowchart showing an example of a procedure of the substrate suction determination in the fourth embodiment. The opening 41a is closed and the opening 41d is opened, so that the weight 42 falls and pressurizes the area 131 (step S31).

When the pressure in the area 131 measured by the pressure gauge 45 reaches P11 (YES in step S32), the determiner 73 determines that the suction of the substrate W succeeds (step S33). This is different from the first embodiment (step S2 in FIG. 9) and the second embodiment (step S12 in FIG. 12) in that it is not necessary to wait for an elapse of a predetermined time until determination of successful suction of the substrate W.

On the other hand, when the substrate absence detection sensor 43b detects the upper surface plate 42c (YES in step S34), the determiner 73 determines that the suction of the substrate W fails (step S35). This is different from the third embodiment (step S23 in FIG. 16) in that it is not necessary to wait for an elapse of a predetermined time until determination of suction failure of the substrate W.

When the substrate suction determination is completed, the opening 41a is opened, and negative pressure is generated in the upper space A2 from the opening 41d, so that the weight 42 is brought into a standby state.

In this way, in the fourth embodiment, successful suction of the substrate W is determined by the pressure measurement result of the pressure gauge 45, and suction failure of the substrate W is determined by the substrate absence detection sensor 43b. Therefore, it is possible to quickly obtain a determination result.

Figure 22:
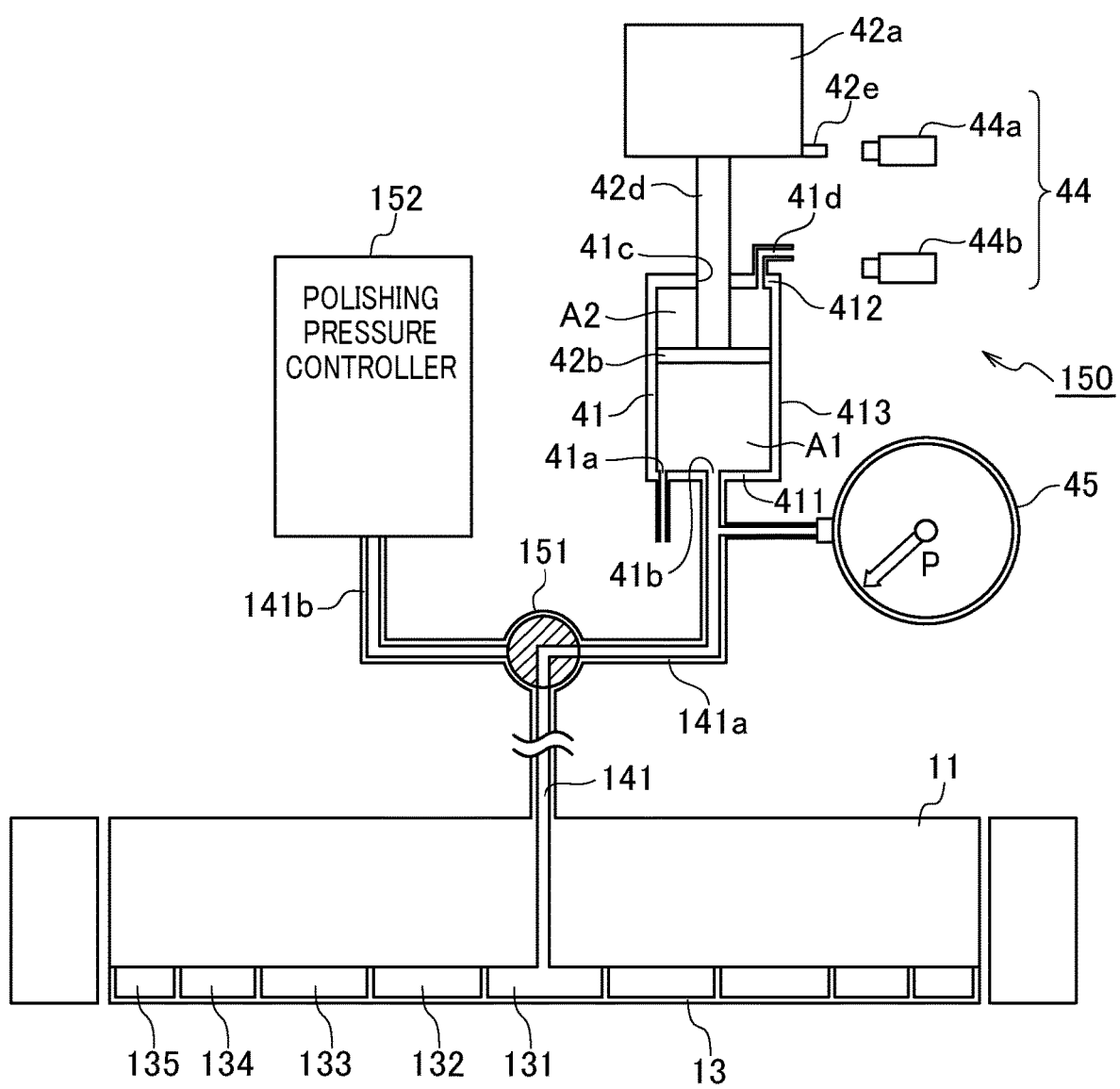
FIG. 22 is a diagram for explaining a modified example of FIG. 17.

FIG. 22 is a diagram for explaining a modified example of FIG. 17. In FIG. 17, the piston 42b and the weight main body 42a are integrated together. However, the piston 42b and the weight main body 42a may be different members as shown in FIG. 22. In this case, the piston 42b provided in the cylinder 41 is coupled with the weight main body 42a provided above the cylinder 41 by a piston rod 42d penetrating the opening 41c of the upper surface 412 of the cylinder 41. A protruded portion 42e is provided to a part (for example, a lower portion) of the weight main body 42a, and the protruded portion 42e is detected by the position sensor 44.

Figure 23A:
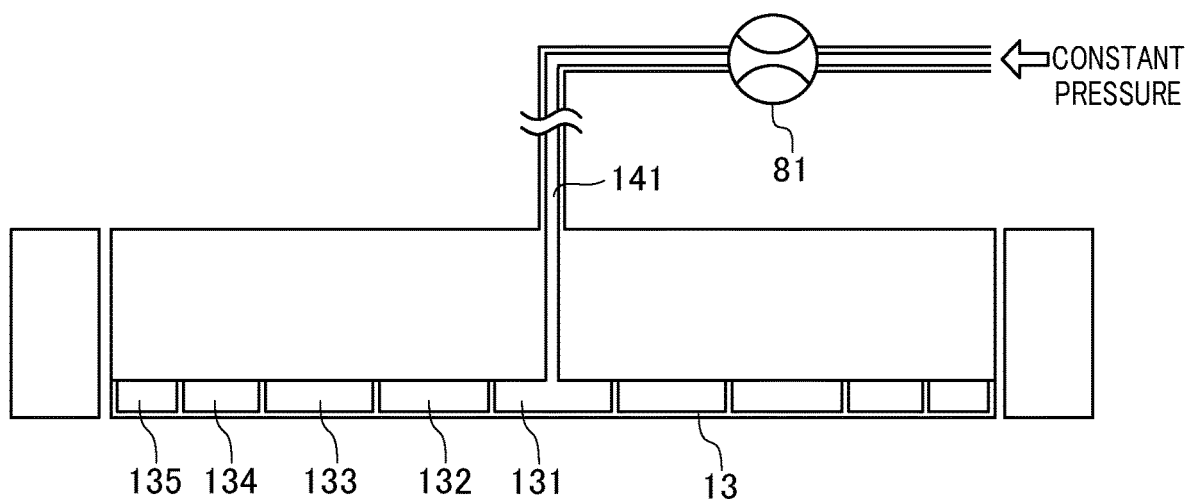
FIG. 23A is a diagram for explaining pressure determination using an integrating flowmeter.

In each embodiment described above, an integrating flowmeter that measures an integrated amount of fluid fed into the area 131 may be used instead of the position sensor and the pressure gauge. Specifically, as shown in FIG. 23A, an integrating flowmeter 81 is provided as the determiner 73 on the flow path 141. Then, fluid is fed into the flow path 141 so that a predetermined pressure is achieved in the area 131.

Figure 23B:
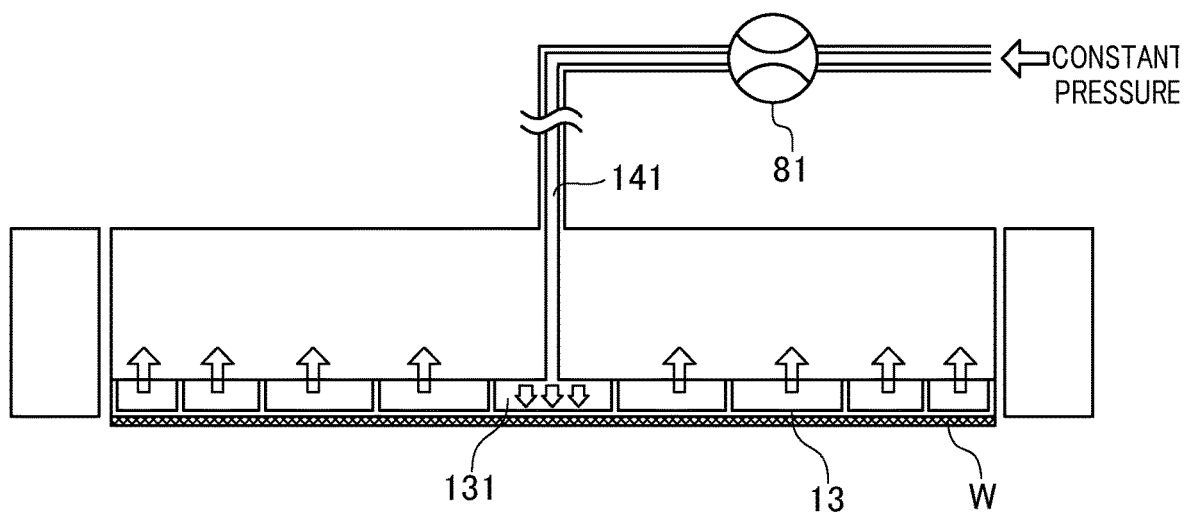
FIG. 23B is a diagram showing a case where substrate suction succeeds.
Figure 23C:
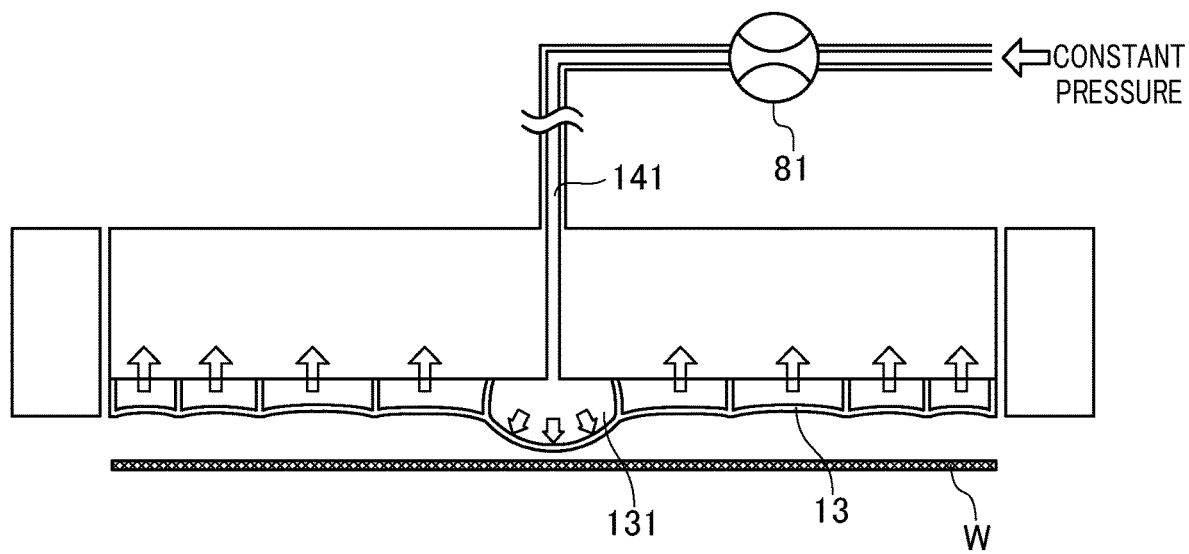
FIG. 23C is a diagram showing a case where substrate suction fails.

When the substrate W is sucked, the membrane 13 does not swell, so that the volume expansion of the area 131 is small (FIG. 23B). Therefore, even when the amount of fluid fed into the area 131 is (relatively) small, a predetermined pressure is achieved in the area 131. On the other hand, when the substrate W is not sucked, the membrane 13 swells, so that the volume expansion of the area 131 is large (FIG. 23C). Therefore, unless a (relatively) large amount of fluid is fed into the area 131, a predetermined pressure is not achieved in the area 131. Therefore, it is possible to determine whether or not the substrate W is sucked from an integrated flow rate of fluid measured by the integrating flowmeter 81.

Although an example has been shown in which the central area 131 is used for the substrate suction determination, another area may be used for the substrate suction determination.

Further, in each embodiment, the substrate suction determination is performed by pressurizing the area 131 and using a phenomenon where the volume expansion of the area 131 is small when the substrate suction succeeds and the volume expansion of the area 131 is large when the substrate suction fails. On the other hand, the substrate suction determination may be performed by sucking and depressurizing the area 131 and using a phenomenon where the volume reduction of the area 131 is small when the substrate suction succeeds and the volume reduction of the area 131 is large when the substrate suction fails. In this case, the top ring 1 may be designed so that the membrane 13 can be deformed inside (toward the top ring main body 11).

The above embodiments are described so that a person with an ordinary skill in the technical field to which the invention pertains can implement the invention. Various modified examples of the above embodiments can be naturally made by those skilled in the art, and the technical idea of the invention can be applied to other embodiments. Therefore, the invention is not limited to the described embodiments and should encompass the widest range in accordance with the technical ideas defined by the claims.

Fifth Embodiment

Chemical mechanical polishing (CMP) is a technique that polishes a surface of a wafer by pressing the wafer against a polishing surface while supplying slurry onto the polishing surface and bringing the wafer in sliding contact with the polishing surface in the presence of the slurry. While the wafer is being polished, the wafer is pressed against the polishing surface by a polishing head. The surface of the wafer is flattened by chemical action of the slurry and mechanical action of abrasive grains contained in the slurry.

Figure 51:
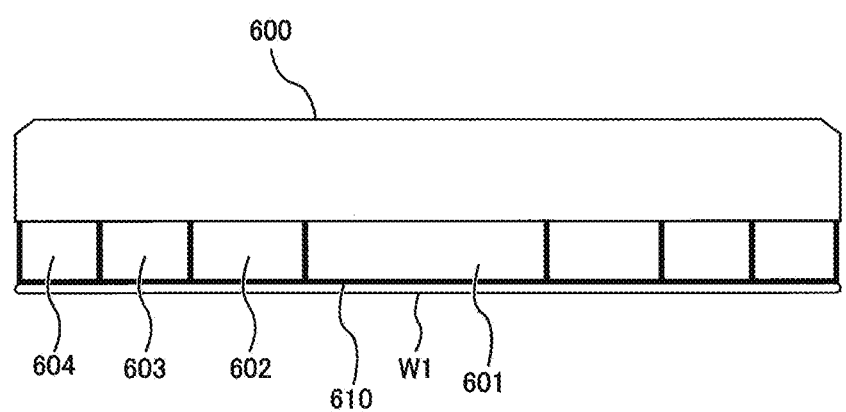
FIG. 51 is a cross-sectional view schematically showing a polishing head.

FIG. 51 is a cross-sectional view schematically showing the polishing head. A polishing head 600 has an elastic film 610 in contact with an upper surface of a wafer W1. The elastic film 610 has a shape that forms a plurality of pressure chambers 601 to 604, and pressure in each pressure chamber 601 to 604 can be independently adjusted. Therefore, the polishing head 600 can press a plurality of regions of the wafer W1 corresponding to the pressure chambers 601 to 604 by different forces and can achieve a desired film thickness profile of the wafer W1.

Figure 52:
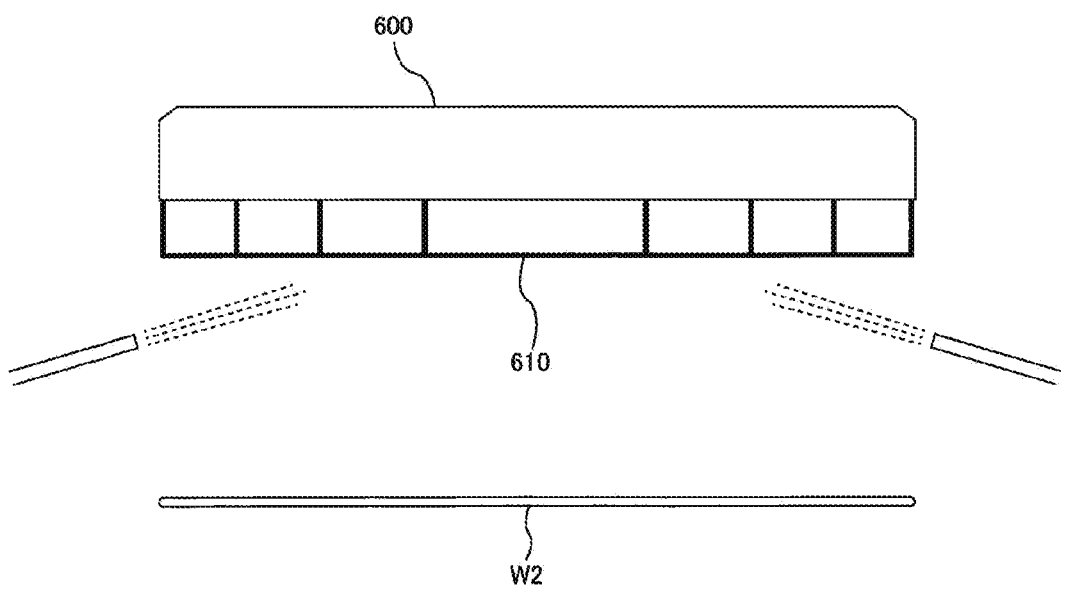
FIG. 52 is a diagram for explaining a state where the polishing head is being cleaned.

When the polishing of the wafer W1 is completed, the polished wafer W1 is transported to the next process by a transport apparatus. As shown in FIG. 52, the next wafer W2 is conveyed to a delivery position below the polishing head 600 by the transport apparatus. At the same time, the polishing head 600 is cleaned by liquid (for example, pure water), so that slurry and polishing waste are removed from the polishing head 600. The next wafer W2 is held by the polishing head 600 and transported to a position above the polishing surface by the polishing head 600. The wafer W2 is pressed against the polishing surface by the polishing head 600 and polished in the presence of the slurry.

Figure 53:
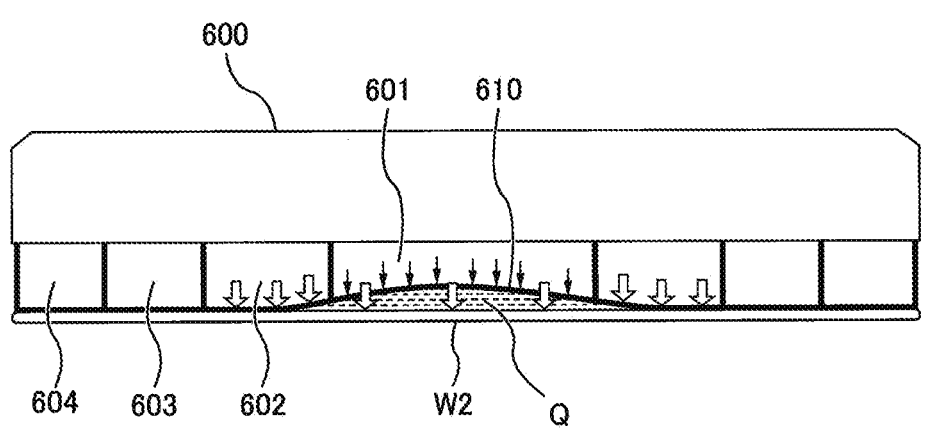
FIG. 53 is a diagram showing a polishing rate reduction failure in a central portion of the wafer due to liquid existing between the upper surface of the wafer and the elastic film of the polishing head.

However, as shown in FIG. 53, there may be liquid Q that has been used to clean the polishing head 600 between the upper surface of the wafer W2 and the elastic film 610 of the polishing head 600. If the liquid Q spreads over a plurality of pressure chambers, pressure in a neighboring pressure chamber is transmitted to the liquid Q and an unintended force is applied to the wafer W2. In the example shown in FIG. 53, in spite of decreasing the pressure in the central pressure chamber 601 in order to decrease a polishing rate of a central portion of the wafer W2, the pressure of the neighboring pressure chamber 602 is applied to the central portion of the wafer W2 through the liquid Q. As a result, it is not possible to decrease the polishing rate of the central portion of the wafer W2. In this way, the liquid Q existing between the wafer W2 and the polishing head 600 prevents the polishing head 600 from applying an appropriate force to the wafer W2.

Therefore, the fifth embodiment provides a method of removing liquid from the upper surface of the wafer to be polished and enabling the polishing head to apply an appropriate force to the wafer. Further, the fifth embodiment provides an elastic film that can remove liquid from the upper surface of the wafer.

According to the fifth embodiment, the following aspects are provided.

According to one embodiment, provided is a method of polishing a wafer by using a polishing head including a center side pressure chamber and an outer side pressure chamber formed of an elastic film, the method including: causing a central portion of the elastic film to come into contact with a central portion of an upper surface of the wafer; and then removing liquid from the upper surface of the wafer by causing an outer circumferential portion of the elastic film to come into contact with an outer circumferential portion of the upper surface of the wafer; and pressing a lower surface of the wafer against a polishing surface by the elastic film to polish the lower surface of the wafer.

According to one embodiment, the central portion of the elastic film may be caused to come into contact with the central portion of the upper surface of the wafer in a state where pressure in the center side pressure chamber is higher than pressure in the outer side pressure chamber.

According to one embodiment, the center side pressure chamber may communicate with an air cylinder and a weight may be placed on a piston of the air cylinder.

According to one embodiment, provided is a method of polishing a wafer by using a polishing head including: a center side pressure chamber and an outer side pressure chamber formed of an elastic film, the method including: causing the elastic film to come into contact with an upper surface of the wafer; and then generating vacuum firstly in the outer side pressure chamber and secondly in the center side pressure chamber to move liquid existing on the upper surface of the wafer to outside; and then pressing a lower surface of the wafer against a polishing surface by the elastic film to remove liquid from the upper surface of the wafer; and causing the polishing head to bring the lower surface of the wafer into sliding contact with the polishing surface to polish the lower surface of the wafer.

According to one embodiment, the method may further include: supplying compressed gas firstly into the center side pressure chamber and secondly into the outer side pressure chamber to press the lower surface of the wafer against the polishing surface by the elastic film and remove liquid from the upper surface of the wafer.

According to one embodiment, the outer side pressure chamber and the center side pressure chamber may include at least a first pressure chamber, a second pressure chamber, and a third pressure chamber, the second pressure chamber being located outside the first pressure chamber, and the third pressure chamber being located outside the second pressure chamber, and the liquid existing on the upper surface of the wafer may be moved to outside by generating vacuum firstly in the third pressure chamber, secondly in the second pressure chamber, and thirdly in the first pressure chamber According to one embodiment, provided is a method of polishing a wafer by using a polishing head, the method including: removing liquid from an upper surface of the wafer on a transport apparatus; and then holding the wafer on the transport apparatus by the polishing head; and pressing a lower surface of the wafer against a polishing surface by the polishing head to polish the lower surface of the wafer.

According to one embodiment, removing liquid from the upper surface of the wafer on the transport apparatus may be removing liquid from the upper surface of the wafer by tilting the wafer by the transport apparatus.

According to one embodiment, removing liquid from the upper surface of the wafer on the transport apparatus may be removing liquid from the upper surface of the wafer by swinging the wafer by the transport apparatus.

According to one embodiment, removing liquid from the upper surface of the wafer on the transport apparatus may be removing liquid from the upper surface of the wafer by sending a jet of gas to the upper surface of the wafer on the transport apparatus.

According to one embodiment, provided is a method of polishing a wafer by using a polishing head having an elastic film, the method including: causing the elastic film to come into contact with an upper surface of the wafer; removing liquid from the upper surface of the wafer by causing liquid existing on the upper surface of the wafer to flow into a liquid flow path formed in the elastic film; and then pressing a lower surface of the wafer against a polishing surface by the elastic film to polish the lower surface of the wafer.

According to one embodiment, the elastic film may have a contact surface that comes into contact with the upper surface of the wafer, and the liquid flow path may include: an opening that opens at the contact surface; and a horizontal hole connected to the opening and extending in the elastic film; and the horizontal hole opens at an outside surface of the elastic film.

According to one embodiment, causing liquid existing on the upper surface of the wafer to flow into the liquid flow path may be sucking liquid existing on the upper surface of the wafer through the liquid flow path, and the liquid flow path may communicate with a suction line connected to the elastic film.

According to one embodiment, the elastic film may include a contact surface that comes into contact with the upper surface of the wafer, and the liquid flow path is a groove formed in the contact surface.

According to one embodiment, a width of the groove inside the elastic film is greater than a width of the groove on the contact surface.

According to one embodiment, provided is an elastic film for pressing a wafer against a polishing surface, the elastic film including: a contact portion including a contact surface capable of coming into contact with the wafer; and an outer wall portion that is connected to the contact portion, wherein the contact portion includes: an opening that opens at the contact surface; and a horizontal hole that is connected to the opening and extends in the contact portion.

According to one embodiment, the horizontal hole may open at an outside surface of the elastic film.

According to one embodiment, the horizontal hole may open at a surface opposite to the contact surface of the contact portion.

According to one embodiment, provided is an elastic film for pressing a wafer against a polishing surface, the elastic film including: a contact portion including a contact surface capable of coming into contact with the wafer; and an outer wall portion that is connected to the contact portion, wherein the contact portion has a groove formed in the contact surface.

According to one embodiment, a width of the groove inside the contact portion may be greater than a width of the groove on the contact surface.

Hereinafter, the fifth embodiment will be described with reference to the drawings.

Figure 24:
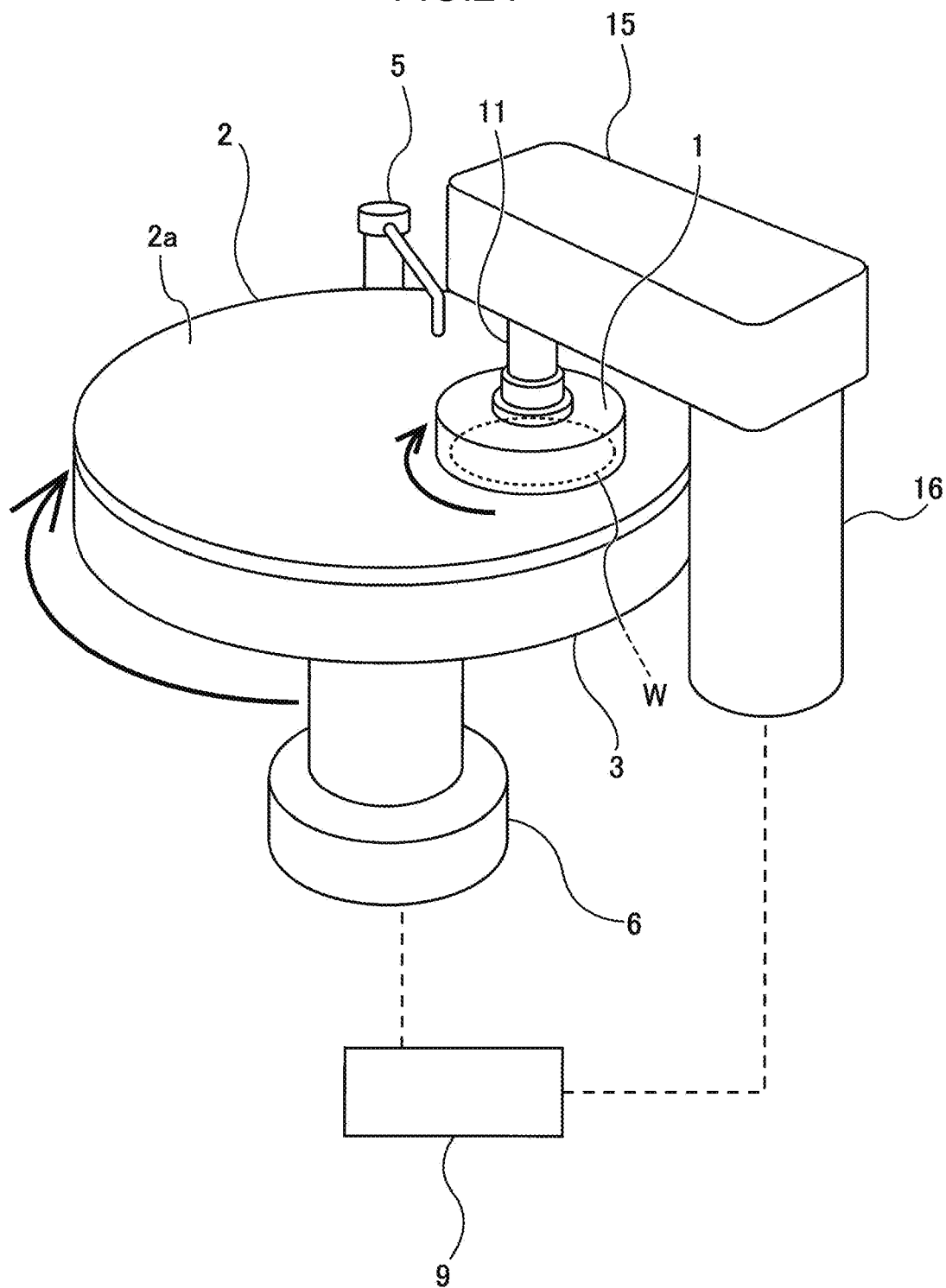
FIG. 24 is a schematic diagram showing an embodiment of a polishing apparatus.

FIG. 24 is a schematic diagram showing an embodiment of a polishing apparatus. As shown in FIG. 24, the polishing apparatus includes a polishing table 3 that supports a polishing pad 2, a polishing head 1 that presses a wafer W, which is an example of a substrate, against the polishing pad 2, a table motor 6 that rotates the polishing table 3, and a slurry supply nozzle 5 for supplying slurry onto the polishing pad 2. The surface of the polishing pad 2 forms a polishing surface 2a that polishes the wafer W.

The polishing table 3 is coupled to the table motor 6, and the table motor 6 integrally rotates the polishing table 3 and the polishing pad 2 together. The polishing head 1 is fixed to an end portion of a polishing head shaft 11, and the polishing head shaft 11 is rotatably supported by a head arm 15. The head arm 15 is rotatably supported by a support shaft 16.

The wafer W is polished in a manner as described below. While the polishing table 3 and the polishing head 1 are being rotated in directions indicated by arrows in FIG. 24, slurry is supplied from the slurry supply nozzle 5 to the polishing surface 2a of the polishing pad 2 on the polishing table 3. While the wafer W is being rotated by the polishing head 1, the wafer W is pressed against the polishing surface 2a of the polishing pad 2 by the polishing head 1 in a state where the slurry exists between the polishing pad 2 and the wafer W. The surface of the wafer W is polished by chemical action of the slurry and mechanical action of abrasive grains contained in the slurry.

The polishing apparatus further includes an operation controller 9 that controls operations of the polishing head 1, the polishing table 3, and the slurry supply nozzle 5. The operation controller 9 includes at least one computer.

Figure 25:
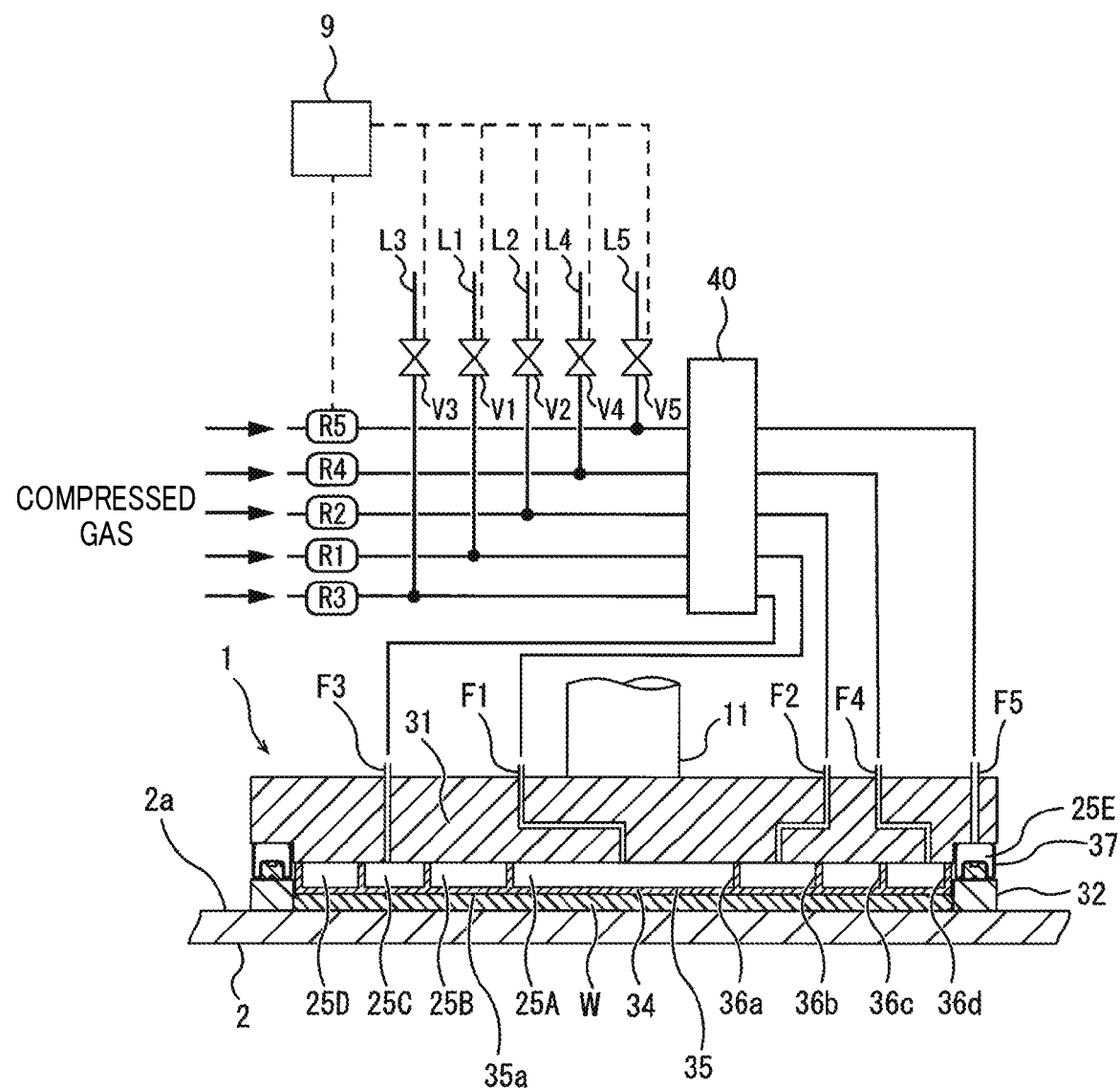
FIG. 25 is a cross-sectional view showing a polishing head.

Next, the polishing head 1 will be described. FIG. 25 is a cross-sectional view showing the polishing head 1. The polishing head 1 includes a carrier 31 fixed to an end portion of the polishing head shaft 11, an elastic film 34 attached to a lower portion of the carrier 31, and a retainer ring 32 arranged below the carrier 31. The retainer ring 32 is arranged around the elastic film 34. The retainer ring 32 is an annular structure that holds the wafer W so that the wafer W does not jump out from the polishing head 1 while the wafer W is being polished.

The elastic film 34 includes a contact portion 35 having a contact surface 35a that can come into contact with an upper surface of the wafer W, and inner wall portions 36a, 36b, and 36c and an outer wall portion 36d, which are connected to the contact portion 35. The contact portion 35 has substantially the same size and shape as those of the upper surface of the wafer W. The inner wall portions 36a, 36b, and 36c and the outer wall portion 36d are endless walls arranged concentrically. The outer wall portion 36d is located outside the inner wall portions 36a, 36b, and 36c and is arranged so as to surround the inner wall portions 36a, 36b, and 36c. In the present embodiment, three inner wall portions 36a, 36b, and 36c are provided. However, the present invention is not limited to the present embodiment. In an embodiment, one or two inner wall portions may be provided, or four or more inner wall portions may be provided.

Four pressure chambers 25A, 25B, 25C, and 25D are provided between the elastic film 34 and the carrier 31. The pressure chambers 25A, 25B, 25C, and 25D are formed by the contact portion 35, the inner wall portions 36a, 36b, and 36c, and the outer wall portion 36d of the elastic film 34. Specifically, the pressure chamber 25A is located inside the inner wall portion 36a, the pressure chamber 25B is located between the inner wall portion 36a and the inner wall portion 36b, the pressure chamber 25C is located between the inner wall portion 36b and the inner wall portion 36c, and the pressure chamber 25D is located between the inner wall portion 36c and the outer wall portion 36d. The central pressure chamber 25A has a circular shape, and the other pressure chambers 25B, 25C, and the 25D have annular shapes. The pressure chambers 25A, 25B, 25C, and 25D are arranged concentrically. The pressure chamber 25B is located outside the pressure chamber 25A, the pressure chamber 25C is located outside the pressure chamber 25B, and the pressure chamber 25D is located outside the pressure chamber 25C.

Gas transfer lines F1, F2, F3, and F4 are connected to the pressure chambers 25A, 25B, 25C, and 25D, respectively. One ends of the gas transfer lines F1, F2, F3, and F4 are connected to a compressed gas supply source (not shown in the drawings) used as a utility supply source provided in a factory where the polishing apparatus is installed. Compressed gas such as compressed air is supplied to the pressure chambers 25A, 25B, 25C, and 25D through the gas transfer lines F1, F2, F3, and F4, respectively.

An annular membrane (rolling diaphragm) 37 is arranged between the carrier 31 and the retainer ring 32, and a pressure chamber 25E is formed inside the membrane 37. The pressure chamber 25E is coupled to the compressed gas supply source through a gas transfer line F5. Compressed gas is supplied into the pressure chamber 25E through the gas transfer line F5, and the pressure chamber 25E presses the retainer ring 32 against the polishing surface 2a of the polishing pad 2.

The gas transfer lines F1, F2, F3, F4, and F5 extend through a rotary joint 40 attached to the polishing head shaft 11. The gas transfer lines F1, F2, F3, F4, and F5 communicating with the pressure chambers 25A, 25B, 25C, 25D, and 25E are provided with pressure regulators R1, R2, R3, R4, and R5, respectively. The compressed gas from the compressed gas supply source is independently supplied to the pressure chambers 25A to 25E, respectively, through the pressure regulators R1 to R5. The pressure regulators R1 to R5 are configured so as to adjust pressure of the compressed gas in the pressure chambers 25A to 25E.

The pressure regulators R1 to R5 can change inside pressures of the pressure chambers 25A to 25E independently from each other. Thereby, it is possible to independently adjust polishing pressures against four regions of the wafer W, which are a central portion, an inner intermediate portion, an outer intermediate portion, and an edge portion, and a pressing force of the retainer ring 32 to the polishing pad 2. The gas transfer lines F1, F2, F3, F4, and F5 are respectively connected to atmosphere open valves (not shown in the drawings), so that it is possible to open the pressure chambers 25A to 25E to the atmosphere. In the present embodiment, the elastic film 34 forms the four pressure chambers 25A to 25D. However, in an embodiment, the elastic film 34 may form less than four pressure chambers or more than four pressure chambers.

The pressure regulators R1 to R5 are connected to the operation controller 9. The operation controller 9 transmits respective target pressure values of the pressure chambers 25A to 25E to the pressure regulators R1 to R5, and the pressure regulators R1 to R5 operate so that the pressures in the pressure chambers 25A to 25E are maintained at the corresponding target pressure values.

The polishing head 1 can apply independent polishing pressures to a plurality of regions, respectively, in the wafer W. For example, the polishing head 1 can press a different region of the surface of the wafer W against the polishing surface 2a of the polishing pad 2 at a different polishing pressure. Therefore, the polishing head 1 can achieve a target film thickness profile by controlling a film thickness profile of the wafer W.

Vacuum lines L1, L2, L3, L4, and L5 are connected to the gas transfer lines F1, F2, F3, F4, and F5, respectively. Vacuum valves V1, V2, V3, V4, and V5 are attached to the vacuum lines L1, L2, L3, L4, and L5, respectively. The vacuum valves V1, V2, V3, V4, and V5 are actuator drive type valves such as electromagnetic valves, electric operated valves, or air operated valves. The vacuum valves V1 to V5 are connected to the operation controller 9, and operations of the vacuum valves V1 to V5 are controlled by the operation controller 9. When the vacuum lines L1, L2, L3, L4, and L5 are opened, vacuums are formed in the corresponding pressure chambers 25A, 25B, 25C, 25D, and 25E.

When the polishing head 1 holds the wafer W, in a state where the contact portion 35 of the elastic film 34 is in contact with the wafer W, the vacuum valves V2, V3, and V4 are opened, and vacuums are formed in the pressure chambers 25B, 25C, and 25D. Regions of the contact portion 35 that form the pressure chambers 25B, 25C, and 25D are recessed upward, so that the polishing head 1 can suck the wafer W by a sucker effect of the elastic film 34. When supplying compressed gas to the pressure chambers 25B, 25C, and 25D and releasing the sucker effect, the polishing head 1 can release the wafer W.

Figure 26:
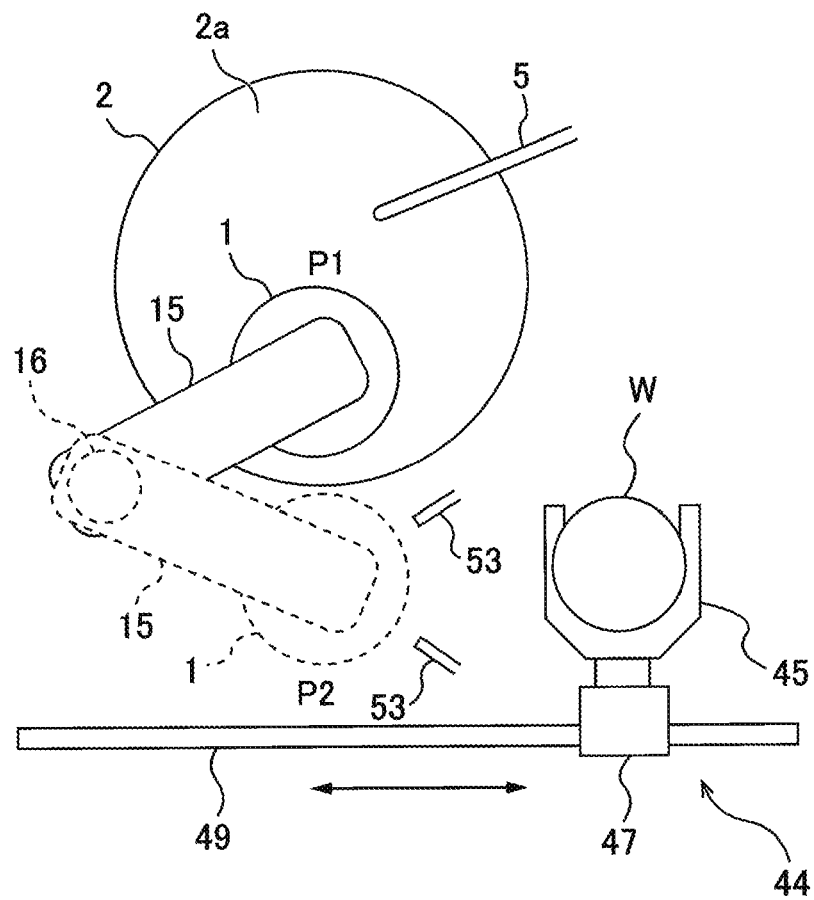
FIG. 26 is a top view of a transport apparatus that transports a wafer to the polishing head shown in FIG. 24.

FIG. 26 is a top view of a transport apparatus that transports a wafer to the polishing head 1 shown in FIG. 24. As shown in FIG. 26, the wafer W is transported to the polishing head 1 by a transport apparatus 44. The polishing head 1 can move between a polishing position P1 indicated by solid lines and a transfer position P2 indicated by dashed lines in FIG. 26. More specifically, when the head arm 15 rotates around the support shaft 16, the polishing head 1 can move between the polishing position P1 and the transfer position P2. The polishing position P1 is located above the polishing surface 2a of the polishing pad 2, and the transfer position P2 is located outside the polishing surface 2a.

The transport apparatus 44 includes a transport stage 45 where the wafer W is mounted, a lifting apparatus 47 that moves up and down the transport stage 45, and a horizontal movement apparatus 49 that integrally moves the transport stage 45 and the lifting apparatus 47 in the horizontal direction. The wafer W to be polished is mounted on the transport stage 45 and moved to the transfer position P2 along with the transport stage 45 by the horizontal movement apparatus 49. When the polishing head 1 is located in the transfer position P2, the lifting apparatus 47 lifts the transport stage 45. The polishing head 1 holds the wafer W on the transport stage 45 and moves to the polishing position P1 along with the wafer W.

The slurry supply nozzle 5 supplies slurry to the polishing surface 2a of the rotating polishing pad 2. On the other hand, the polishing head 1 presses the wafer W against the polishing surface 2a of the polishing pad 2 while rotating the wafer W and brings the wafer W in sliding contact with the polishing surface 2a. The lower surface of the wafer W is polished by the chemical action of the slurry and the mechanical action of abrasive grains contained in the slurry.

After polishing the wafer W, the polishing head 1 moves to the transfer position P2 along with the wafer W. Then, the polishing head 1 transfers the polished wafer W to the transport stage 45. The transport stage 45 moves the wafer W to the next process. In the transfer position P2, a cleaning nozzle 53 that supplies liquid (for example, rinse liquid such as pure water) to the polishing head 1 and cleans the polishing head 1 is arranged. The cleaning nozzle 53 faces the polishing head 1. The polishing head 1 that has released the wafer W is cleaned by the liquid supplied from the cleaning nozzle 53.

While the polishing head 1 is being cleaned, a wafer to be polished next is moved to the transfer position P2 below the polishing head 1 by the transport stage 45. When the cleaning of the polishing head 1 is completed, the lifting apparatus 47 moves up the transport stage 45 where the next wafer is mounted. Then, the cleaned polishing head 1 holds the next wafer and moves to the polishing position P1. In this way, a plurality of wafers are continuously polished.

However, while the polishing head 1 is being cleaned, the wafer to be polished next is moved to the transfer position P2 below the polishing head 1, so that liquid falls on the upper surface of the wafer. The liquid existing on the upper surface of the wafer prevents the polishing head 1 from applying an appropriate force to the wafer as described with reference to FIG. 53. One solution is to move the next wafer to the transfer position P2 after completing the cleaning of the polishing head 1. However, such an operation decreases throughput of the polishing apparatus.

Figure 27:
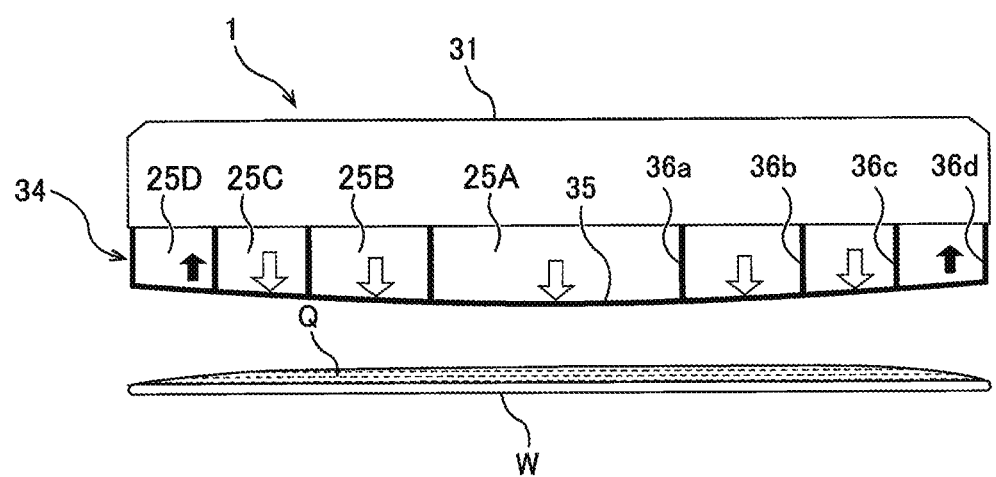
FIG. 27 is a schematic diagram showing the polishing head when liquid is removed from an upper surface of the wafer.

Therefore, in the present embodiment, the liquid is removed from the upper surface of the wafer in a manner as described below. FIG. 27 is a schematic diagram showing the polishing head 1 when the liquid is removed from the upper surface of the wafer. In FIG. 27, the detailed configuration of the polishing head 1 is omitted. Before holding the wafer W to be polished, the pressures in the pressure chambers 25A, 25B, and 25C located close to the center of the polishing head 1 are made higher than the pressure in the outer pressure chamber 25D. More specifically, the operation controller 9 issues an instruction to the pressure regulators R1, R2, and R3 (see FIG. 25) and supplies compressed gas into the pressure chambers 25A, 25B, and 25C, and on the other hand, the operation controller 9 opens a vacuum valve V4 and generates vacuum in the pressure chamber 25D.

In an embodiment, the operation controller 9 may open the pressure chambers 25A, 25B, and 25C to the atmosphere by opening atmosphere open valves (not shown in the drawings) connected to the gas transfer lines F1, F2, and F3, and on the other hand, the operation controller 9 may open the vacuum valve V4 and generate vacuum in the pressure chamber 25D. Further, in an embodiment, the operation controller 9 may issue an instruction to the pressure regulators R1, R2, and R3 (see FIG. 25) and supply compressed gas into the pressure chambers 25A, 25B, and 25C, and on the other hand, the operation controller 9 may open the pressure chamber 25D to the atmosphere by opening an atmosphere open valve (not shown in the drawings) connected to the gas transfer line F4.

Figure 28:
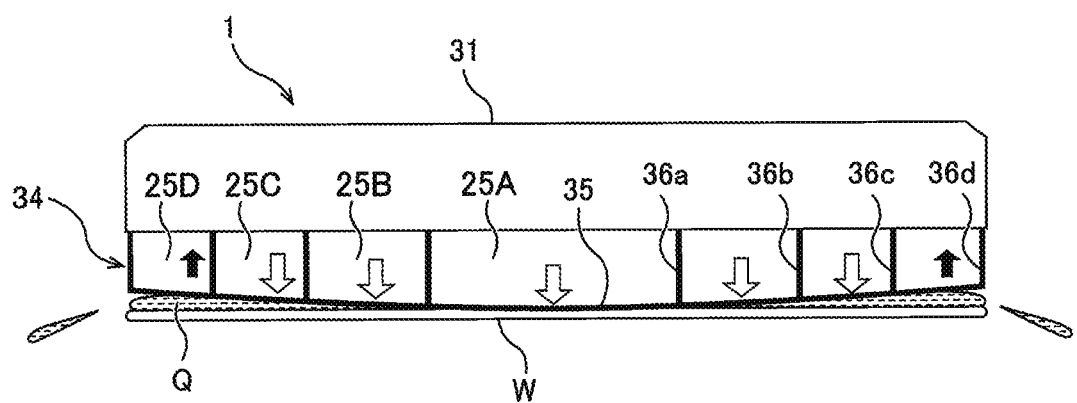
FIG. 28 is a schematic diagram showing a state where an elastic film of the polishing head pushes out the liquid existing on the upper surface of the wafer to the outside.

Differences between the pressures in the pressure chambers 25A, 25B, and 25C and the pressure in the pressure chamber 25D swell a central portion of the contact portion 35 of the elastic film 34 and cause the central portion of the contact portion 35 to protrude toward the wafer W. In a state where the central portion of the contact portion 35 protrudes, the polishing head 1 lowers toward the wafer W and causes the elastic film 34 to come into contact with the upper surface of the wafer W. As shown in FIG. 28, the central portion of the elastic film 34, that is, the central portion of the contact portion 35, first comes into contact with a central portion of the upper surface of the wafer W. The elastic film 34 pushes out the liquid Q existing on the upper surface of the wafer W to the outside.

Figure 29:
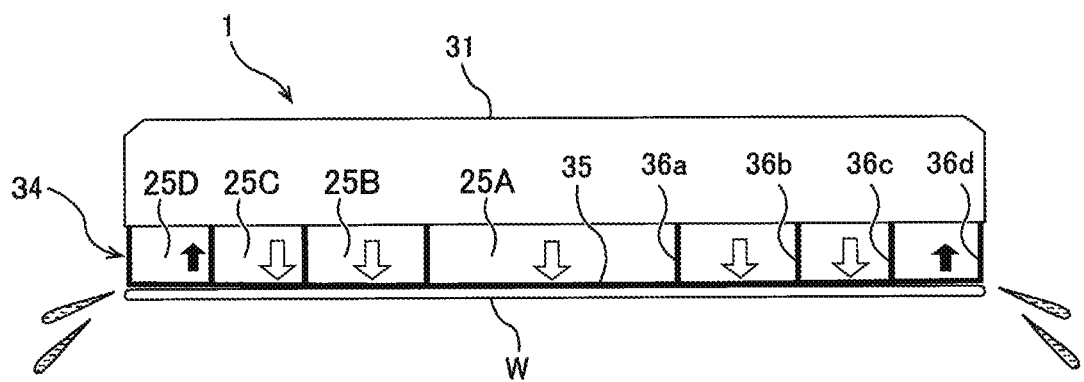
FIG. 29 is a schematic diagram showing a state where the elastic film of the polishing head further pushes out the liquid existing on the upper surface of the wafer to the outside.

Further, the polishing head 1 is lowered, and a large part of the contact portion 35 is brought into contact with the upper surface of the wafer W. More specifically, as shown in FIG. 29, in a state where the central portion of the elastic film 34 is in contact with the central portion of the upper surface of the wafer W, an outer circumferential portion of the elastic film 34, that is, an outer circumferential portion of the contact portion 35, is brought into contact with an outer circumferential portion of the upper surface of the wafer W. The elastic film 34 further pushes out the liquid Q existing on the upper surface of the wafer W to the outside and removes the liquid Q from the upper surface of the wafer W. Thereafter, the elastic film 34 of the polishing head 1 brings the lower surface of the wafer W into sliding contact with the polishing surface 2a in the presence of the slurry on the polishing surface 2a and polishes the lower surface of the wafer W by the chemical action of the slurry and the mechanical action of abrasive grains contained in the slurry.

In this way, the liquid Q existing on the upper surface of the wafer W is moved to the outside of the wafer W by the elastic film 34 having the protruded central portion and removed from the upper surface of the wafer W. Therefore, the polishing head 1 can hold the wafer W in a state where there is substantially no liquid Q between the elastic film 34 and the upper surface of the wafer W. As a result, the elastic film 34 that forms the pressure chambers 25A, 25B, 25C, and 25D can apply an intended force to the wafer W, and the polishing head 1 can achieve a desired film thickness profile of the wafer W.

The elastic film 34 is flexible, so that even if the pressures in the pressure chambers 25A, 25B, and 25C are low, the elastic film 34 easily swells. When the swell of the elastic film 34 is too large, there is a risk that an excessive load is applied to the wafer W when the elastic film 34 presses the wafer W. It is possible to maintain low pressures (for example, 25 hPa or less) in the pressure chambers 25A, 25B, and 25C by the pressure regulators R1, R2, and R3. However, it takes a long time to lower the pressures to targeted low pressures, and the pressures in the pressure chambers 25A, 25B, and 25C may not be stabilized.

Figure 30:
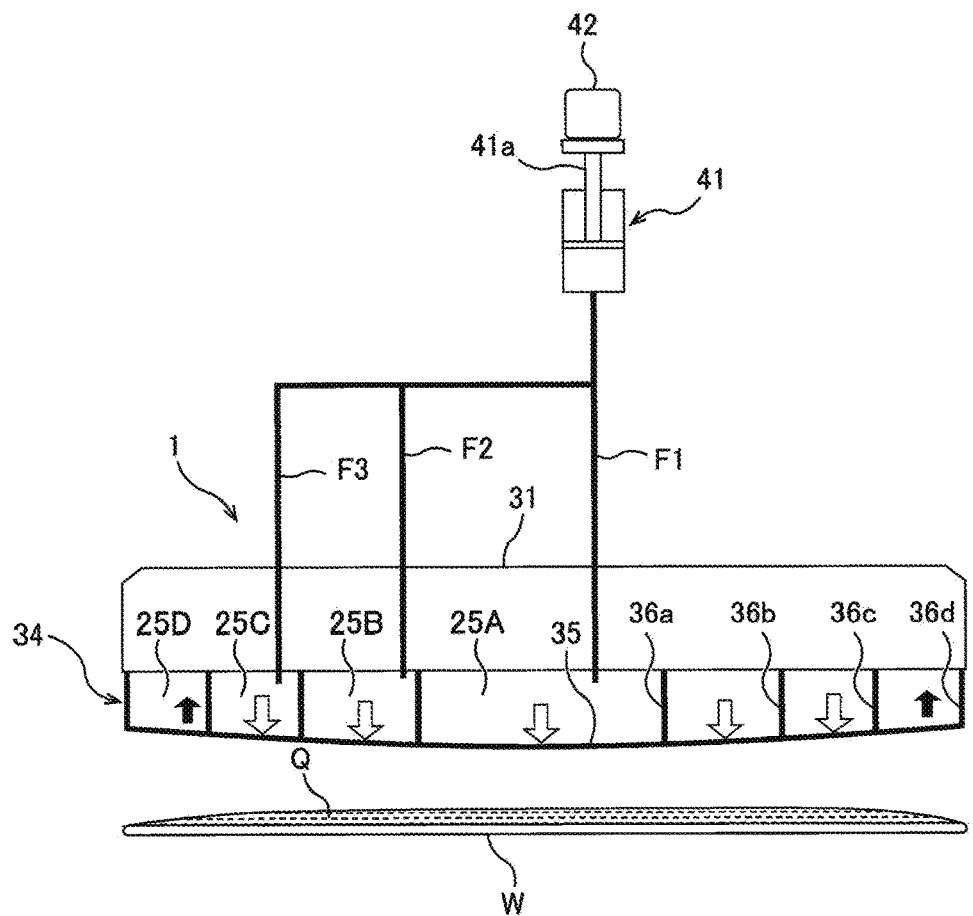
FIG. 30 is a diagram for explaining an embodiment that swells a central portion of the elastic film by using a combination of an air cylinder and a weight instead of a pressure regulator.

Therefore, in an embodiment, as shown in FIG. 30, compressed gas is fed into the pressure chambers 25A, 25B, and 25C by using a combination of an air cylinder 41 and a weight 42 instead of the pressure regulators R1, R2, and R3. The pressure chambers 25A, 25B, and 25C communicate with the common air cylinder 41 through the gas transfer lines F1, F2, and F3. The air cylinder 41 is arranged in a vertical attitude. Before the polishing head 1 holds the wafer W, the weight 42 is placed on a piston 41A of the air cylinder 41 and presses the piston 41A downward. Gas in the air cylinder 41 is fed into the pressure chambers 25A, 25B, and 25C, so that the central portion of the elastic film 34 swells. In the same manner as the embodiment shown in FIG. 27, vacuum is formed in the pressure chamber 25D. In an embodiment, the operation controller 9 may open the pressure chamber 25D to the atmosphere by opening an atmosphere open valve (not shown in the drawings) connected to the gas transfer line F4.

The swell of the elastic film 34 is adjusted by a diameter of the air cylinder 41 and a stroke distance of the piston 41A. When the weight 42 is too light, the elastic film 34 does not swell and the piston 41A stops halfway, so that the weight 42 by which the piston 41A is lowered at an appropriate speed is used. According to the present embodiment, the combination of the air cylinder 41 and the weight 42 can stably maintain the low pressures in the pressure chambers 25A, 25B, and 25C. As a result, it is possible to appropriately control the swell of the elastic film 34.

Figure 31:
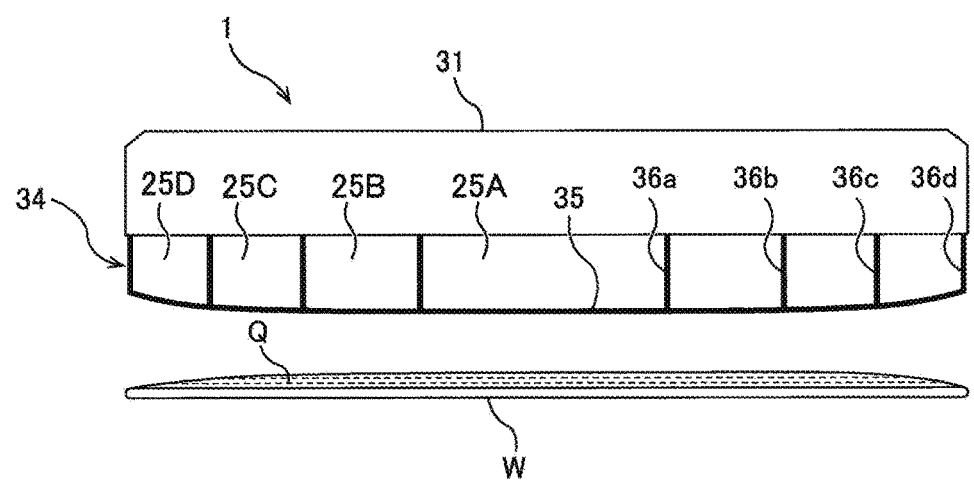
FIG. 31 is a schematic diagram showing another embodiment of the elastic film.

FIG. 31 is a schematic diagram showing another embodiment of the elastic film 34. In the present embodiment, the vertical lengths of the inner wall portions 36a, 36b, and 36c are longer than the vertical length of the outer wall portion 36d, and the lower ends of the inner wall portions 36a, 36b, and 36c are located at positions lower than the lower end of the outer wall portion 36d. Differences of the vertical lengths of the inner wall portions 36a, 36b, and 36c and the outer wall portion 36d cause the central portion of the contact portion 35 of the elastic film 34 to protrude toward the wafer W.

Figure 32:
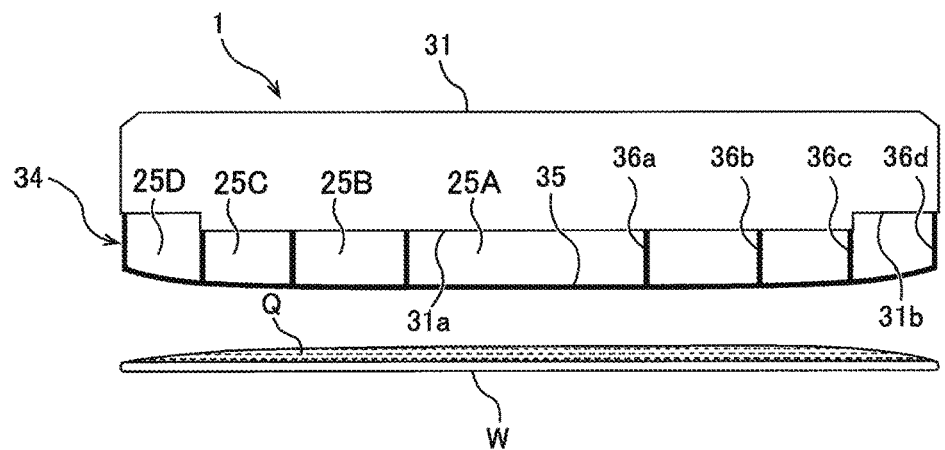
FIG. 32 is a schematic diagram showing yet another embodiment of the elastic film.

FIG. 32 is a schematic diagram showing yet another embodiment of the elastic film 34. In the present embodiment, a lower portion of the carrier 31 has a first surface 31a to which the inner wall portions 36a, 36b, and 36c are fixed and a second surface 31b to which the outer wall portion 36d is fixed. The first surface 31a is located in a position lower than the second surface 31b. The lower ends of the inner wall portions 36a, 36b, and 36c are located at positions lower than the lower end of the outer wall portion 36d. A difference between the height of the first surface 31a and the height of the second surface 31b of the carrier 31 causes the central portion of the contact portion 35 of the elastic film 34 to protrude toward the wafer W.

In the same manner as the embodiments shown in FIGS. 27 to 29, the elastic films 34 shown in FIGS. 31 and 32 can push out the liquid Q existing on the upper surface of the wafer W to the outside and remove the liquid Q from the upper surface of the wafer W when coming into contact with the upper surface of the wafer W. In the embodiments shown in FIGS. 31 and 32, it is not necessary to make differences between the pressures in the pressure chambers 25A, 25B, and 25C and the pressure in the pressure chamber 25D. Specifically, the pressure regulators R1, R2, R3, and R4 may maintain the pressures of the compressed gases in the pressure chambers 25A, 25B, 25C, and 25D at the same level.

Next, another embodiment of the method of removing the liquid from the upper surface of the wafer W will be described with reference to FIGS. 33 to 36. Details of the present embodiment that will not be described in particular are the same as those of the embodiments described above, so that redundant description thereof will be omitted.

Figure 33:
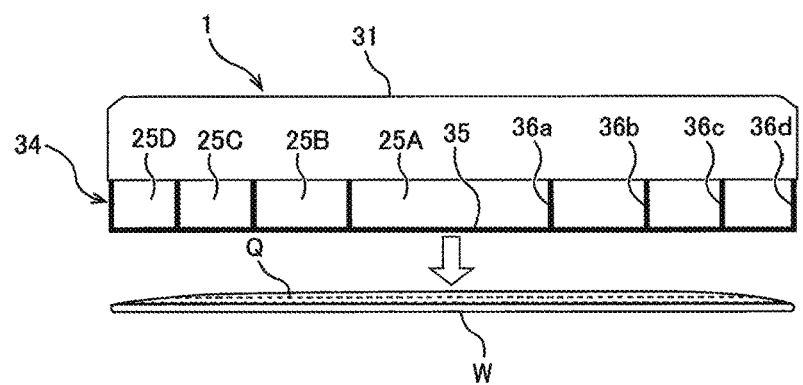
FIG. 33 is a diagram for explaining another embodiment of a method of removing liquid from the upper surface of the wafer.
Figure 34:
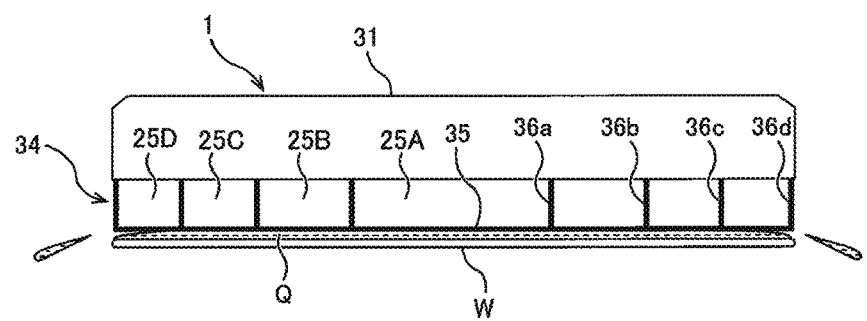
FIG. 34 is a diagram for further explaining the embodiment shown in FIG. 33.

As shown in FIG. 33, the polishing head 1 is lowered toward the upper surface of the wafer W. The liquid Q exists on the upper surface of the wafer W. As shown in FIG. 34, the contact portion 35 of the elastic film 34 is brought into contact with the liquid Q on the upper surface of the wafer W, and further the contact portion 35 of the elastic film 34 is pressed against the upper surface of the wafer W. At this time, some of the liquid Q spills from the upper surface of the wafer W.

Figure 35:
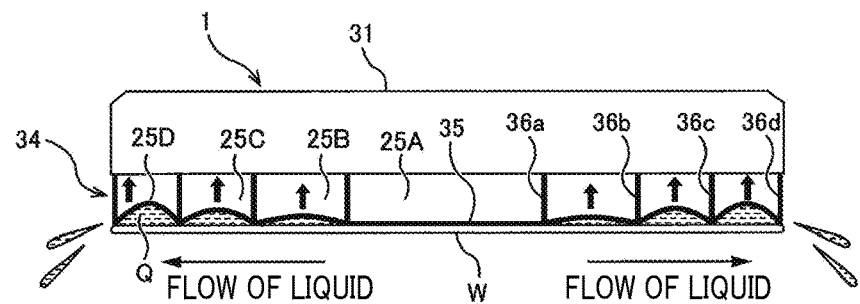
FIG. 35 is a diagram for further explaining the embodiment shown in FIG. 33.

As shown in FIG. 35, vacuums are sequentially formed in the pressure chambers 25D, 25C, and 25B in order from the pressure chamber 25D located outside to the pressure chamber 25B located on the center side (that is, in order of the pressure chambers 25D, 25C, and 25B). The regions of the contact portion 35 that form the pressure chambers 25D, 25C, and 25B are recessed upward by vacuum, and spaces are formed between the elastic film 34 and the upper surface of the wafer W. The liquid Q on the upper surface of the wafer W sequentially flows into the spaces, and a flow of the liquid Q toward the outside of the wafer W is formed.

Figure 36:
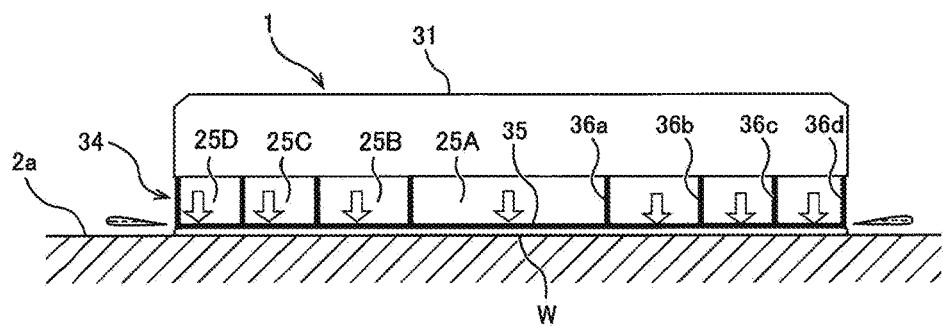
FIG. 36 is a diagram for further explaining the embodiment shown in FIG. 33.

Thereafter, the polishing head 1 carries the wafer W to a position above the polishing pad 2, and as shown in FIG. 36, the elastic film 34 presses the lower surface of the wafer W against the polishing surface 2a of the polishing pad 2. At this time, the operation controller 9 issues an instruction to the pressure regulators R2, R3, and R4 and supplies compressed gas into the pressure chambers 25B, 25C, and 25D in order from the pressure chamber 25B located on the center side to the pressure chamber 25D located outside (that is, in order of the pressure chambers 25B, 25C, and 25D). The liquid Q held in the spaces between the elastic film 34 and the upper surface of the wafer W is pressed by the contact portion 35 of the elastic film 34, moved to the outside of the wafer W, and removed from the upper surface of the wafer W.

Thereafter, the elastic film 34 of the polishing head 1 brings the lower surface of the wafer W into sliding contact with the polishing surface 2a in the presence of the slurry on the polishing surface 2a and polishes the lower surface of the wafer W by the chemical action of the slurry and the mechanical action of abrasive grains contained in the slurry.

Figure 37:
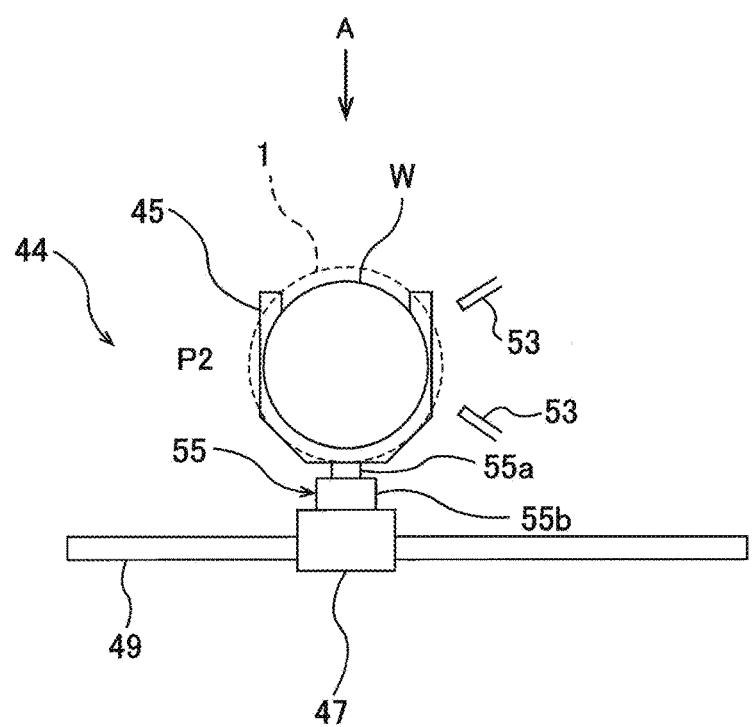
FIG. 37 is a diagram for explaining yet another embodiment of the method of removing liquid from the upper surface of the wafer.
Figure 38:
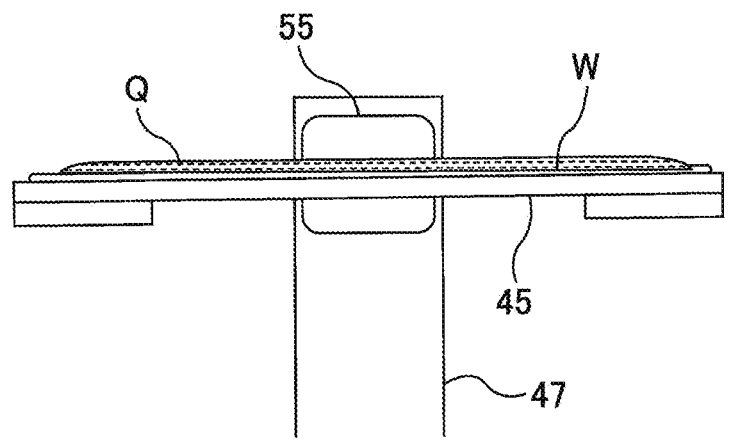
FIG. 38 is a diagram for further explaining the embodiment shown in FIG. 37.
Figure 39:
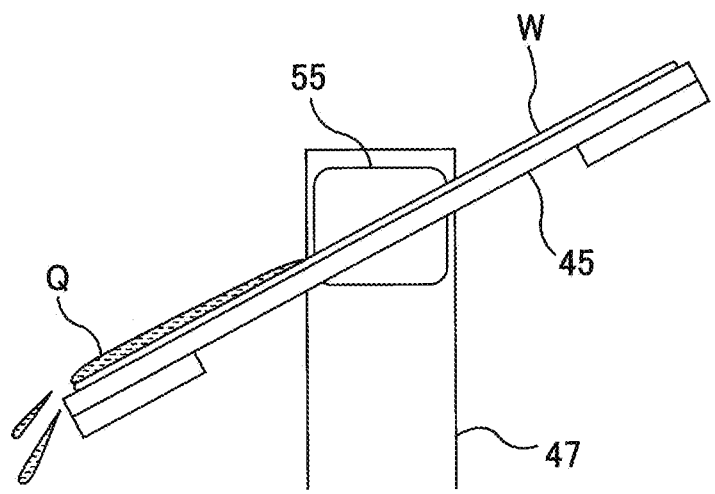
FIG. 39 is a diagram for further explaining the embodiment shown in FIG. 37.

Next, another embodiment of the method of removing the liquid from the upper surface of the wafer W will be described with reference to FIGS. 37 to 39. Details of the present embodiment that will not be described in particular are the same as those of the embodiments described above, so that redundant description thereof will be omitted. FIG. 37 is a schematic diagram showing a modified example of the transport apparatus 44 shown in FIG. 26. Details of the present embodiment that will not be described in particular are the same as those of the embodiment shown in FIG. 26, so that redundant description thereof will be omitted.

As shown in FIG. 37, the transport apparatus 44 includes a tilting apparatus 55 that tilts the transport stage 45. The tilting apparatus 55 is held by the lifting apparatus 47 and is moved up and down integrally with the transport stage 45. The tilting apparatus 55 has a support shaft 55a that horizontally extends and a rotation apparatus 55b that rotates the support shaft 55a. The support shaft 55a is coupled to the transport stage 45, and the rotation apparatus 55b is fixed to the lifting apparatus 47. The rotation apparatus 55b can rotate the support shaft 55a and the transport stage 45 by a predetermined angle. The rotation apparatus 55b includes an actuator (not shown in the drawings) such as a servomotor.

The wafer W on the transport stage 45 is moved to the transfer position P2 by the horizontal movement apparatus 49. The polishing head 1 is cleaned by the liquid supplied from the cleaning nozzle 53. The liquid that has been used to clean the polishing head 1 falls on the upper surface of the wafer W on the transport stage 45. FIG. 38 is a diagram of the transport apparatus 44 viewed from a direction indicated by an arrow A shown in FIG. 37. As shown in FIG. 38, the liquid Q exists on the upper surface of the wafer W. Therefore, as shown in FIG. 39, the tilting apparatus 55 integrally tilts the transport stage 45 and the wafer W before the wafer W is held by the polishing head 1. The liquid Q spills from the upper surface of the tilted wafer W, and thereby the liquid Q is removed from the upper surface of the wafer W.

After the liquid Q is removed from the upper surface of the wafer W, the tilting apparatus 55 returns the wafer W to a horizontal posture again. Thereafter, the wafer W is held by the polishing head 1. The polishing head 1 carries the wafer W to the polishing position P1 (see FIG. 26) above the polishing pad 2 and presses the lower surface of the wafer W against the polishing surface 2a of the polishing pad 2 by the elastic film 34. The elastic film 34 of the polishing head 1 brings the lower surface of the wafer W into sliding contact with the polishing surface 2a in the presence of the slurry on the polishing surface 2a and polishes the lower surface of the wafer W by the chemical action of the slurry and the mechanical action of abrasive grains contained in the slurry.

According to the present embodiment, after the liquid Q is removed from the upper surface of the wafer W, the wafer W is held by the polishing head 1. Therefore, the liquid Q does not exist between the upper surface of the wafer W and the elastic film 34 of the polishing head 1, so that the elastic film 34 can apply an intended force to the wafer W and the polishing head 1 can achieve a desired film thickness profile of the wafer W.

Figure 40:
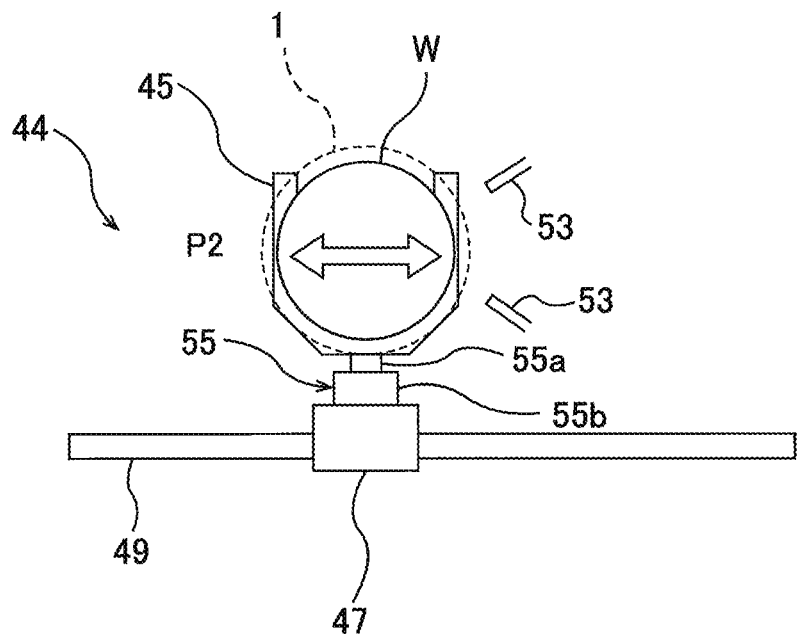
FIG. 40 is a diagram for explaining yet another embodiment of the method of removing liquid from the upper surface of the wafer.
Figure 41:
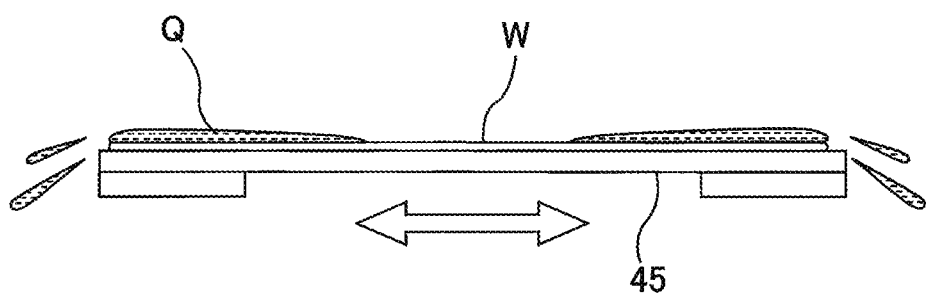
FIG. 41 is a diagram for further explaining the embodiment shown in FIG. 40.

FIGS. 40 and 41 are diagrams for explaining yet another embodiment of the method of removing the liquid from the upper surface of the wafer W. Details of the present embodiment that will not be described in particular are the same as those of the embodiment shown in FIG. 26, so that redundant description thereof will be omitted.

As shown in FIG. 40, the wafer W on the transport stage 45 is moved to the transfer position P2 by the horizontal movement apparatus 49. The polishing head 1 is cleaned by the liquid supplied from the cleaning nozzle 53. The liquid that has been used to clean the polishing head 1 falls on the upper surface of the wafer W on the transport stage 45.

As shown in FIG. 41, before the wafer W is held by the polishing head 1, the horizontal movement apparatus 49 swings the transport stage 45 and the wafer W in the horizontal direction. When the wafer W is swung, the liquid Q spills from the upper surface of the wafer W, and thereby the liquid Q is removed from the upper surface of the wafer W. In an embodiment, in a state where the transport stage 45 and the wafer W are tilted by the tilting apparatus 55, the horizontal movement apparatus 49 may swing the transport stage 45 and the wafer W in the horizontal direction. Further, in an embodiment, the tilting apparatus 55 need not be provided.

After the liquid Q is removed from the upper surface of the wafer W, the wafer W is held by the polishing head 1. The polishing head 1 carries the wafer W to the polishing position P1 (see FIG. 26) above the polishing pad 2 and presses the lower surface of the wafer W against the polishing surface 2a of the polishing pad 2 by the elastic film 34. The elastic film 34 of the polishing head 1 brings the lower surface of the wafer W into sliding contact with the polishing surface 2a in the presence of the slurry on the polishing surface 2a and polishes the lower surface of the wafer W by the chemical action of the slurry and the mechanical action of abrasive grains contained in the slurry.

According to the present embodiment, after the liquid Q is removed from the upper surface of the wafer W, the wafer W is held by the polishing head 1. Therefore, the liquid Q does not exist between the upper surface of the wafer W and the elastic film 34 of the polishing head 1, so that the elastic film 34 can apply an intended force to the wafer W and the polishing head 1 can achieve a desired film thickness profile of the wafer W.

Figure 42:
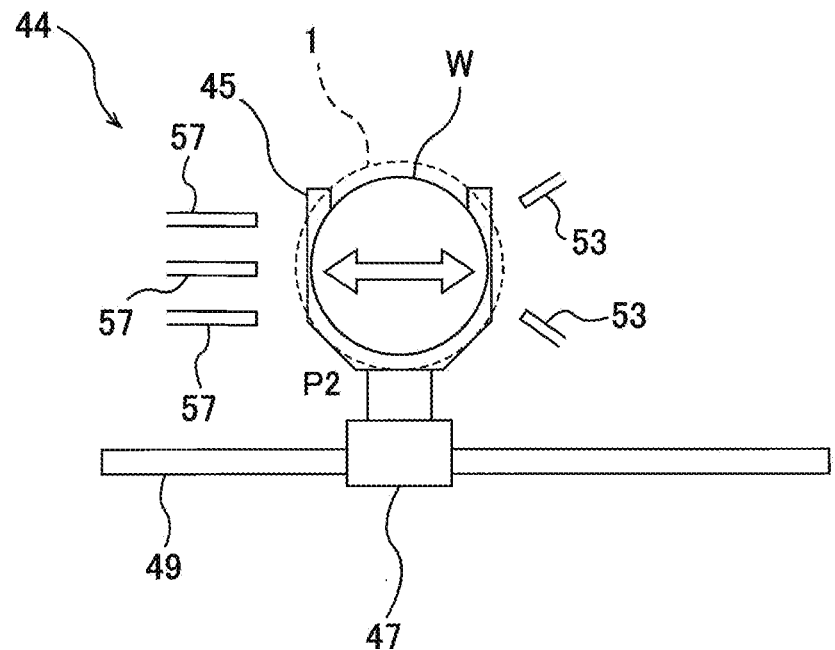
FIG. 42 is a diagram for explaining yet another embodiment of the method of removing liquid from the upper surface of the wafer.

FIG. 42 is a diagram for explaining yet another embodiment of the method of removing the liquid from the upper surface of the wafer W. Details of the present embodiment that will not be described in particular are the same as those of the embodiment shown in FIG. 26, so that redundant description thereof will be omitted.

As shown in FIG. 42, the polishing apparatus of the present embodiment includes gas jet nozzles 57 arranged in the transfer position P2. The gas jet nozzles 57 are tilted with respect to the horizontal direction and are arranged to face an upper portion of the transport stage 45 located in the transfer position P2, that is to say, arranged to face the upper surface of the wafer W on the transport stage 45. The gas jet nozzles 57 are coupled to a compressed gas supply source not shown in the drawings. In the present embodiment, a plurality of gas jet nozzles 57 are provided. However, in an embodiment, only one gas jet nozzle 57 may be provided.

Figure 43:
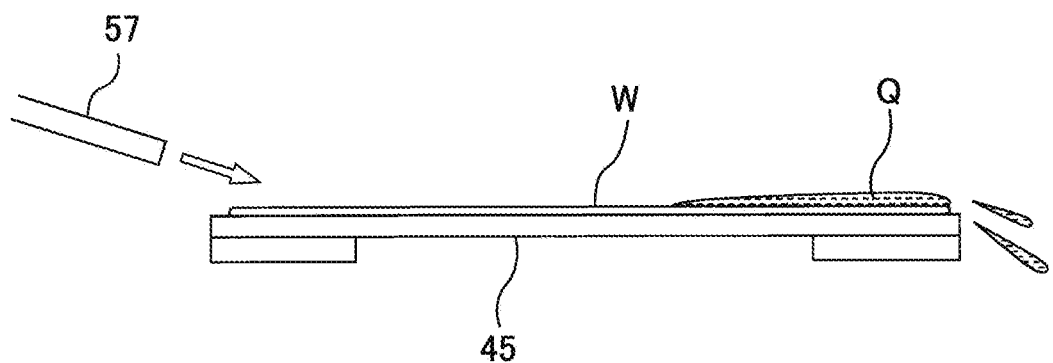
FIG. 43 is a diagram for further explaining the embodiment shown in FIG. 42.

The wafer W on the transport stage 45 is moved to the transfer position P2 by the horizontal movement apparatus 49. The polishing head 1 is cleaned by the liquid supplied from the cleaning nozzle 53. The liquid that has been used to clean the polishing head 1 falls on the upper surface of the wafer W on the transport stage 45. As shown in FIG. 43, before the wafer W is held by the polishing head 1, the gas jet nozzle 57 sends a jet of gas to the upper surface of the wafer W and removes the liquid Q from the upper surface of the wafer W.

After the liquid Q is removed from the upper surface of the wafer W, the wafer W is held by the polishing head 1. The polishing head 1 carries the wafer W to the polishing position P1 (see FIG. 26) above the polishing pad 2 and presses the lower surface of the wafer W against the polishing surface 2a of the polishing pad 2 by the elastic film 34. The elastic film 34 of the polishing head 1 brings the lower surface of the wafer W into sliding contact with the polishing surface 2a in the presence of the slurry on the polishing surface 2a and polishes the lower surface of the wafer W by the chemical action of the slurry and the mechanical action of abrasive grains contained in the slurry.

According to the present embodiment, after the liquid Q is removed from the upper surface of the wafer W, the wafer W is held by the polishing head 1. Therefore, the liquid Q does not exist between the upper surface of the wafer W and the elastic film 34 of the polishing head 1, so that the elastic film 34 can apply an intended force to the wafer W and the polishing head 1 can achieve a desired film thickness profile of the wafer W.

Figure 44:
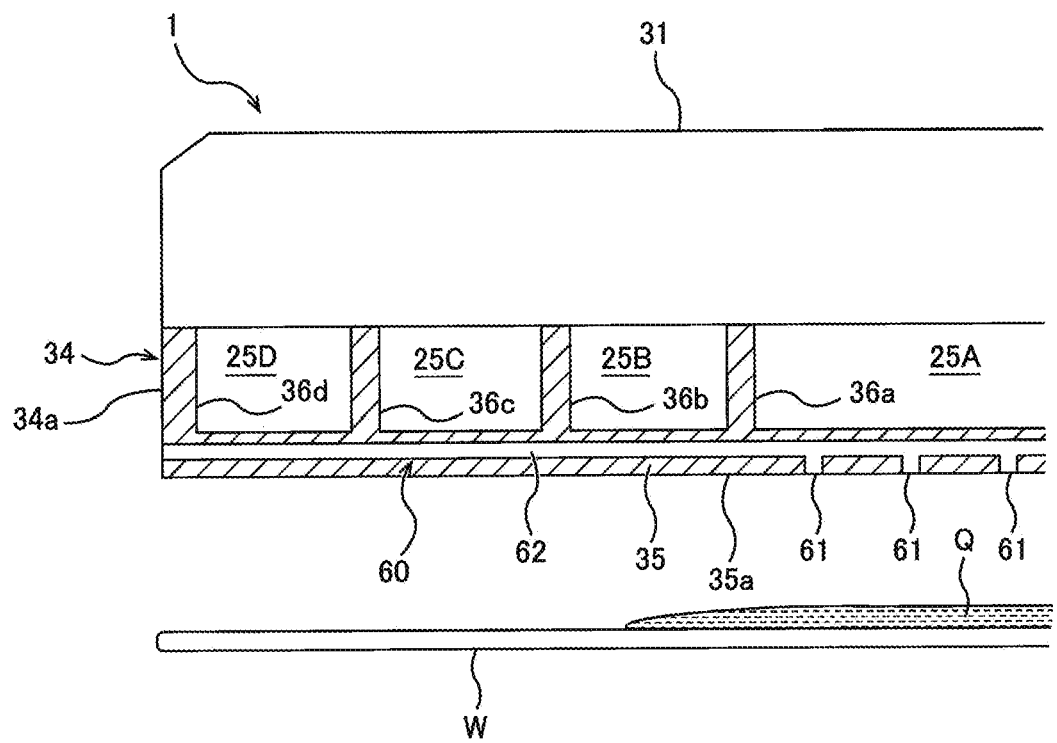
FIG. 44 is a cross-sectional view showing an embodiment of an elastic film that can remove liquid from the upper surface of the wafer.

FIG. 44 is a cross-sectional view showing an embodiment of the elastic film 34 that can remove the liquid from the upper surface of the wafer W. As shown in FIG. 44, the elastic film 34 has a liquid flow path 60 formed therein. More specifically, the contact portion 35 of the elastic film 34 has a plurality of openings 61 that open at the contact surface 35a and a horizontal hole 62 connected to the plurality of openings 61. The contact surface 35a of the elastic film 34 is one surface of the elastic film 34 that comes into contact with the upper surface of the wafer W. The openings 61 are provided below the pressure chamber 25A located on the center side and are not provided below the other pressure chambers 25B to 25D. In an embodiment, the openings 61 may be provided below the pressure chambers 25B to 25D. The horizontal hole 62 extends in the contact portion 35 and an outer end of the horizontal hole 62 opens at an outside surface 34a of the elastic film 34. Therefore, the contact surface 35a and the outside surface 34a of the elastic film 34 communicate with each other through the liquid flow path 60 composed of the openings 61 and the horizontal hole 62.

Figure 45:
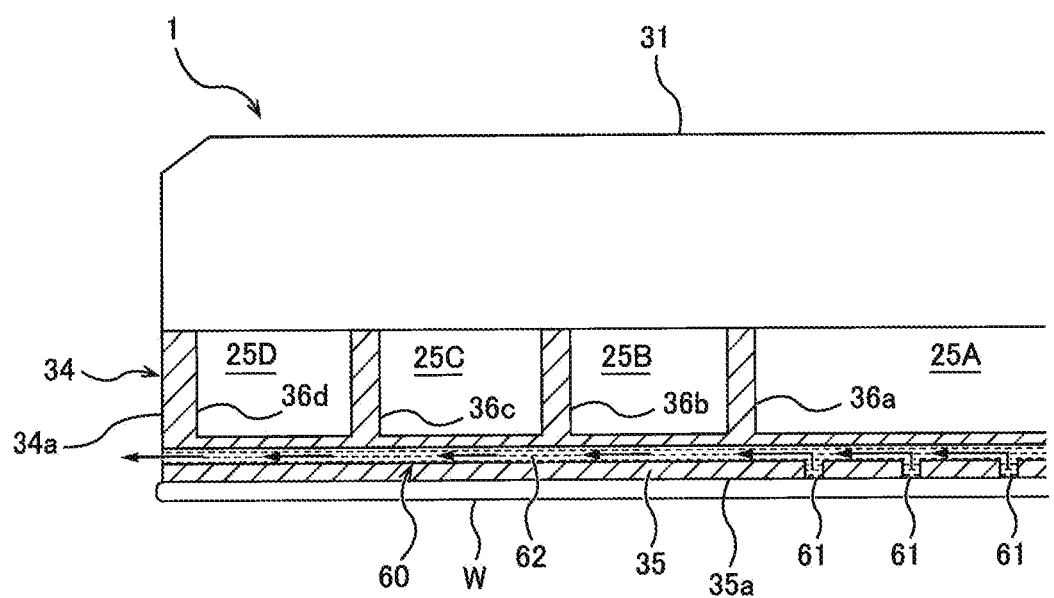
FIG. 45 is a schematic diagram showing a state where the elastic film shown in FIG. 44 is removing liquid from the upper surface of the wafer.

As shown in FIG. 45, the elastic film 34 is swollen by supplying compressed gas in the pressure chambers 25A to 25D, and the contact surface 35a of the elastic film 34 is pressed against the upper surface of the wafer W. The liquid Q (see FIG. 44) existing on the upper surface of the wafer W flows into the liquid flow path 60 from the openings 61 and flows out to the outside of the elastic film 34 through the liquid flow path 60. As a result, the liquid Q is removed from the upper surface of the wafer W.

After the liquid Q is removed from the upper surface of the wafer W, the wafer W is held by the polishing head 1. The polishing head 1 carries the wafer W to the polishing position P1 (see FIG. 26) above the polishing pad 2 and presses the lower surface of the wafer W against the polishing surface 2a of the polishing pad 2 by the elastic film 34. The elastic film 34 of the polishing head 1 brings the lower surface of the wafer W into sliding contact with the polishing surface 2a in the presence of the slurry on the polishing surface 2a and polishes the lower surface of the wafer W by the chemical action of the slurry and the mechanical action of abrasive grains contained in the slurry.

According to the present embodiment, the polishing head 1 can hold the wafer W in a state where there is substantially no liquid Q between the elastic film 34 and the upper surface of the wafer W. As a result, the elastic film 34 that forms the pressure chambers 25A, 25B, 25C, and 25D can apply an intended force to the wafer W, and the polishing head 1 can achieve a desired film thickness profile of the wafer W.

Figure 46:
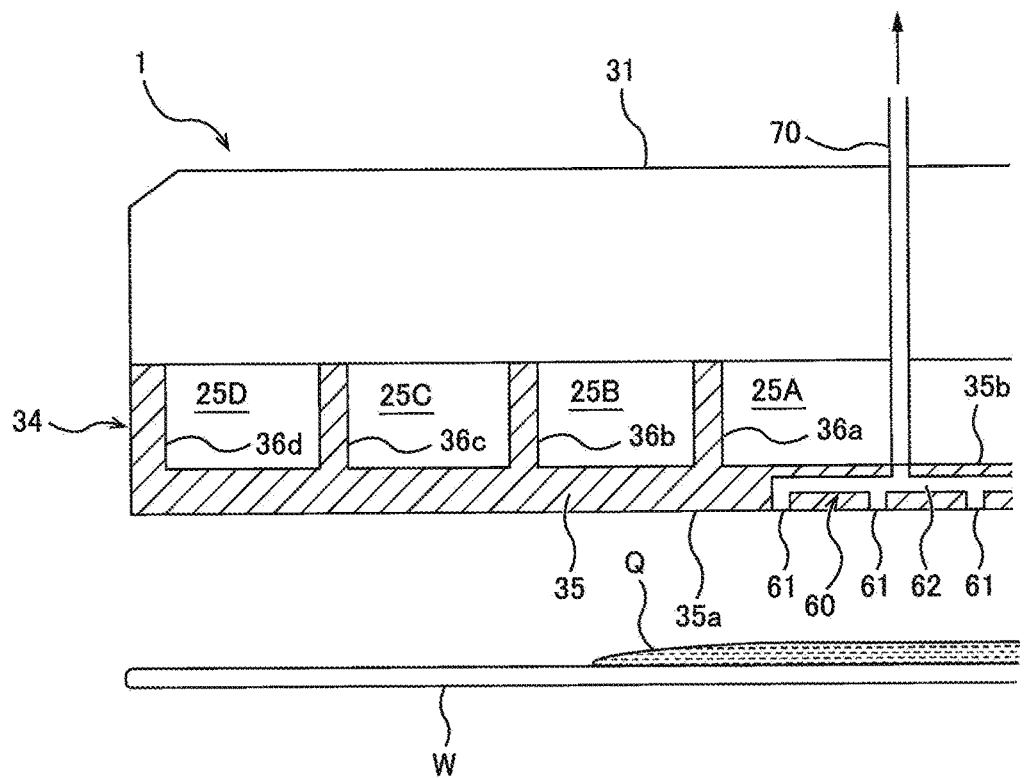
FIG. 46 is a cross-sectional view showing another embodiment of the elastic film that can remove liquid from the upper surface of the wafer.

FIG. 46 is a cross-sectional view showing another embodiment of the elastic film 34 that can remove the liquid from the upper surface of the wafer W. Details of the present embodiment that will not be described in particular are the same as those of the embodiment shown in FIGS. 44 and 45, so that redundant description thereof will be omitted. As shown in FIG. 46, the liquid flow path 60 communicates with a suction line 70 connected to the elastic film 34. More specifically, the horizontal hole 62 is connected to the openings 61 and the suction line 70. One end of the horizontal hole 62 are connected to the openings 61, and the other end of the horizontal hole 62 opens at an upper surface 35b of the contact portion 35 (a surface opposite to the contact surface 35a of the contact portion 35).

The suction line 70 extends though the carrier 31, and an end portion of the suction line 70 is connected to the upper surface 35b of the contact portion 35. The suction line 70 communicates with the liquid flow path 60, but does not communicate with the pressure chamber 25A. Therefore, the suction line 70 can generate vacuum in the liquid flow path 60 without generating vacuum in the pressure chamber 25A.

Figure 47:
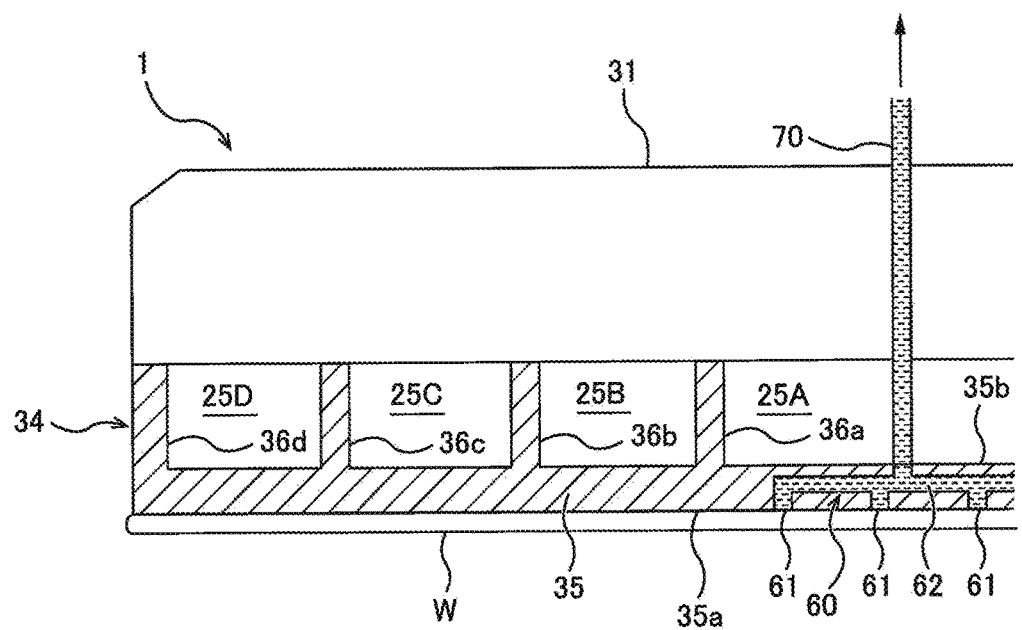
FIG. 47 is a schematic diagram showing a state where the elastic film shown in FIG. 46 is removing liquid from the upper surface of the wafer.

As shown in FIG. 47, the elastic film 34 is swollen by supplying compressed gas in the pressure chambers 25A to 25D, and while the contact surface 35a of the elastic film 34 is pressed against the upper surface of the wafer W, vacuum is generated in the liquid flow path 60 by the suction line 70. The liquid Q (see FIG. 46) existing on the upper surface of the wafer W is sucked into the liquid flow path 60 from the openings 61 and removed from the upper surface of the wafer W.

Figure 48:
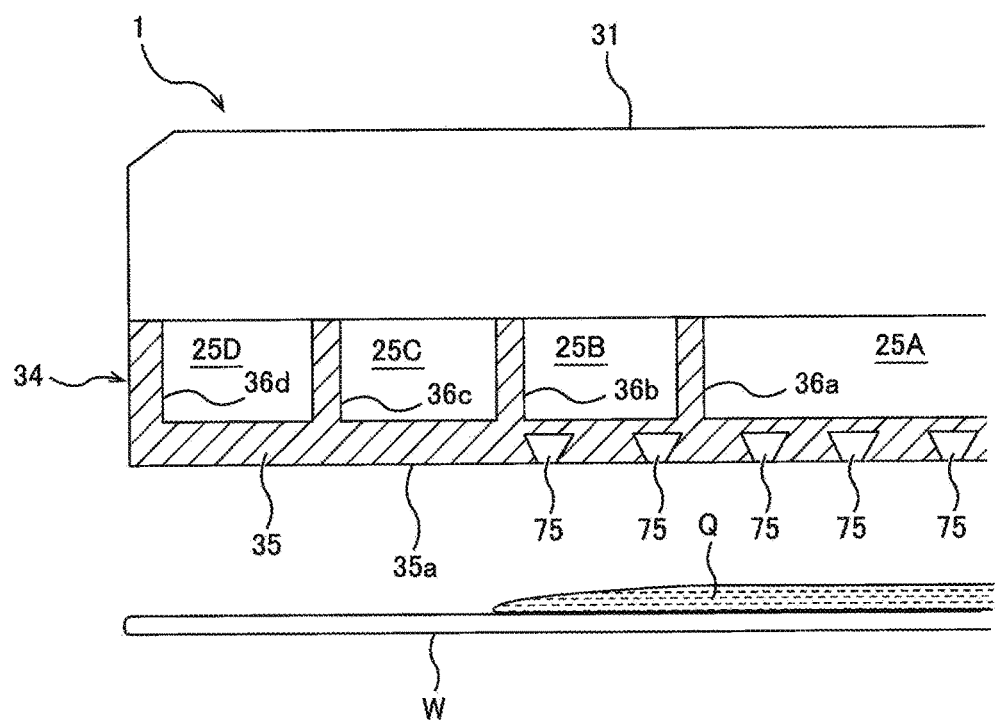
FIG. 48 is a cross-sectional view showing yet another embodiment of the elastic film that can remove liquid from the upper surface of the wafer.

FIG. 48 is a cross-sectional view showing yet another embodiment of the elastic film 34 that can remove the liquid from the upper surface of the wafer W. Details of the present embodiment that will not be described in particular are the same as those of the embodiment shown in FIGS. 44 and 45, so that redundant description thereof will be omitted. As shown in FIG. 48, a liquid flow path is composed of a plurality of grooves 75 formed in the contact surface 35a.

Figure 49:
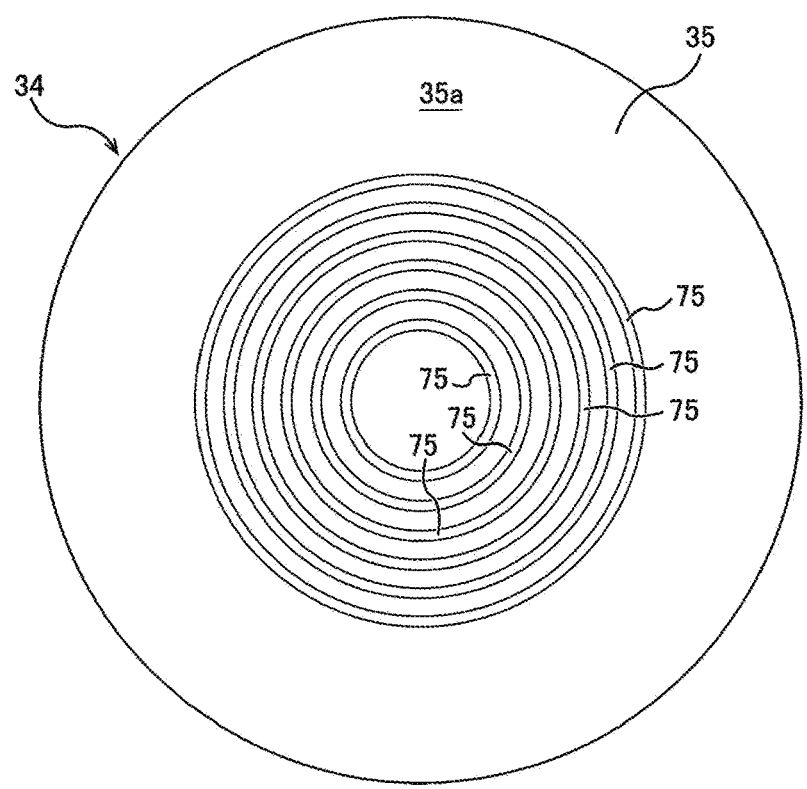
FIG. 49 is a bottom view of the elastic film shown in FIG. 48.

FIG. 49 is a bottom view of the elastic film 34 shown in FIG. 48. As shown in FIG. 49, the plurality of grooves 75 are annular grooves arranged in a concentric pattern. However, the shape of the grooves 75 is not limited to the present embodiment. For example, the grooves 75 may be straight grooves arranged in parallel with each other.

Figure 50:
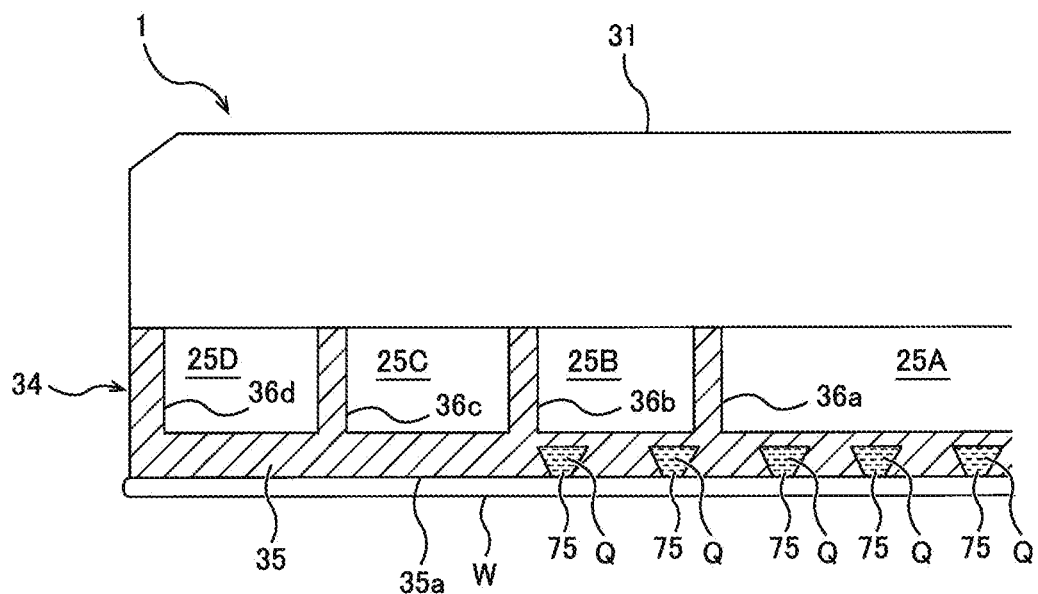
FIG. 50 is a schematic diagram showing a state where the elastic film shown in FIG. 48 is removing liquid from the upper surface of the wafer.

As shown in FIG. 50, the elastic film 34 is swollen by supplying compressed gas in the pressure chambers 25A to 25D, and the contact surface 35a of the elastic film 34 is pressed against the upper surface of the wafer W. The liquid Q (see FIG. 48) existing on the upper surface of the wafer W flows into the grooves 75 used as liquid flow paths. As a result, the liquid Q is removed from the upper surface of the wafer W.

In the present embodiment, to prevent the liquid Q that has flown into the grooves 75 from flowing out from the grooves 75, the width of each groove 75 inside the contact portion 35 is larger than the width of each groove 75 in the contact surface 35a. In other words, an inlet port of the groove 75 is small, and inside of the groove 75 is large. The groove 75 having such a cross-sectional shape easily holds the liquid Q therein. In order to remove liquid irregularly existing on the upper surface of the wafer W, the grooves 75 may be uniformly distributed in the entire contact surface 35a of the elastic film 34.

The elastic films 34 shown in FIGS. 44 to 50 can be created by using a 3D printer (stereoscopic printing machine).

The embodiments described above can be appropriately combined. For example, the embodiment shown in FIGS. 27 to 29 may be applied to the embodiment shown in FIGS. 37 to 39, or the embodiment shown in FIGS. 40 and 41, or the embodiment shown in FIGS. 42 and 43.

The polishing head 1 according to each embodiment described above has four pressure chambers 25A, 25B, 25C, and 25D. However, the present invention is not limited to these embodiments. The embodiments where the liquid is removed from the upper surface of the wafer W can also be applied to a polishing head having less than four pressure chambers and a polishing head having more than four pressure chambers.

The above embodiments are described so that a person with an ordinary skill in the technical field to which the invention pertains can implement the invention. Various modified examples of the above embodiments can be naturally made by those skilled in the art, and the technical idea of the invention can be applied to other embodiments. Therefore, the invention is not limited to the described embodiments and should encompass the widest range in accordance with the technical ideas defined by the claims.

Sixth to Eighth Embodiments

Patent Literature 1 discloses a substrate polishing apparatus that polishes a substrate while a membrane of a top ring sucks and holds the substrate and thereafter releases the substrate from the membrane. The substrate is released by pressurizing the membrane and injecting a fluid into a gap generated between the membrane and an outer circumferential portion of the substrate.

As the pressurization of the membrane, for example, pressure control by an electropneumatic regulator is considered. When pressure is low, control accuracy and responsiveness of the electropneumatic regulator degrade, so that the membrane is pressurized with pressure being large to some extent.

In recent years, along with microfabrication and highly multi-layering of a semiconductor process, a substrate where a semiconductor device is formed becomes easy to be cracked. Therefore, when the substrate is released, if a large pressure is applied to the membrane by the electropneumatic regulator or the like, the substrate may be applied with a large stress to be cracked.

The sixth to the eighth embodiments are made in view of the above problem, and an object of the sixth to the eighth embodiments is to provide a substrate polishing apparatus and a substrate release method that can safely release a sucked and held substrate and to provide a constant amount gas supply apparatus that can be connected to the substrate polishing apparatus.

According to the sixth to the eighth embodiments, the following aspects are provided.

According to one embodiment, provided is a substrate polishing apparatus including; a top ring main body; an elastic film including a first surface facing the top ring main body and a second surface that is a surface opposite to the first surface and can suck and hold a substrate; a pressure adjustment apparatus that can pressurize and depressurize a space between the top ring main body and the first surface of the elastic film through a first valve provided on a first line communicating with the space; and a constant amount gas supply apparatus that can supply a certain amount of gas to the space through a second valve provided on the first line.

Preferably, when causing the second surface of the elastic film to suck the substrate, the second valve closes, the first valve opens, and the pressure adjustment apparatus depressurizes the space, when polishing the substrate, the second valve closes, the first valve opens, and the pressure adjustment apparatus pressurizes the space, and when releasing the substrate from the second surface of the elastic film, the first valve closes, the second valve opens, and the constant amount gas supply apparatus supplies a certain amount of gas to the space.

Preferably, by moving a weight coupled to a piston in a cylinder downward due to gravity, the constant amount gas supply apparatus may supply a certain amount of gas corresponding to an area of the piston and a stroke of the piston to the space from the cylinder.

Specifically, the constant amount gas supply apparatus may include the cylinder, the piston, and the weight, the piston is, under a state where the piston is in contact with an inner surface of the cylinder, can move up and down, inside of the cylinder is divided into a lower space and an upper space by the piston, the cylinder is provided with a first opening at a position corresponding to the lower space and second and third openings at positions corresponding to the upper space, the first opening is connected with a second line connected to the first line through the second valve, the second opening is connected with a third line, the third opening is penetrated with a piston rod that couples the weight and the piston, the lower space can be opened to atmosphere by opening the third valve provided on the second line opens, and the upper space can be depressurized and opened to atmosphere through the third line.

More specifically, when causing the second surface of the elastic film to suck the substrate and when polishing the substrate, the upper space is depressurized and the lower space is opened to atmosphere, and when releasing the substrate from the second surface of the elastic film, the upper space is opened to atmosphere and the third valve closes.

Preferably, the constant amount gas supply apparatus may supply a certain amount of gas according to a volume of a chamber to the space from a bladder by compressing the bladder stored in the chamber.

Specifically, the constant amount gas supply apparatus may include the bladder and the chamber, the chamber is provided with a fourth opening and a fifth opening, the fourth opening is penetrated with a fourth line that connects the first line and the bladder through the second valve, the fifth opening is connected with a fifth line, the bladder can be opened to atmosphere by opening a fourth valve provided on the fourth line, and the chamber can be pressurized and depressurized through the fifth line.

More specifically, when causing the second surface of the elastic film to suck the substrate and when polishing the substrate, the chamber may be depressurized and the bladder is opened to atmosphere, and when releasing the substrate from the second surface of the elastic film, the chamber is pressurized and the fourth valve closes.

According to another embodiment, provided is a substrate release method of releasing a substrate sucked and held by a second surface of an elastic film of a top ring from the elastic film, the substrate release method including: a gas supply step of supplying a certain amount of gas to a space between a top ring main body and a first surface of the elastic film in the top ring to generate a gap between the elastic film and the substrate; and a fluid injection step of injecting fluid into the gap.

In the gas supply step, a certain amount of gas corresponding to an area of a piston and a stroke of the piston may be supplied to the space from a cylinder by moving down a weight coupled to the piston in the cylinder.

In the gas supply step, a certain amount of gas corresponding to a volume of a chamber may be supplied to the space from a bladder by compressing the bladder stored in the chamber.

According to another embodiment, a constant amount gas supply apparatus connected to a substrate holding apparatus including: a top ring main body, an elastic film including a first surface facing the top ring main body and a second surface that is a surface opposite to the first surface and can suck and hold a substrate, and a pressure adjustment apparatus that can pressurize and depressurize a space between the top ring main body and the first surface of the elastic film through a first valve provided on a first line communicating with the space, wherein the constant amount gas supply apparatus can supply a certain amount of gas to the space through a second valve provided on the first line Hereinafter, the sixth to the eighth embodiments will be specifically described with reference to the drawings.

Sixth Embodiment

Figure 54:
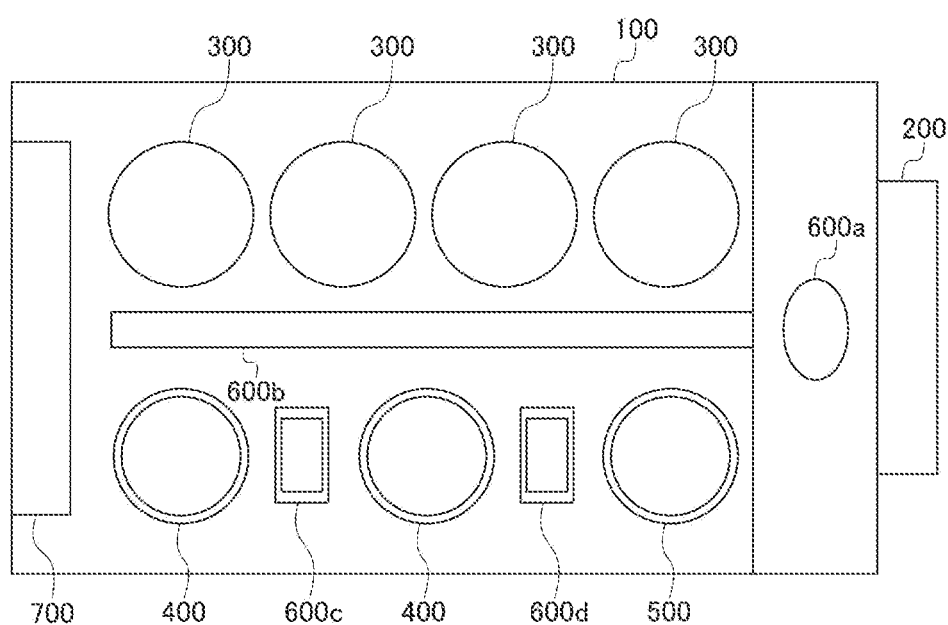
FIG. 54 is a schematic top view of a substrate processing apparatus including a substrate polishing apparatuses.

FIG. 54 is a schematic top view of a substrate processing apparatus including a substrate polishing apparatuses. The substrate processing apparatus processes various substrates in a manufacturing process or the like of a semiconductor wafer with a diameter of 300 mm or 450 mm, a flat panel, an image sensor of CMOS (Complementary Metal Oxide Semiconductor) or CCD (Charge Coupled Device), and a magnetic film in a MRAM (Magnetoresistive Random Access Memory).

The substrate processing apparatus includes a substantially rectangular housing 100, a load port 200 on which a substrate cassette that stores many substrates is mounted, one or a plurality of (four in an aspect shown in FIG. 54) substrate polishing apparatuses 300, one or a plurality of (two in the aspect shown in FIG. 54) substrate cleaning apparatuses 400, a substrate drying apparatus 500, transport mechanisms 600a to 600d, and a controller 700.

The load port 200 is arranged adjacent to the housing 100. The load port 200 can be mounted with an open cassette, a standard mechanical interface (SMIF) pod, or a front opening unified pod (FOUP). The SMIF pod and the FOUP are airtight containers, each of which can maintain an environment independent from external space by storing a substrate cassette inside thereof and covering the inside by a partition wall.

The housing 100 stores the substrate polishing apparatuses 300 that polish a substrate, the substrate cleaning apparatuses 400 that clean a substrate that has been polished, and the substrate drying apparatus 500 that dries a substrate that has been cleaned. The substrate polishing apparatuses 300 are arranged along the longitudinal direction of the substrate processing apparatus. The substrate cleaning apparatuses 400 and the substrate drying apparatus 500 are also arranged along the longitudinal direction of the substrate processing apparatus.

The transport mechanism 600a is arranged in a region surrounded by the load port 200, the substrate polishing apparatus 300 located on the side of the load port 200, and the substrate drying apparatus 500. The transport mechanism 600b is arranged in parallel with the substrate polishing apparatuses 300 and in parallel with the substrate cleaning apparatuses 400 and the substrate drying apparatus 500.

The transport mechanism 600a receives a substrate before being polished from the load port 200 and transfers the substrate to the transport mechanism 600b. Further, the transport mechanism 600a receives the substrate after being dried from the substrate drying apparatus 500.

The transport mechanism 600b is, for example, a linear transporter, and transfers a substrate before being polished that is received from the transport mechanism 600a to the substrate polishing apparatuses 300. As described later, a top ring (not shown in the drawings) of the substrate polishing apparatuses 300 receives the substrate from the transport mechanism 600b by vacuum suction. The substrate polishing apparatus 300 releases the substrate after being polished to the transport mechanism 600b and the substrate is transferred to the substrate cleaning apparatus 400.

Further, the transport mechanism 600c that transfers the substrate between the substrate cleaning apparatuses 400 is arranged between the two substrate cleaning apparatuses 400. The transport mechanism 600d that transfers the substrate between the substrate cleaning apparatus 400 and the substrate drying apparatus 500 is arranged between the substrate cleaning apparatus 400 and the substrate drying apparatus 500.

The controller 700 controls an operation of each device of the substrate processing apparatus. The controller 700 may be arranged inside the housing 100, may be arranged outside the housing 100, or may be provided in each of the substrate polishing apparatuses 300, the substrate cleaning apparatuses 400, and the substrate drying apparatus 500.

Figure 55:
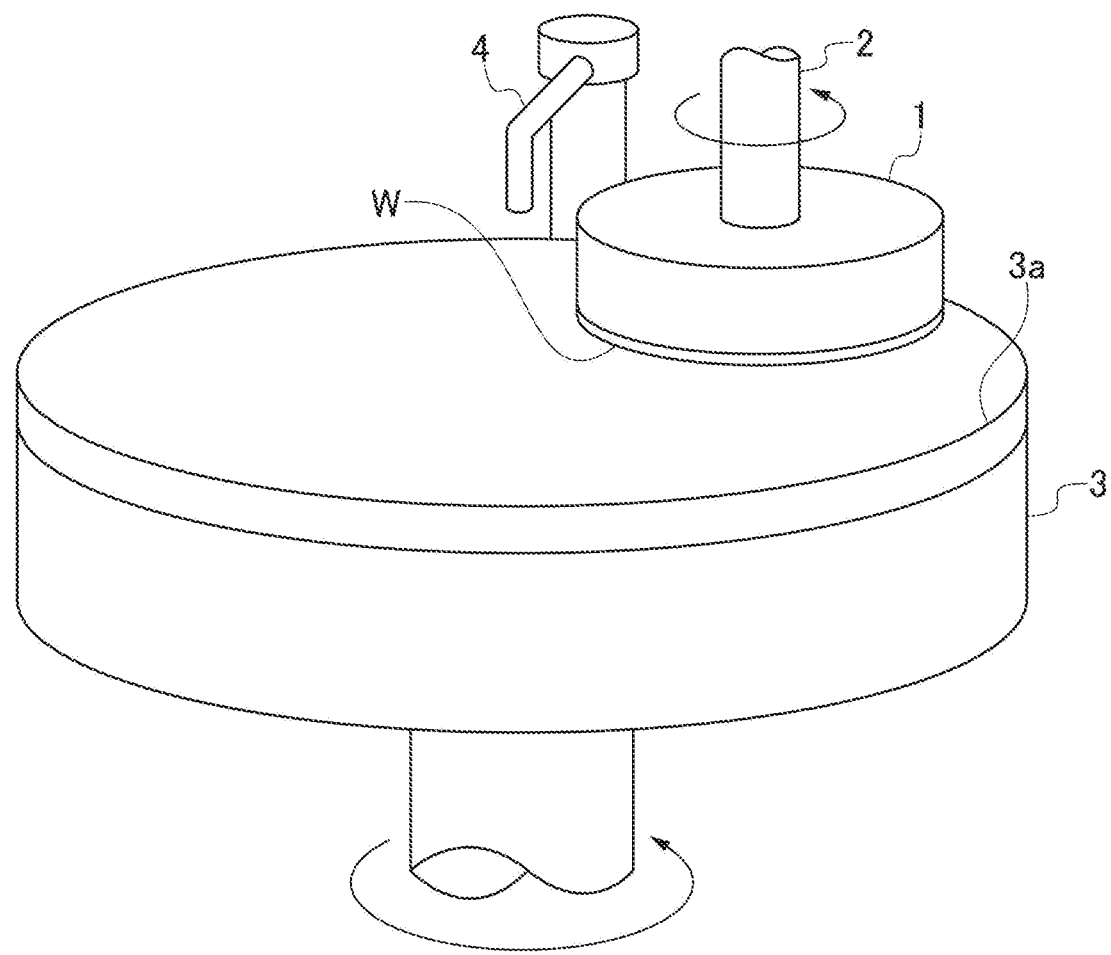
FIG. 55 is a schematic perspective view of a substrate polishing apparatus.
Figure 56:
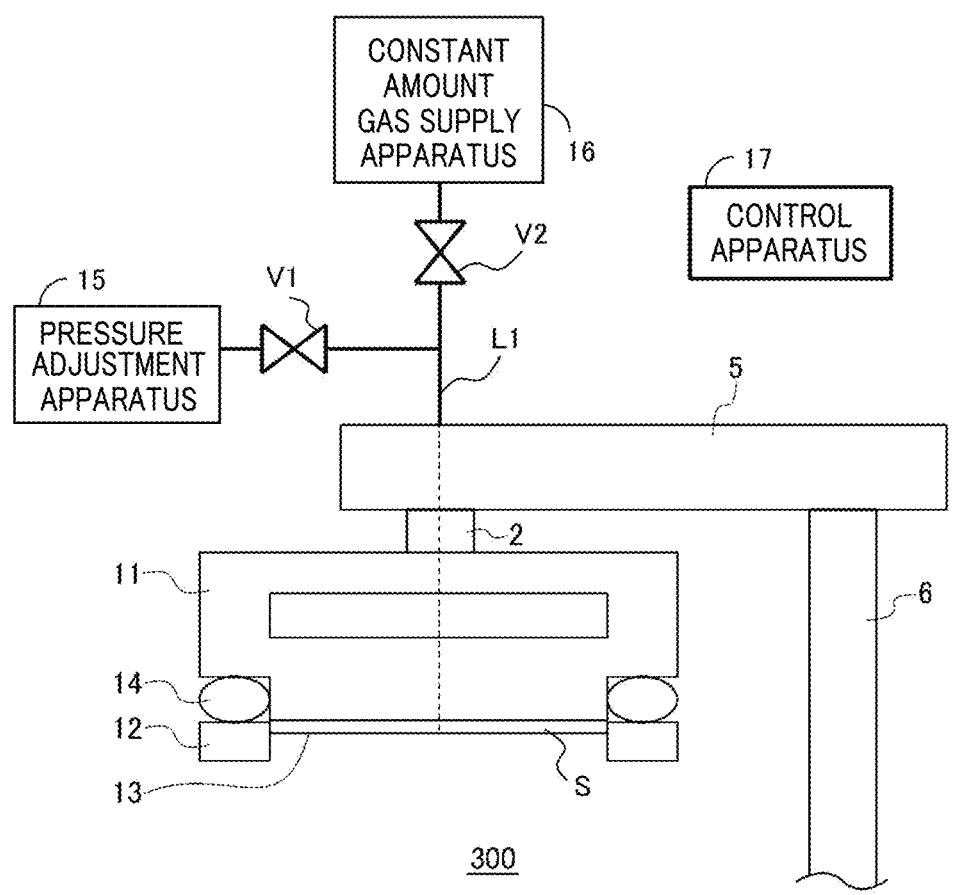
FIG. 56 is a schematic cross-sectional view around a top ring.

FIG. 55 and FIG. 56 are respectively a schematic perspective view of the substrate polishing apparatus 300 and a schematic cross-sectional view around a top ring 1. The substrate polishing apparatus 300 has the top ring 1 (substrate holding apparatus) that holds the substrate. As shown in FIG. 56, the top ring 1 is composed of a top ring main body 11 (also referred to as a carrier or a base plate), an annular retainer ring 12, a flexible membrane 13 (elastic film) that can be attached below the top ring main body 11 and inside the retainer ring 12, an air bag 14 provided between the top ring main body 11 and the retainer ring 12, a pressure adjustment apparatus 15, a constant amount gas supply apparatus 16, a control apparatus 17, and the like. The pressure adjustment apparatus 15, the constant amount gas supply apparatus 16, and/or the control apparatus 17 may be included in the top ring 1, or may be apparatuses different from the top ring 1.

The retainer ring 12 is provided to an outer circumferential portion of the top ring main body 11. A circumferential edge of the held substrate W is surrounded by the retainer ring 12, so that substrate W does not jump out from the top ring 1 during polishing. The retainer ring 12 may be composed of one member or may be composed of two rings including an inner ring and an outer ring provided outside the inner ring. In the latter case, the outer ring may be fixed to the top ring main body 11 and the airbag 14 may be provided between the inner ring and the top ring main body 11.

The membrane 13 is provided facing the top ring main body 11. Specifically, the upper surface of the membrane 13 faces the top ring main body 11, and a space S is formed between the upper surface of the membrane 13 and the top ring main body 11. When depressurizing the space S and generating negative pressure in the space S, the lower surface of the membrane 13 can hold the upper surface of the substrate W. Further, the retainer ring may have a multi-layer ring structure composed of a plurality of members arranged in a vertical direction.

The air bag 14 is provided between the top ring main body 11 and the retainer ring 12. The retainer ring 12 can relatively move with respect to the top ring main body 11 in a vertical direction by the air bag 14.

The pressure adjustment apparatus 15 is connected to a line (pipe) L1 whose one end communicates with the space S. More specifically, a valve V1 is provided on the line L1, and the pressure adjustment apparatus 15 is arranged on the upstream side of the valve V1 (on the opposite side of the space S).

The constant amount gas supply apparatus 16 is connected to the line L1. More specifically, a valve V2 is provided on the line L1, and the constant amount gas supply apparatus 16 is arranged on the upstream side of the valve V2 (on the opposite side of the space S).

In other words, one end of the line L1 communicates with the space S and the other end branches. One branch is connected to the pressure adjustment apparatus 15 through the valve V1, and the other branch is connected to the constant amount gas supply apparatus 16 through the valve V2. In this way, the space S is connected to the pressure adjustment apparatus 15 through the valve V1 and connected to the constant amount gas supply apparatus 16 through the valve V2.

When the valve V1 is opened and the valve V2 is closed, the pressure adjustment apparatus 15 can adjust pressure of the space S by pressurizing the space S by supplying fluid (gas) to the space S, depressurizing the space S by evacuating air from the space S, or opening the space S to the atmosphere. On the other hand, when the valve V2 is opened and the valve V1 is closed, the constant amount gas supply apparatus 16 can supply a certain amount of fluid (gas) to the space S. As described later, providing the constant amount gas supply apparatus 16 is one of the features of the present embodiment. A specific configuration example of the constant amount gas supply apparatus 16 will be described in the seventh and the eighth embodiments.

The control apparatus 17 performs control of each component of the top ring 1, such as, for example, opening/closing of the valves V1 and V2, control of the pressure adjustment apparatus 15 and the constant amount gas supply apparatus 16, and the like.

Further, the substrate polishing apparatus 300 has a top ring shaft 2 whose lower portion is coupled with the top ring 1, a polishing table 3 having a polishing pad 3a, a nozzle 4 that supplies a polishing liquid onto the polishing pad 3a, a top ring arm 5, and a support shaft 6.

In FIG. 55, a lower end of the top ring shaft 2 is coupled to a center of an upper surface of the top ring 1. When a lifting mechanism (not shown in the drawings) lifts and lowers the top ring shaft 2, a lower surface of the substrate W held by the top ring 1 comes into and out of contact with the polishing pad 3a. When a motor (not shown in the drawings) rotates the top ring shaft 2, the top ring 1 rotates, and the substrate W held by the top ring 1 also rotates.

The polishing pad 3a is provided on an upper surface of the polishing table 3. A lower surface of the polishing table 3 is connected to a rotating shaft, so that the polishing table 3 can rotate. When the polishing liquid is supplied from the nozzle 4 and the substrate W and the polishing table 3 rotate in a state where the lower surface of the substrate W is in contact with the polishing pad 3a, the substrate W is polished.

The top ring shaft 2 is coupled to one end of the top ring arm 5 in FIG. 56 and the support shaft 6 is coupled to the other end. When a motor not shown in the drawings rotates the support shaft 6, the top ring arm 5 swings, so that the top ring 1 moves between a position over the polishing pad 3a and a substrate transfer position (not shown in the drawings).

Subsequently, an operation of transferring the substrate W from the transport mechanism 600b in FIG. 54 to the top ring 1 in FIGS. 55 and 56, that is, an operation when the top ring 1 sucks the substrate W, will be described. When the substrate W is held by the top ring 1, the valve V1 in FIG. 56 is opened and the valve V2 is closed. Therefore, the space S is connected to the pressure adjustment apparatus 15 and disconnected from the constant amount gas supply apparatus 16.

Figure 57A:
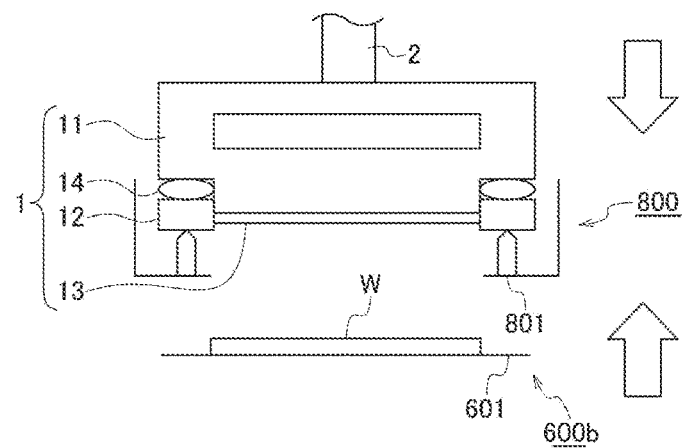
FIG. 57A is a diagram for explaining in detail transfer of a substrate from a transport mechanism to the top ring.
Figure 57B:
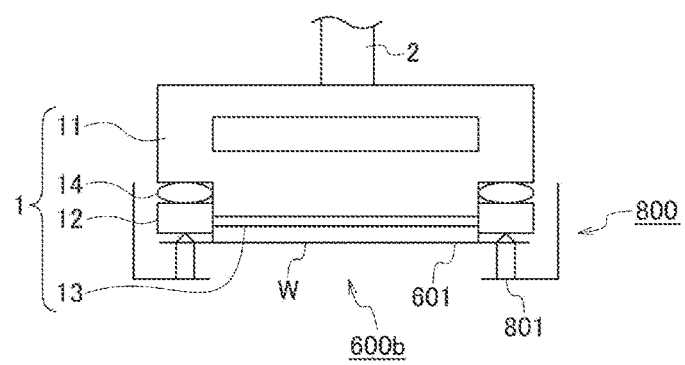
FIG. 57B is a diagram for explaining in detail the transfer of the substrate from the transport mechanism to the top ring.
Figure 57C:
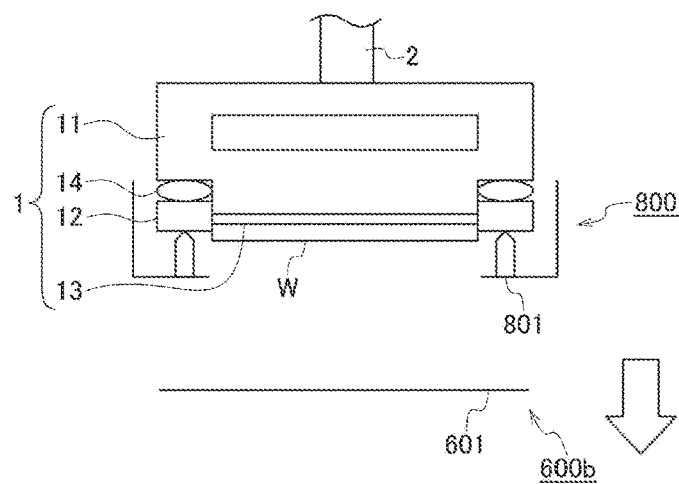
FIG. 57C is a diagram for explaining in detail the transfer of the substrate from the transport mechanism to the top ring.
Figure 58:
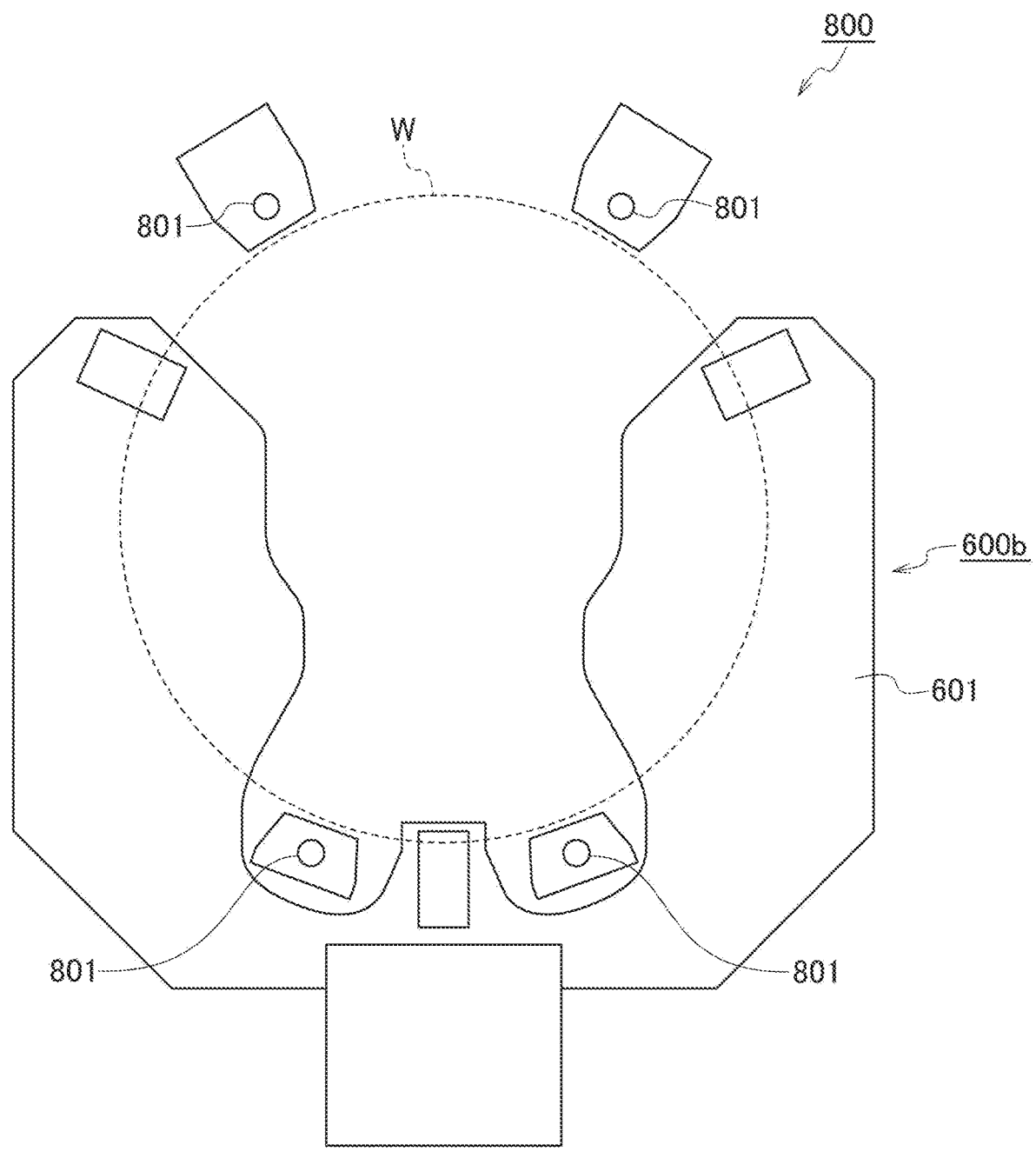
FIG. 58 is a diagram for explaining in detail the transfer of the substrate from the transport mechanism to the top ring.

FIGS. 57A to 57C and FIG. 58 are diagrams for explaining in detail the transfer of the substrate from the transport mechanism 600b to the top ring 1. FIGS. 57A to 57C are schematic cross-sectional views where the transport mechanism 600b and the top ring 1 are viewed from the side. FIG. 58 is a diagram where they are viewed from above.

As shown in FIG. 57A, the substrate W is mounted on a hand 601 of the transport mechanism 600b. A retainer ring station 800 is used to transfer the substrate W. The retainer ring station 800 has pushing-up pins 801 that push up the retainer ring 12 of the top ring 1. The retainer ring station 800 may have a release nozzle. However, here, the release nozzle is not shown in the drawings.

As shown in FIG. 58, the hand 601 supports parts of an outer circumference of the lower surface of the substrate W. The pushing-up pins 801 and the hand 601 are arranged so as not to be in contact with each other.

In a state shown in FIG. 57A, the top ring 1 lowers and the transport mechanism 600b rises. When the top ring 1 lowers, the pushing-up pins 801 push up the retainer ring 12 and the substrate W approaches the membrane 13. When the transport mechanism 600b rises further, the upper surface of the substrate W comes into contact with the lower surface of the membrane 13 (FIG. 57B).

In this state, the pressure adjustment apparatus 15 depressurizes the space S and generates negative pressure in the space S, so that the substrate W is sucked to the lower surface of the membrane 13 of the top ring 1.

Thereafter, the hand 601 of the transport mechanism 600b lowers (FIG. 57C).

The substrate W sucked and held by the membrane 13 in this way is moved above the polishing table 3 when the support shaft 6 rotates and top ring arm 5 swings. Then, the top ring 1 lowers, so that the substrate W comes into contact with the polishing pad 3a. In this state, the top ring shaft 2 rotates while the pressure adjustment apparatus 15 pressurizes the space S, so that the substrate W is polished.

Subsequently, an operation of transferring the substrate W from the top ring 1 in FIGS. 55 and 56 to the transport mechanism 600b in FIG. 54, that is, an operation when releasing (separating) the substrate W from the top ring 1 will be described. When releasing the substrate, the valve V1 in FIG. 56 is closed and the valve V2 is opened. Therefore, the space S is connected to the constant amount gas supply apparatus 16 and disconnected from the pressure adjustment apparatus 15.

Figure 59A:
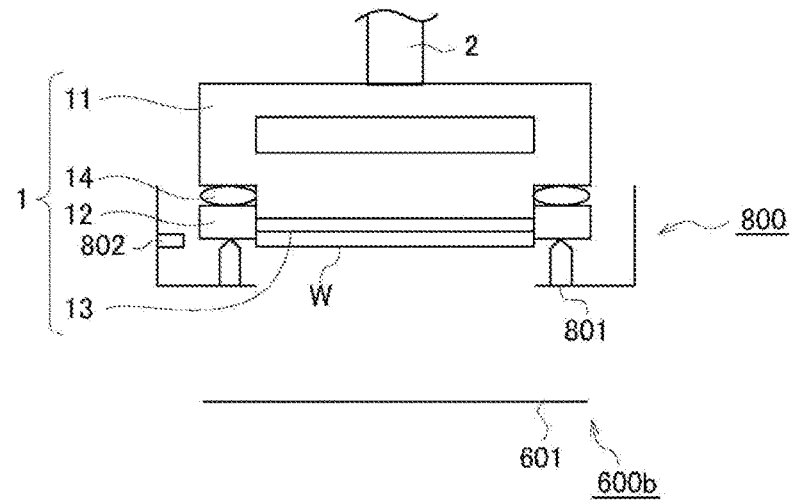
FIG. 59A is a diagram for explaining in detail transfer of the substrate from the top ring to the transport mechanism.
Figure 59B:
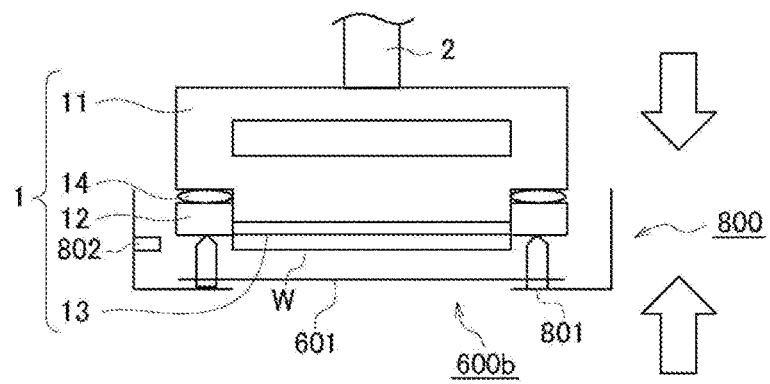
FIG. 59B is a diagram for explaining in detail the transfer of the substrate from the top ring to the transport mechanism.
Figure 59C:
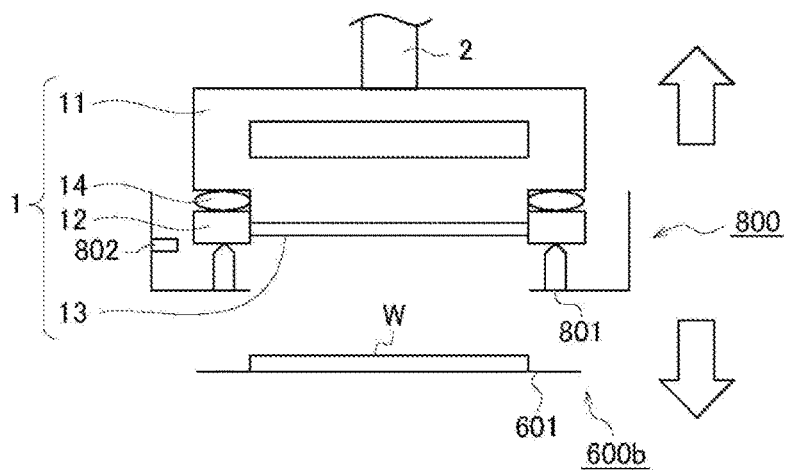
FIG. 59C is a diagram for explaining in detail the transfer of the substrate from the top ring to the transport mechanism.
Figure 60:
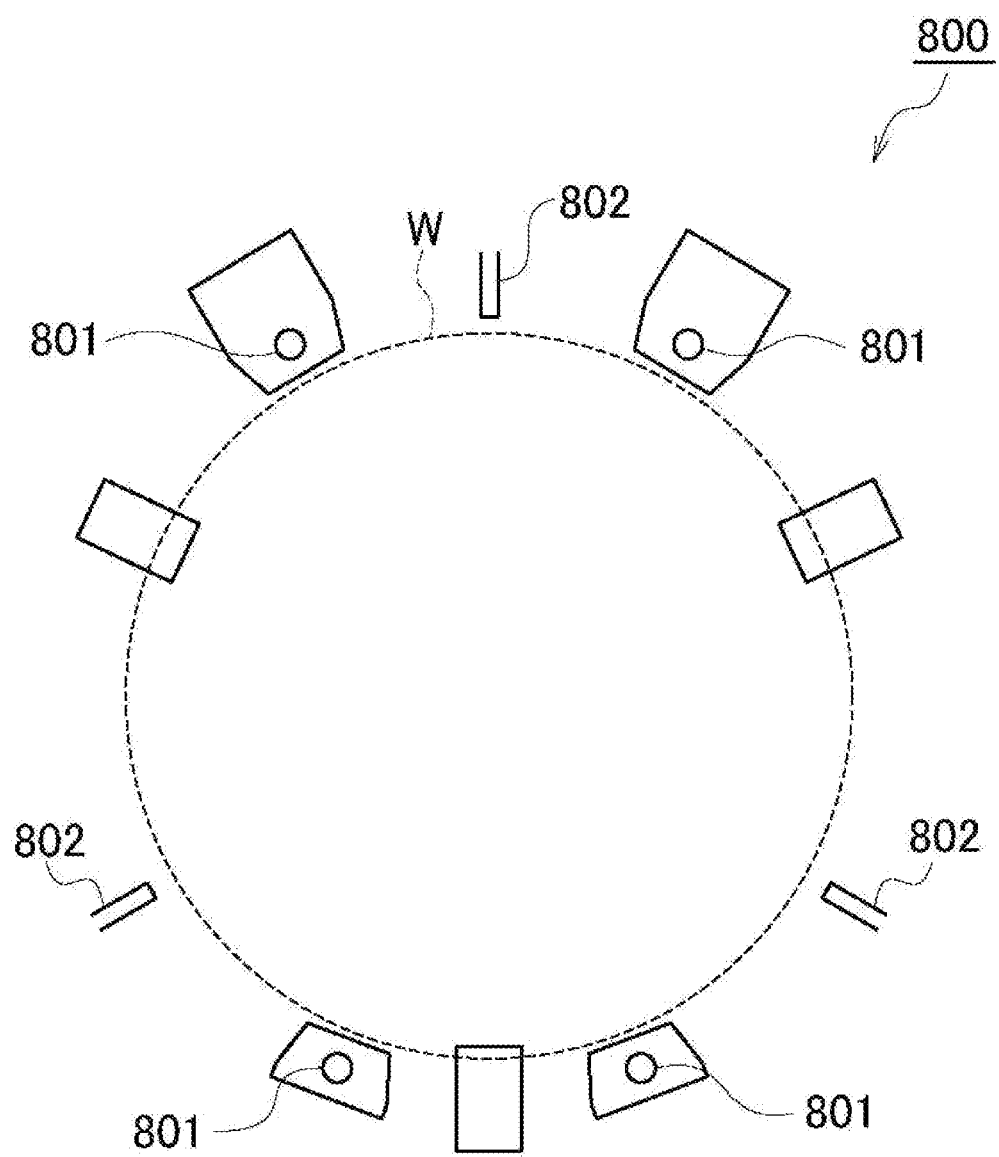
FIG. 60 is a diagram for explaining in detail the transfer of the substrate from the top ring to the transport mechanism.

FIGS. 59A to 59C and FIG. 60 are diagrams for explaining in detail the transfer of the substrate from the top ring 1 to the transport mechanism 600b. FIGS. 59A to 59C are schematic cross-sectional views where the transport mechanism 600b and the top ring 1 are viewed from the side. FIG. 60 is a diagram where the top ring 1 and the retainer ring station 800 are viewed from above (however, the transport mechanism 600b in FIGS. 59A to 59C is omitted). As shown in these drawings, the retainer ring station 800 has three release nozzles 802 facing the inside (facing the substrate W).

FIG. 59A shows a state where the substrate W is sucked by the membrane 13. At this time, the release nozzles 802 do not eject fluid (release shower).

As shown in FIG. 59B, the top ring 1 lowers and the transport mechanism 600b rises. Thereby, the hand 601 of the transport mechanism 600b approaches the lower surface of the substrate W. However, the hand 601 does not come into contact with the lower surface of the substrate W. Further, the pushing-up pins 801 push up the retainer ring 12.

In this state, the constant amount gas supply apparatus 16 supplies a certain amount of gas to the space S and pressurizes the space S. Thereby, the membrane 13 swells, and a gap is generated between the lower surface of the membrane 13 and an outer circumferential portion of the substrate W. Fluid such as air is injected into the gap from the release nozzles 802. Thereby, the substrate W is released from the membrane 13 and mounted on the hand 601.

In the present embodiment, a certain amount of gas is supplied to the space S, so that the amount of swell of the membrane 13 is also constant. Therefore, at all times it is possible to generate a gap between the lower surface of the membrane 13 and the outer circumferential portion of the substrate W in a position where the fluid is injected from the release nozzle 802. Therefore, it is possible to reliably inject the fluid into the gap from the release nozzle 802 and release the substrate W from the membrane 13.

The amount of gas supplied from the constant amount gas supply apparatus 16 may be set so that a gap is formed in a position where the fluid is injected from the release nozzle 802 and a pressure (for example, 1 to 10 hPa) where the substrate W is not cracked is applied to the substrate W. As the membrane 13 swells, the pressure applied to the substrate W is relatively reduced, so that the stress applied to the substrate W is stably kept low.

Thereafter, as shown in FIG. 59C, the hand 601 where the substrate W is mounted lowers and the top ring 1 rises.

In this way, in the sixth embodiment, a certain amount of gas is supplied to the space S not from the pressure adjustment apparatus 15 that sucks and polishes the substrate W, but from the constant amount gas supply apparatus 16. Thereby, it is possible to reduce the stress that is applied to the substrate W when the substrate W is released. As a result, it is possible to safely release the substrate that is sucked and held by the membrane 13. In a conventional pressure adjustment apparatus, the maximum pressure during pressurizing is 500 hPa or 1000 hPa, so that it is difficult to cope with low pressure of 1 to 10 hPa. Therefore, the membrane is prevented from swelling too much by shortening pressurizing time at a set pressure of 50 hPa or higher.

Seventh Embodiment

Figure 61:
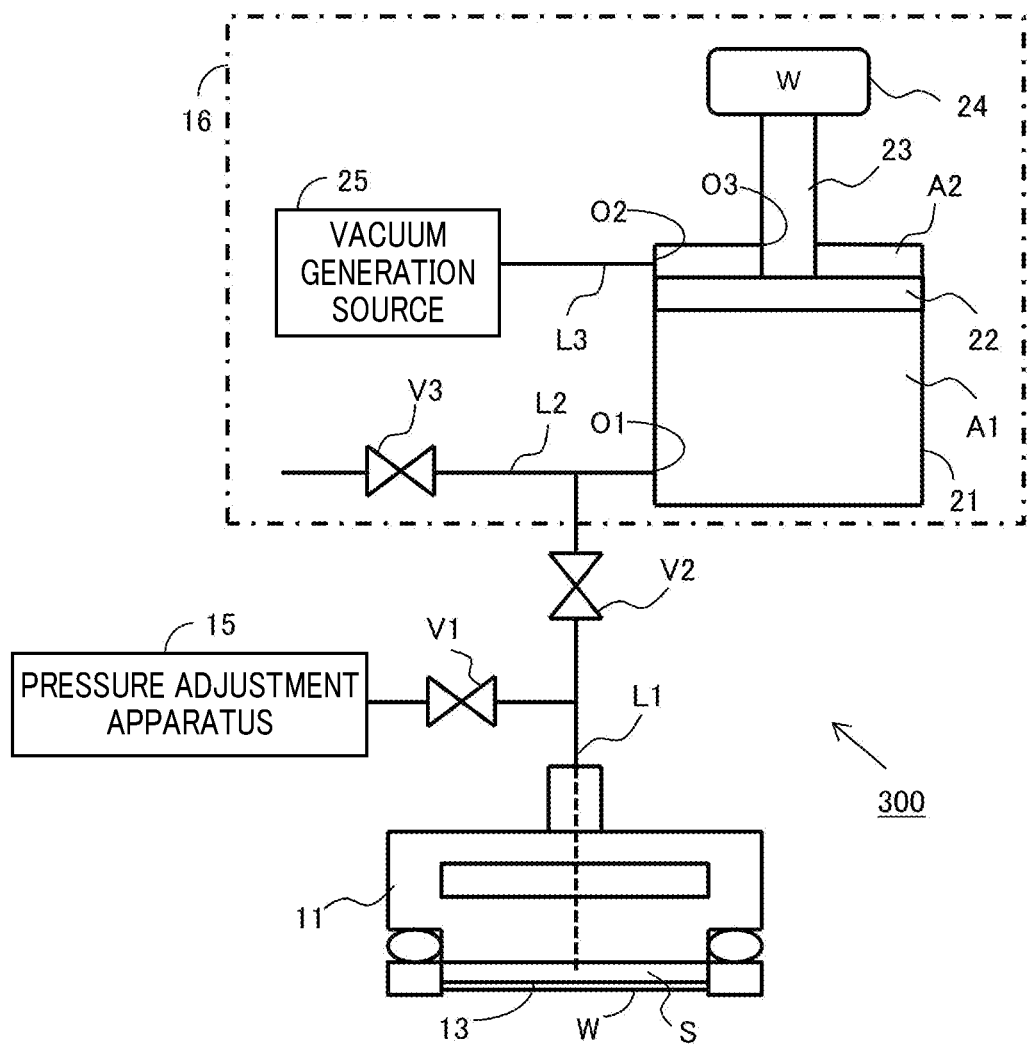
FIG. 61 is a diagram showing a schematic configuration of a substrate polishing apparatus including a constant amount gas supply apparatus according to a seventh embodiment.

FIG. 61 is a diagram showing a schematic configuration of a substrate polishing apparatus 300 including a constant amount gas supply apparatus 16 according to a seventh embodiment. The constant amount gas supply apparatus 16 has a cylinder 21 and a weight 24 coupled to a piston 22 of the cylinder 21 and supplies a gas in the cylinder 21 to a space S when the weight 24 is moved downward by gravity.

Specifically, the constant amount gas supply apparatus 16 has the cylinder 21, the piston 22, a piston rod 23, the weight 24, and a vacuum generation source 25.

The cylinder 21 cylindrically extends in a vertical direction, and the inside of the cylinder 21 is hollow. An outer circumference of the piston 22 is in contact with an inner surface of the cylinder 21 and can move up and down. The piston rod 23 extends in the vertical direction and penetrates an opening O3 provided at an upper surface of the cylinder 21. The piston 22 is connected to a lower end of the piston rod 23, and the weight 24 is fixed to an upper end of the piston rod 23.

The inside of the cylinder 21 is divided into a lower space A1 and an upper space A2 by the piston 22. The outer circumference of the piston 22 is in contact with the inner surface of the cylinder 21, so that gas hardly moves between lower space A1 and the upper space A2.

An opening O1 is provided at a position corresponding to the lower space A1 of the cylinder 21. A line L2 is connected to the opening O1. The line L2 is connected to a line L1 through a valve V2. The line L2 is provided with a valve V3, and when the valve V3 is opened, the lower space A1 can be opened to the atmosphere.

An opening O2 is provided in a position corresponding to the upper space A2 of the cylinder 21. A line L3 is connected to the opening O2. The vacuum generation source 25 is connected to the line L3, and the upper space A2 can be depressurized and/or opened to the atmosphere through the line L3.

The valve V3 and the vacuum generation source 25 are controlled by the control apparatus 17 in FIG. 56.

Figure 62:
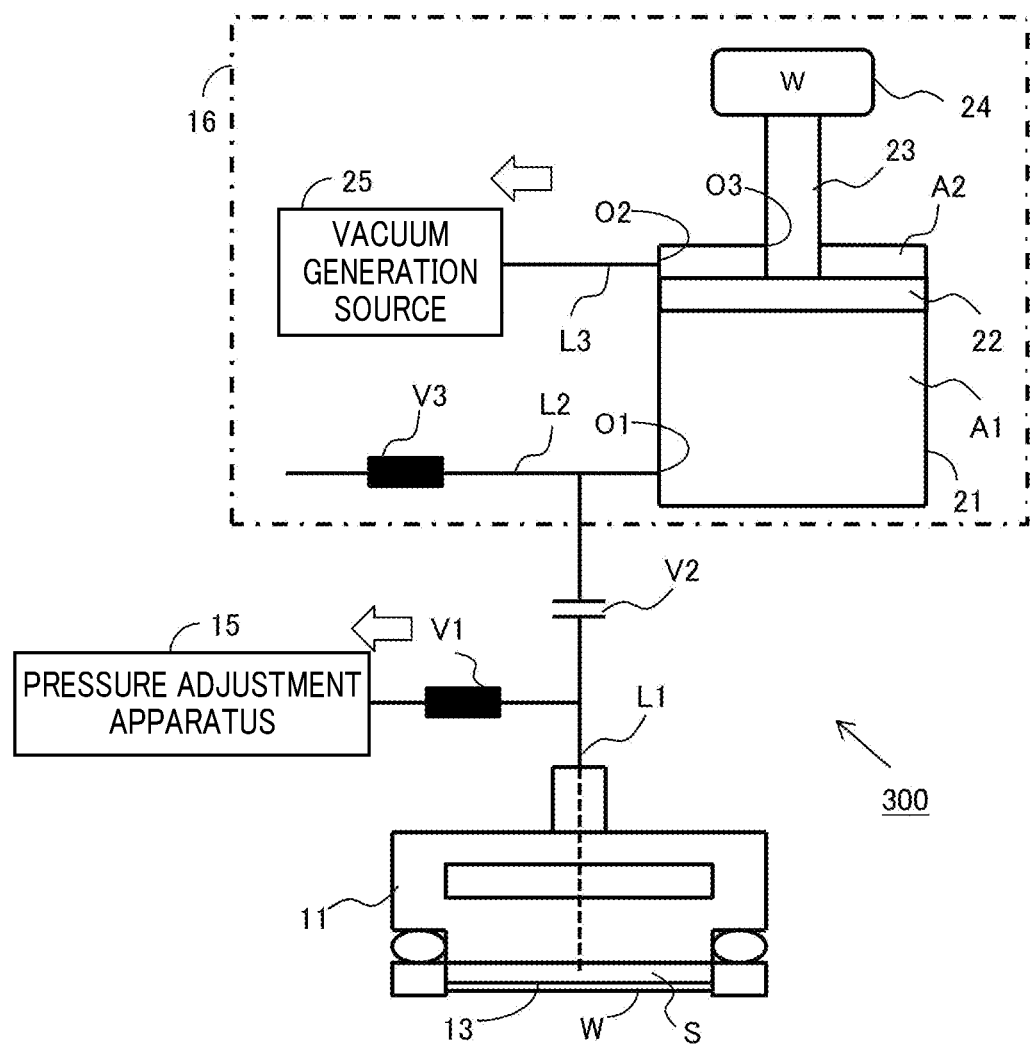
FIG. 62 is a diagram schematically showing an operating state of the substrate polishing apparatus when the substrate is transferred from the transport mechanism to the top ring.

FIG. 62 is a diagram schematically showing an operating state of the substrate polishing apparatus 300 when the substrate is transferred from the transport mechanism 600b to the top ring 1 (FIGS. 57A to 57C and FIG. 58). At this time, the valve V1 in FIG. 56 is opened and the valve V2 is closed. Therefore, the pressure adjustment apparatus 15 is connected to the space S and the constant amount gas supply apparatus 16 is disconnected from the space S.

The constant amount gas supply apparatus 16 is brought into a standby state. In the standby state, the valve V3 is opened and the lower space A1 is opened to the atmosphere. The vacuum generation source 25 depressurizes (desirably vacuates) the upper space A2. Thereby, the piston 22 (and the piston rod 23 and the weight 24) is held in a lifted state.

Then, the pressure adjustment apparatus 15 depressurizes the space S and generates negative pressure in the space S, so that the substrate W is sucked to the lower surface of the membrane 13 of the top ring 1.

Figure 63:
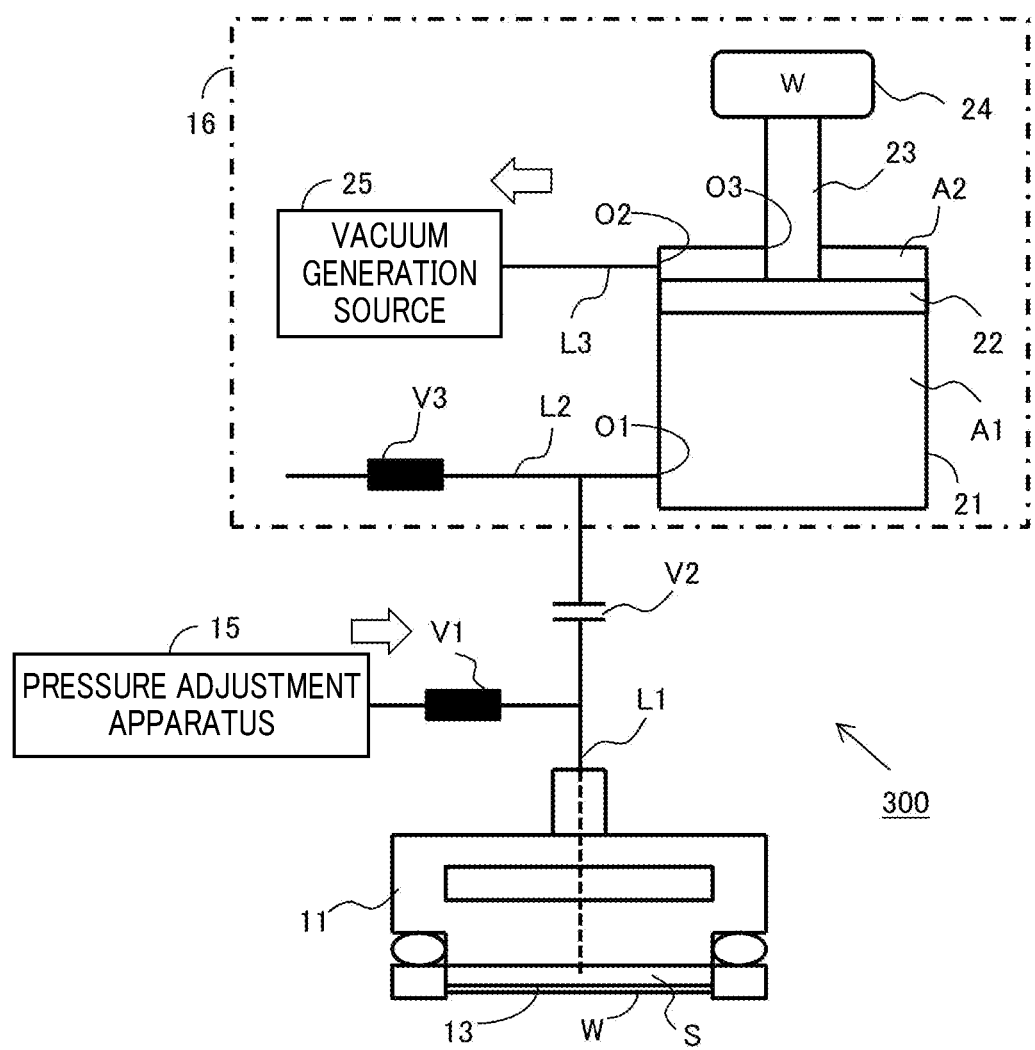
FIG. 63 is a diagram schematically showing an operating state of the substrate polishing apparatus when the substrate is polished.

FIG. 63 is a diagram schematically showing an operating state of the substrate polishing apparatus 300 when the substrate is polished. In the same manner as in FIG. 62, the valve V1 in FIG. 56 is opened, the valve V2 is closed, and the constant amount gas supply apparatus 16 is in the standby state. Then, the pressure adjustment apparatus 15 pressurizes the space S, so that the substrate W is pressed against the polishing pad 3a in FIG. 55 and polished.

Figure 64:
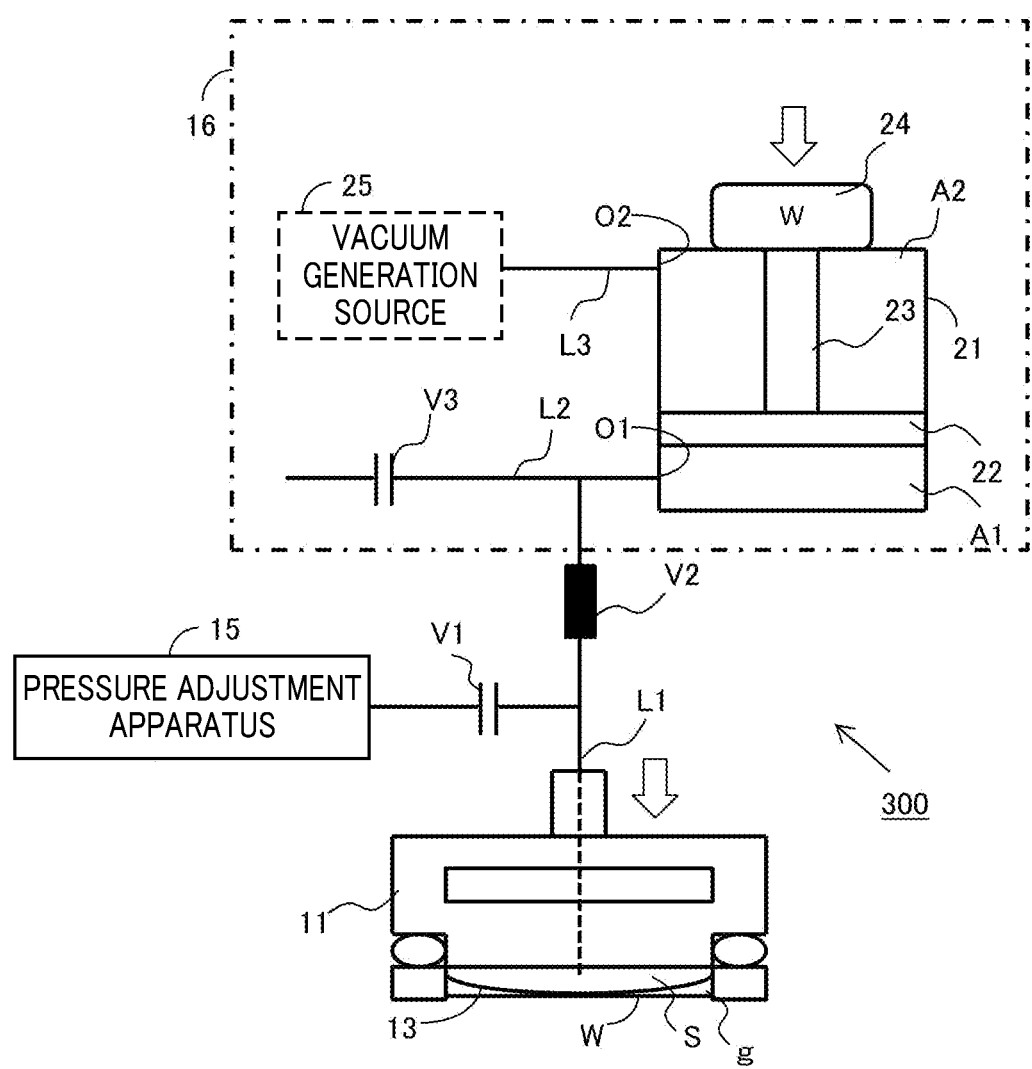
FIG. 64 is a diagram schematically showing an operating state of the substrate polishing apparatus when the substrate is released.

FIG. 64 is a diagram schematically showing an operating state of the substrate polishing apparatus 300 when the substrate is released (FIGS. 59A to 59C and FIG. 60). Different from FIG. 62 and FIG. 63, the valve V1 in FIG. 56 is closed and the valve V2 is opened. Therefore, the constant amount gas supply apparatus 16 is connected to the space S and the pressure adjustment apparatus 15 is disconnected from the space S.

The valve V3 of the constant amount gas supply apparatus 16 is closed and the upper space A2 is opened to the atmosphere through the line L3. Thereby, the weight 24 free-falls, and accordingly the piston 22 moves downward. The valve V3 is closed, so that gas in the lower space A1 moves to the space S through the lines L2 and L1. As a result, the membrane 13 swells downward and a gap g is generated between the membrane 13 and the outer circumferential portion of the substrate W. When fluid is injected into the gap, the substrate W is released from the lower surface of the membrane 13.

Thereby, it is possible to supply a certain amount of gas (that is, an amount of gas corresponding to "area of the piston 22×fall length of the piston 22" (that is, the stroke of the piston 22)) to the space S. The weight 24 may have a weight where the weight 24 falls fully against pressure in the space S.

Eighth Embodiment

Figure 65:
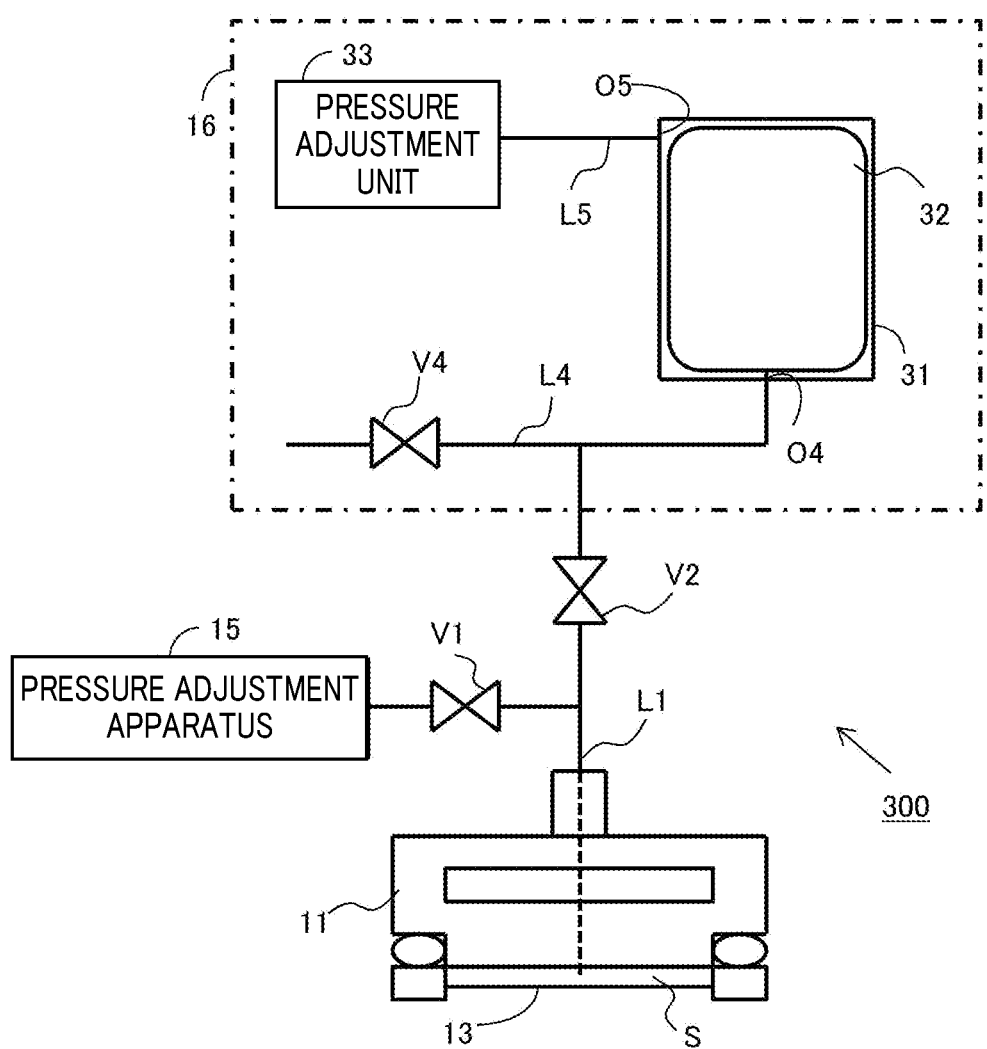
FIG. 65 is a diagram showing a schematic configuration of a substrate polishing apparatus including a constant amount gas supply apparatus according to an eighth embodiment.

FIG. 65 is a diagram showing a schematic configuration of a substrate polishing apparatus 300 including a constant amount gas supply apparatus 16 according to an eighth embodiment. The constant amount gas supply apparatus 16 has a bladder 32 and supplies gas in the bladder 32 to the space S when the bladder 32 is compressed.

Specifically, the constant amount gas supply apparatus 16 has a chamber 31, the bladder 32, and a pressure adjustment unit 33.

The inside of the chamber 31 is hollow having a fixed volume. The bladder 32 is a balloon-shaped container formed of a flexible material such as rubber and is sealed and stored in the chamber 31.

The chamber 31 is provided with openings O4 and O5. A line L4 penetrates the opening O4. The line L4 connects a line L1 and the bladder 32 through a valve V2. The line L4 is provided with a valve V4, and the bladder 32 can be opened to the atmosphere by opening the valve V4. A line L5 is connected to the opening O5. The pressure adjustment unit 33 is connected to the line L5. The pressure adjustment unit 33 can pressurize or depressurize the chamber 31 through the line L5. The valve V4 and the pressure adjustment unit 33 are controlled by the control apparatus 17 in FIG. 56.

Figure 66:
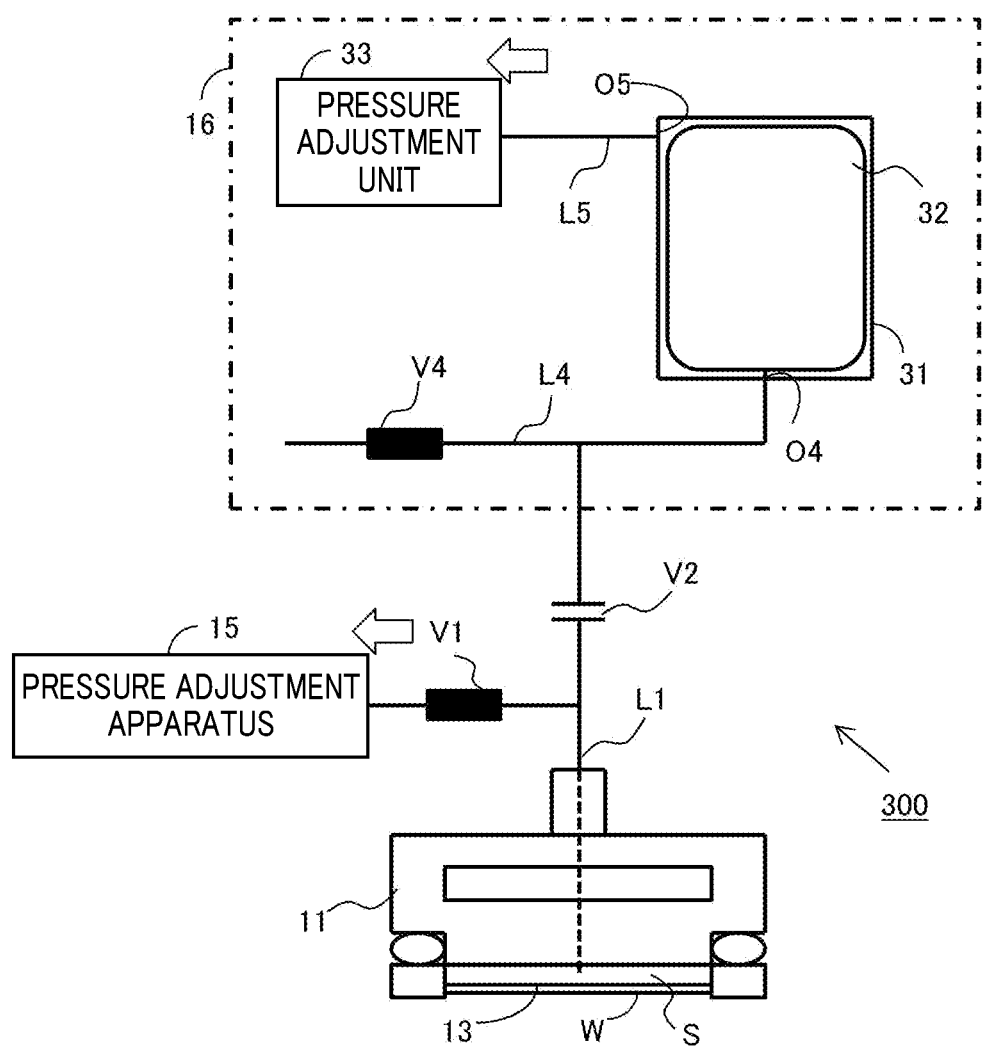
FIG. 66 is a diagram schematically showing an operating state of the substrate polishing apparatus when the substrate is transferred from the transport mechanism to the top ring.

FIG. 66 is a diagram schematically showing an operating state of the substrate polishing apparatus 300 when the substrate is transferred from the transport mechanism 600b to the top ring 1 (FIGS. 57A to 57C and FIG. 58). At this time, the valve V1 in FIG. 56 is opened and the valve V2 is closed. Therefore, the pressure adjustment apparatus 15 is connected to the space S and the constant amount gas supply apparatus 16 is disconnected from the space S.

The constant amount gas supply apparatus 16 is brought into a standby state. In the standby state, the valve V4 is opened and the bladder 32 is opened to the atmosphere. The pressure adjustment unit 33 depressurizes (desirably vacuates) the chamber 31 through the line L5. Thereby, the bladder 32 is held in a state where the bladder 32 swells to a volume that is substantially the same as the volume of the chamber 31.

Then, the pressure adjustment apparatus 15 depressurizes the space S and generates negative pressure in the space S, so that the substrate W is sucked to the lower surface of the membrane 13 of the top ring 1.

Figure 67:
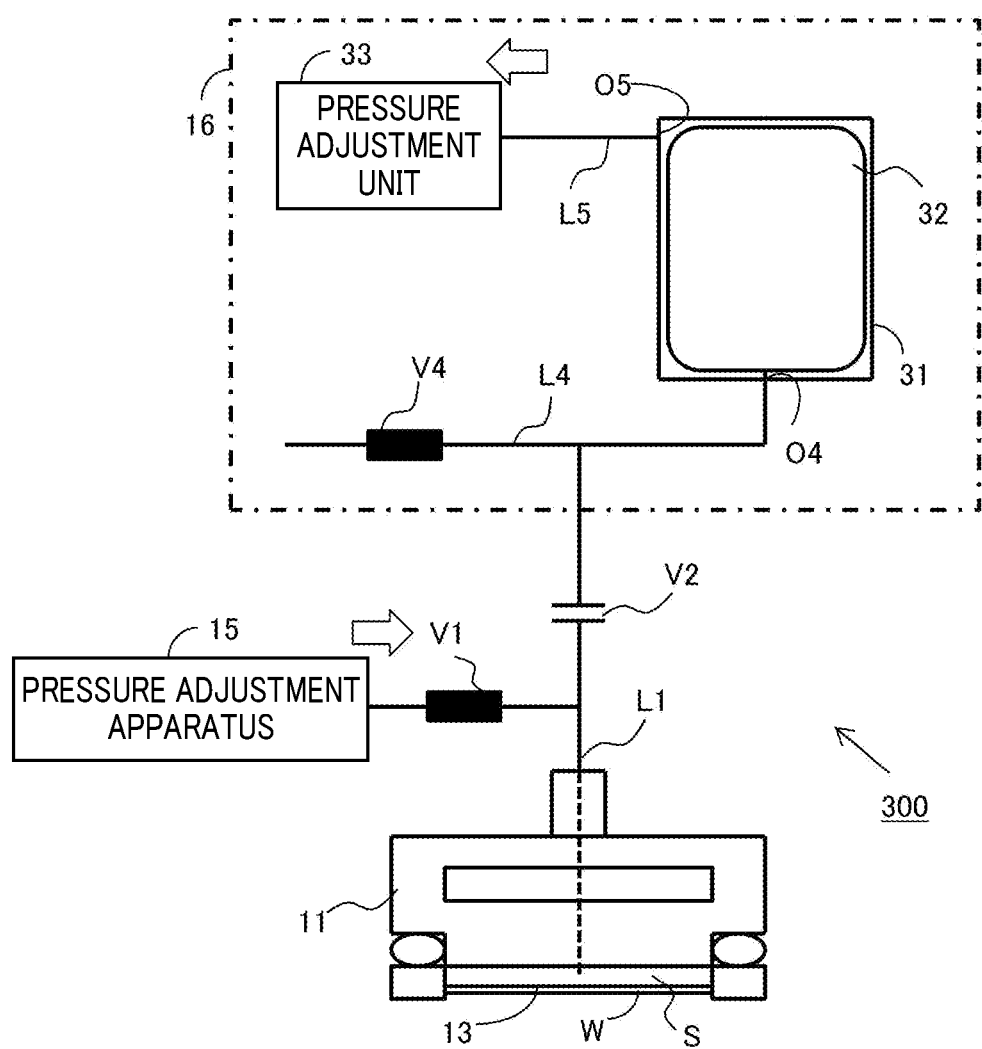
FIG. 67 is a diagram schematically showing an operating state of the substrate polishing apparatus when the substrate is polished.

FIG. 67 is a diagram schematically showing an operating state of the substrate polishing apparatus 300 when the substrate is polished. In the same manner as in FIG. 66, the valve V1 in FIG. 56 is opened, the valve V2 is closed, and the constant amount gas supply apparatus 16 is in the standby state. Then, the pressure adjustment apparatus 15 pressurizes the space S, so that the substrate W is pressed against the polishing pad 3a in FIG. 55 and polished.

Figure 68:
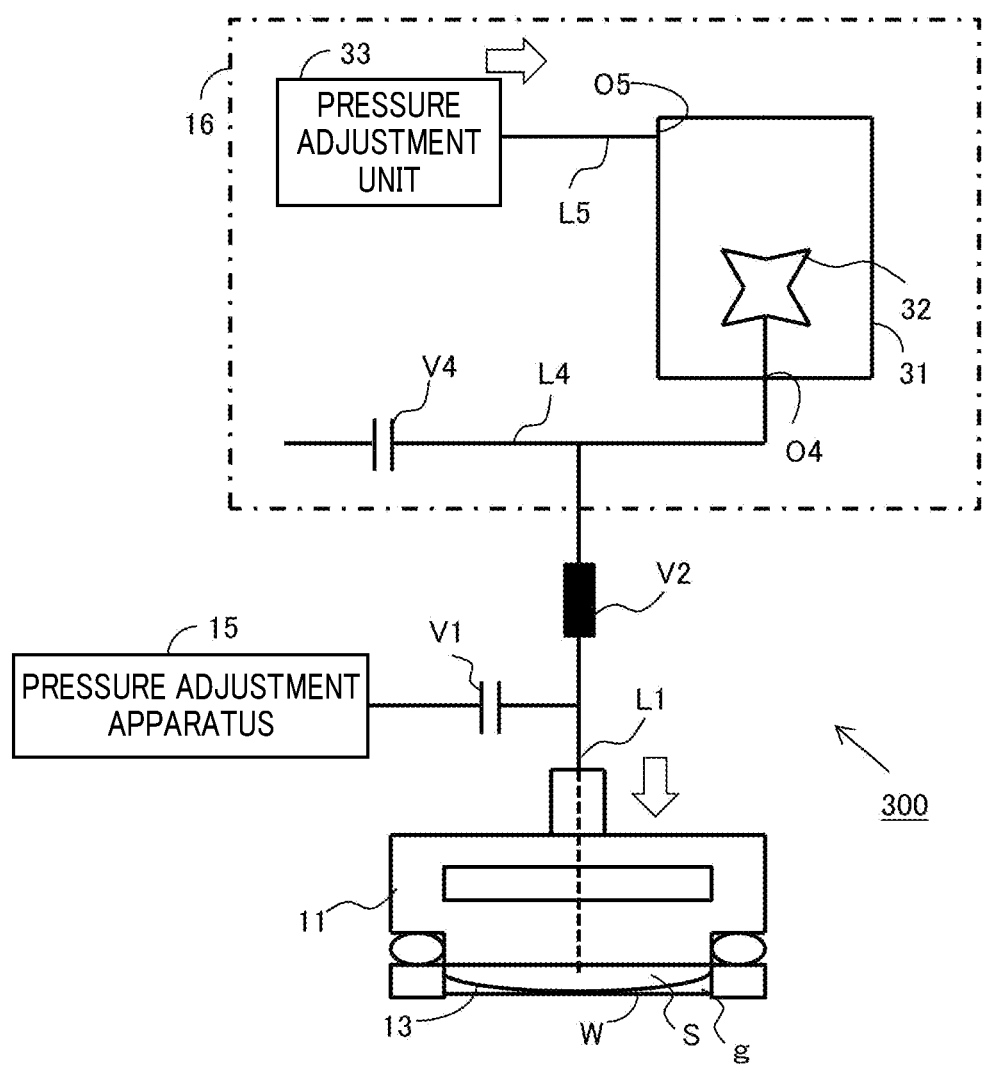
FIG. 68 is a diagram schematically showing an operating state of the substrate polishing apparatus when the substrate is released.

FIG. 68 is a diagram schematically showing an operating state of the substrate polishing apparatus 300 when the substrate is released (FIGS. 59A to 59C and FIG. 60). Different from FIG. 66 and FIG. 67, the valve V1 in FIG. 56 is closed and the valve V2 is opened. Therefore, the constant amount gas supply apparatus 16 is connected to the space S and the pressure adjustment apparatus 15 is disconnected from the space S.

The valve V4 of the constant amount gas supply apparatus 16 is closed and the pressure adjustment unit 33 pressurizes the chamber 31 through the line L5. Thereby, the bladder 32 is compressed. The valve V4 is closed, so that gas in the bladder 32 moves to the space S through the lines L4 and L1. As a result, the membrane 13 swells downward and a gap g is generated between the membrane 13 and the outer circumferential portion of the substrate W.

Thereby, it is possible to supply a certain amount of gas (that is, an amount of gas corresponding to the volume of the chamber 31) to the space S. The bladder 32 may have a simple balloon shape shown in FIGS. 64 to 67 or may have a bellows shape or the like. The shape of the bladder 32 is not particularly limited.

The above embodiments are described so that a person with an ordinary skill in the technical field to which the invention pertains can implement the invention. Various modified examples of the above embodiments can be naturally made by those skilled in the art, and the technical idea of the invention can be applied to other embodiments. Therefore, the invention is not limited to the described embodiments and should encompass the widest range in accordance with the technical ideas defined by the claims.

What is claimed is:

1. A substrate polishing apparatus comprising;
a top ring main body;
an elastic film comprising a first surface facing the top ring main body and a second surface that is a surface opposite to the first surface and can suck and hold a substrate;
a space between the top ring main body and the first surface of the elastic film that can pressurize and depressurize through a first valve provided on a first line communicating with the space; and
a constant amount gas supply apparatus that can supply a fixed amount of gas to the space through a second valve provided on the first line, wherein
the constant amount gas supply apparatus comprises a cylinder and a piston,
the piston is, under a state where the piston is in contact with an inner surface of the cylinder, can move up and down,
inside of the cylinder is divided into a lower space and an upper space by the piston,
the cylinder is provided with a first opening at a position corresponding to the lower space and second and third openings at positions corresponding to the upper space,
the first opening is connected with a second line connected to the first line through the second valve,
the second opening is connected with a third line,
the third opening is penetrated with a piston rod that coupled to the piston,
the lower space is configured to be opened to atmosphere by opening a third valve provided on the second line opens, and
the upper space is configured to be depressurized and opened to atmosphere through the third line, and
by moving the piston in the cylinder downward, the constant amount gas supply apparatus supplies the fixed amount of gas corresponding to an area of the piston and a stroke of the piston to the space from the cylinder.

2. The substrate polishing apparatus according to claim 1, wherein
by moving a weight coupled to the piston downward due to gravity, the piston moves downward.

3. The substrate polishing apparatus according to claim 2, wherein the constant amount gas supply apparatus further comprises the piston rod coupling the weight and the piston.

4. A constant amount gas supply apparatus connected to a substrate holding apparatus, the substrate holding apparatus comprising:
- a top ring main body,
- an elastic film comprising a first surface facing the top ring main body and a second surface that is a surface opposite to the first surface and can suck and hold a substrate, and
- a space between the top ring main body and the first surface of the elastic film that can pressurize and depressurize through a first valve provided on a first line communicating with the space, wherein
- the constant amount gas supply apparatus can supply a fixed amount of gas to the space through a second valve provided on the first lines,
- the constant amount gas supply apparatus comprises a cylinder and a piston,
- the piston is, under a state where the piston is in contact with an inner surface of the cylinder, can move up and down,
- inside of the cylinder is divided into a lower space and an upper space by the piston,
- the cylinder is provided with a first opening at a position corresponding to the lower space and second and third openings at positions corresponding to the upper space,
- the first opening is connected with a second line connected to the first line through the second valve,
- the second opening is connected with a third line,
- the third opening is penetrated with a piston rod that coupled to the piston,
- the lower space is configured to be opened to atmosphere by opening a third valve provided on the second line opens, and
- the upper space is configured to be depressurized and opened to atmosphere through the third line, and
- by moving the piston in the cylinder downward, the constant amount gas supply apparatus supplies the fixed amount of gas corresponding to an area of the piston and a stroke of the piston to the space from the cylinder.

* * * * *